US010651299B2

(12) United States Patent
Naito

(10) Patent No.: US 10,651,299 B2
(45) Date of Patent: May 12, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/800,092

(22) Filed: Nov. 1, 2017

(65) Prior Publication Data

US 2018/0138299 A1   May 17, 2018

(30) Foreign Application Priority Data

Nov. 17, 2016  (JP) .................. 2016-224266
Apr. 18, 2017  (JP) .................. 2017-082418
(Continued)

(51) Int. Cl.
*H01L 29/739* (2006.01)
*H01L 29/423* (2006.01)
(Continued)

(52) U.S. Cl.
CPC ...... *H01L 29/7391* (2013.01); *H01L 27/0711* (2013.01); *H01L 29/0696* (2013.01);
(Continued)

(58) Field of Classification Search
CPC ... H01L 27/067; H01L 27/07; H01L 27/0711; H01L 27/102; H01L 27/1022; H01L 29/70

See application file for complete search history.

(56) References Cited

U.S. PATENT DOCUMENTS 10,056,450 B2   8/2018   Kouno
10,062,753 B2   8/2018   Kouno
(Continued)

FOREIGN PATENT DOCUMENTS

JP   2005-101514 A   4/2005
JP   2007-266134 A   10/2007
(Continued)

OTHER PUBLICATIONS

Extended European Search Report issued for counterpart European Patent Application No. 17199419.7, issued by the European Patent Office dated Mar. 22, 2018.

*Primary Examiner* — Cheung Lee

(57) ABSTRACT

A semiconductor device includes: a semiconductor substrate having a first conductivity-type drift region; a transistor portion; and a diode portion, wherein the transistor portion and the diode portion each have: a second conductivity-type base region; a plurality of trench portions penetrating the base region and having conductive portions provided therein; and a mesa portion sandwiched by trench portions, the transistor portion has one or more first conductivity-type accumulation regions that have doping concentrations higher than that of the drift region, the diode portion has one or more first conductivity-type high concentration regions that have doping concentrations higher than that of the drift region, and an integrated concentration of the doping concentrations of the accumulation regions is higher than an integrated concentration of the doping concentrations of the one or more high concentration regions of the mesa portion of the diode portion.

21 Claims, 47 Drawing Sheets

(30) Foreign Application Priority Data

Jul. 14, 2017 (JP) .................................. 2017-138605
Sep. 14, 2017 (JP) .................................. 2017-176688

(51) Int. Cl.

| | | |
|---|---|---|
| *H01L 29/861* | (2006.01) | |
| *H01L 29/66* | (2006.01) | |
| *H01L 27/07* | (2006.01) | |
| *H01L 29/08* | (2006.01) | |
| *H01L 29/06* | (2006.01) | |
| *H01L 29/40* | (2006.01) | |

(52) U.S. Cl.
CPC ...... *H01L 29/0834* (2013.01); *H01L 29/4236* (2013.01); *H01L 29/4238* (2013.01); *H01L 29/66477* (2013.01); *H01L 29/7397* (2013.01); *H01L 29/8613* (2013.01); *H01L 29/407* (2013.01)

(56) References Cited

U.S. PATENT DOCUMENTS

| | | |
|---|---|---|
| 2005/0045960 A1 | 3/2005 | Takahashi |
| 2007/0267663 A1 | 11/2007 | Harada |
| 2008/0197379 A1 | 8/2008 | Aono |
| 2012/0132954 A1 | 5/2012 | Kouno |
| 2015/0364613 A1 | 12/2015 | Onozawa et al. |
| 2017/0025410 A1 | 1/2017 | Cheng et al. |
| 2017/0162560 A1 | 6/2017 | Takahashi et al. |

FOREIGN PATENT DOCUMENTS

| | | |
|---|---|---|
| JP | 2007-311627 A | 11/2007 |
| JP | 2008205015 A | 9/2008 |
| JP | 2013008778 A | 1/2013 |
| JP | 2013021104 A | 1/2013 |
| JP | 2015-135954 A | 7/2015 |
| JP | 2015-146425 A | 8/2015 |
| JP | 2015185742 A | 10/2015 |
| JP | 2016162897 A | 9/2016 |
| JP | 2017059711 A | 3/2017 |
| WO | 2014/156849 A1 | 10/2014 |
| WO | 2015/093038 A1 | 6/2015 |
| WO | 2016030966 A1 | 3/2016 |

300

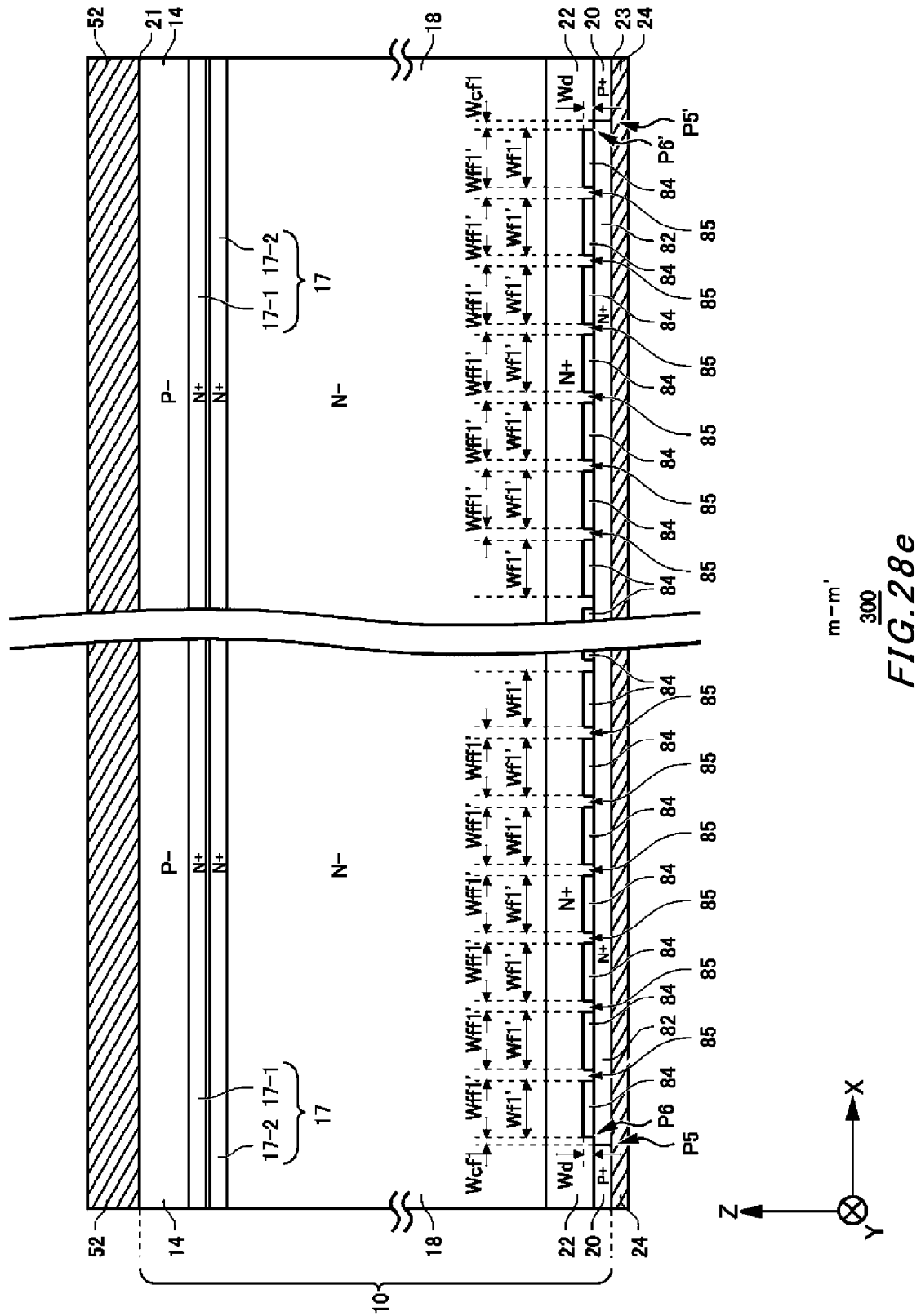

SEMICONDUCTOR DEVICE

The contents of the following Japanese patent application(s) are incorporated herein by reference:
NO. 2016-224266 filed on Nov. 17, 2016,
NO. 2017-082418 filed on Apr. 18, 2017,
NO. 2017-138605 filed on Jul. 14, 2017, and
NO. 2017-176688 filed on Sep. 14, 2017.

BACKGROUND

1. Technical Field

The present invention relates to a semiconductor device.

2. Related Art

Conventionally, semiconductor devices such as insulated gate bipolar transistors (IGBTs) have been known (please see Patent Document 1, for example). [Patent Document 1] Japanese Patent Application Publication No. 2007-311627

It is preferable to improve characteristics such as the turn-on loss characteristics of semiconductor devices.

SUMMARY

An aspect of the present invention provides a semiconductor device including: a semiconductor substrate having a first conductivity-type drift region; a transistor portion provided to the semiconductor substrate; and a diode portion provided to the semiconductor substrate. The transistor portion and the diode portion each may have: a second conductivity-type base region provided in the semiconductor substrate and above the drift region; a plurality of trench portions that are provided penetrating the base region from an upper surface of the semiconductor substrate and have conductive portions provided therein; and a mesa portion sandwiched by trench portions. The transistor portion may have one or more first conductivity-type accumulation regions that are provided in each of the mesa portions and between the base region and the drift region and have doping concentrations higher than that of the drift region. The diode portion may have one or more first conductivity-type high concentration regions that are provided in each of the mesa portions and between the base region and the drift region and have doping concentrations higher than that of the drift region. An integrated concentration obtained by integrating the doping concentrations of the one or more accumulation regions in at least some of the mesa portions of the transistor portion in a depth direction of the semiconductor substrate may be higher than an integrated concentration obtained by integrating the doping concentrations of the one or more high concentration regions of the mesa portion of the diode portion in the depth direction of the semiconductor substrate.

In at least one of the mesa portions of the transistor portion, the number of the accumulation regions formed in a depth direction may be greater than the number of the high concentration regions formed in a depth direction in the mesa portion of the diode portion. The high concentration regions of the diode portion may be provided at the same depth as any of the accumulation regions of the transistor portion. The doping concentrations of the high concentration regions of the diode portion may be equal to the doping concentrations of the accumulation regions provided at the same depths in the transistor portion.

The doping concentration of the accumulation region provided at the deepest position in the transistor portion may be higher than the doping concentrations of all other accumulation regions of the transistor portion. The diode portion may not have the high concentration region at the same depth as the accumulation region provided at the deepest position in the transistor portion.

The semiconductor device may further include a boundary portion provided to the semiconductor substrate and arranged between the transistor portion and the diode portion. In the mesa portion of the boundary portion, a first conductivity-type region having a concentration higher than that of the drift region may not be provided between the base region and the drift region.

Among the mesa portions of the transistor portion, an integrated concentration of the one or more accumulation regions in the mesa portion provided closest to the diode portion may be lower than an integrated concentration of the one or more accumulation regions in other mesa portions among the mesa portions in the transistor portion.

Among the mesa portions of the transistor portion, the integrated concentration of the one or more accumulation regions in the mesa portion provided closest to the diode portion may be higher than the integrated concentration of the one or more high concentration regions in the mesa portion in the diode portion.

The upper surface side of the semiconductor substrate may not be provided with a local lifetime killer. The diode portion may have an electrically floating second conductivity-type floating region on a lower surface side of the semiconductor substrate. The diode portion may have a first conductivity-type cathode region provided exposed to a lower surface of the semiconductor substrate. The floating region may cover part of the cathode region above the cathode region.

The diode portion may not be provided with two or more high concentration regions. The transistor portion and the diode portion may be arrayed along a predetermined array direction. The trench portion may be provided extending in an extending direction orthogonal to the array direction on an upper surface of the semiconductor substrate. The transistor portion may have a second conductivity-type collector region provided between a lower surface of the semiconductor substrate and the drift region. The diode portion may have a cathode region that is provided between the lower surface of the semiconductor substrate and the drift region and has a doping concentration higher than that of the drift region. In a plane parallel with the lower surface of the semiconductor substrate, a distance from a boundary position between the collector region and the cathode region in the array direction to an end portion position, in the array direction, of the floating region that is closest to the boundary position in the array direction may be shorter than a width, in the array direction, of the floating region in a straight line direction linking the boundary position in the array direction and the end portion position in the array direction.

The transistor portion may be provided adjoining the diode portions on both one side and the other side in the array direction. A plurality of the floating regions may be provided in the array direction from an end portion position on one side in the array direction to an end portion position on another side in the array direction. The diode portion may have an opening region not provided with the floating region at the same depth position as the floating region. In a plane parallel with a lower surface of the semiconductor substrate, a distance from the boundary position between the collector region and the cathode region to the end portion position of the floating region that is closest to the boundary position may be shorter than a width of the opening region in a direction of a straight line linking the boundary position and the end portion position. A width of the opening region in the array direction may be smaller than a width of the floating region in the array direction.

The transistor portion may be provided adjoining the diode portions on both one side and the other side in the array direction. The floating regions may be provided consecutively in the array direction from an end portion position on one side in the array direction to an end portion position on another side in the array direction. In a plane parallel with a lower surface of the semiconductor substrate, a distance from the boundary position between the collector region and the cathode region in the extending direction to the end portion position, in the extending direction, of the floating region that is closest to the boundary position in the extending direction may be shorter than a width of the floating region in the extending direction.

A plurality of the floating regions may be provided in the extending direction from an end portion position on one side in the extending direction to an end portion position on another side in the extending direction. The diode portion may have an opening region not provided with the floating region at the same depth position as the floating region. A distance from the boundary position between the collector region and the cathode region in the extending direction to the end portion position, in the extending direction, of the floating region that is closest to the boundary position may be shorter than a width of the opening region in the extending direction. A width of the opening region in the extending direction may be smaller than a width of the floating region in the extending direction.

The semiconductor device may further include a local lifetime killer provided to the lower surface side of the semiconductor substrate. At least a partial region above the floating regions may be provided with the lifetime killer. At least a partial region above the opening region may not be provided with the lifetime killer.

An integrated concentration of the high concentration regions in at least one mesa portion among the mesa portions arranged above the floating region may be lower than an integrated concentration of the high concentration regions in at least one mesa portion among the mesa portions arranged above the opening region.

The diode portion may have a first conductivity-type cathode region and a second conductivity-type dummy region that are provided exposed alternately to a lower surface of the semiconductor substrate. The lower surface side of the semiconductor substrate may not be provided with a local lifetime killer.

The semiconductor substrate may further have a contact region in the mesa portion of the diode portion. In the mesa portion of the diode portion, the base region and the contact region may be provided adjoining alternately in an extending direction on the upper surface of the trench portion.

A second aspect of the present invention provides a semiconductor device including: a semiconductor substrate having a first conductivity-type drift region; a transistor portion provided to the semiconductor substrate; and a diode portion provided to the semiconductor substrate. The transistor portion may have a second conductivity-type collector region provided between a lower surface of the semiconductor substrate and the drift region. The diode portion may have a cathode region that is provided between the lower surface of the semiconductor substrate and the drift region and has a doping concentration higher than that of the drift region. The diode portion may have a second conductivity-type floating region provided between the drift region and the cathode region. In a plane parallel with the lower surface of the semiconductor substrate, a distance from a boundary position between the collector region and the cathode region to an end portion position of the floating region that is closest to the boundary position may be shorter than a width of the floating region in a straight line direction linking the boundary position and the end portion position.

The trench portion may have a gate trench portion and a dummy trench portion. In the transistor portion, an interlayer dielectric film may be provided above the gate trench portion and on an upper surface of the semiconductor substrate. In the transistor portion, an interlayer dielectric film may be provided above the dummy trench portion and on an upper surface of the semiconductor substrate. In the diode portion, an interlayer dielectric film may be provided above the dummy trench portion and on an upper surface of the semiconductor substrate.

A contact hole may be further included above the semiconductor substrate. The contact hole may be provided above the dummy trench portion and in a range from one of the dummy trench portions to the other of the dummy trench portions in the array direction. The contact holes may be provided consecutively in the array direction from the transistor portion to the diode portion.

The summary clause does not necessarily describe all necessary features of the embodiments of the present invention. The present invention may also be a sub-combination of the features described above.

BRIEF DESCRIPTION OF THE DRAWINGS

FIG. 3 is a figure showing one example of doping concentration distributions in a cross-section taken along e-e' and cross-section taken along f-f in FIG. 2a.

FIG. 4 is a figure showing waveform examples of collector currents Ic at the time of turn-on.

FIG. 5 is a figure showing another example of doping concentration distributions in the cross-section taken along e-e' and cross-section taken along f-f' in FIG. 2a.

FIG. 7b is a figure showing one example of doping concentration distributions in a cross-section taken along e-e', cross-section taken along f-f and cross-section taken along g-g' in FIG. 7a.

FIG. 21b is a figure showing one example of a cross-section taken along s-s' in FIG. 21a.

FIG. 21c is a figure showing one example of a cross-section taken along t-t' in FIG. 21a.

FIG. 23b is a figure showing one example of a cross-section taken along u-u' in FIG. 23a.

FIG. 23c is a figure showing one example of a cross-section taken along v-v' in FIG. 23a.

FIG. 27b is an enlarged view of a region B1 in FIG. 27a.

FIG. 28b is an enlarged view of a region C1 in FIG. 28a.

FIG. 28e is a figure showing one example of a cross-section taken along m-m' in FIG. 28b.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, a side located in one of the directions parallel with the depth direction of a semiconductor substrate is referred to as an "upper side", and the other side is referred to as a "lower side". One surface of two main surfaces of a substrate, a layer or another member is referred to as an upper surface, and the other surface is referred to as a lower surface. The "upward" and "downward" directions are not limited by the direction of gravity.

In each example shown, a first conductivity-type is assumed to be an n-type, and a second conductivity-type is assumed to be a p-type, but the first conductivity-type may be a p-type, and the second conductivity-type may be an n-type. In this case, conductivity-types of a substrate, layers, regions and the like in each example have respectively opposite polarities.

Figure 1:
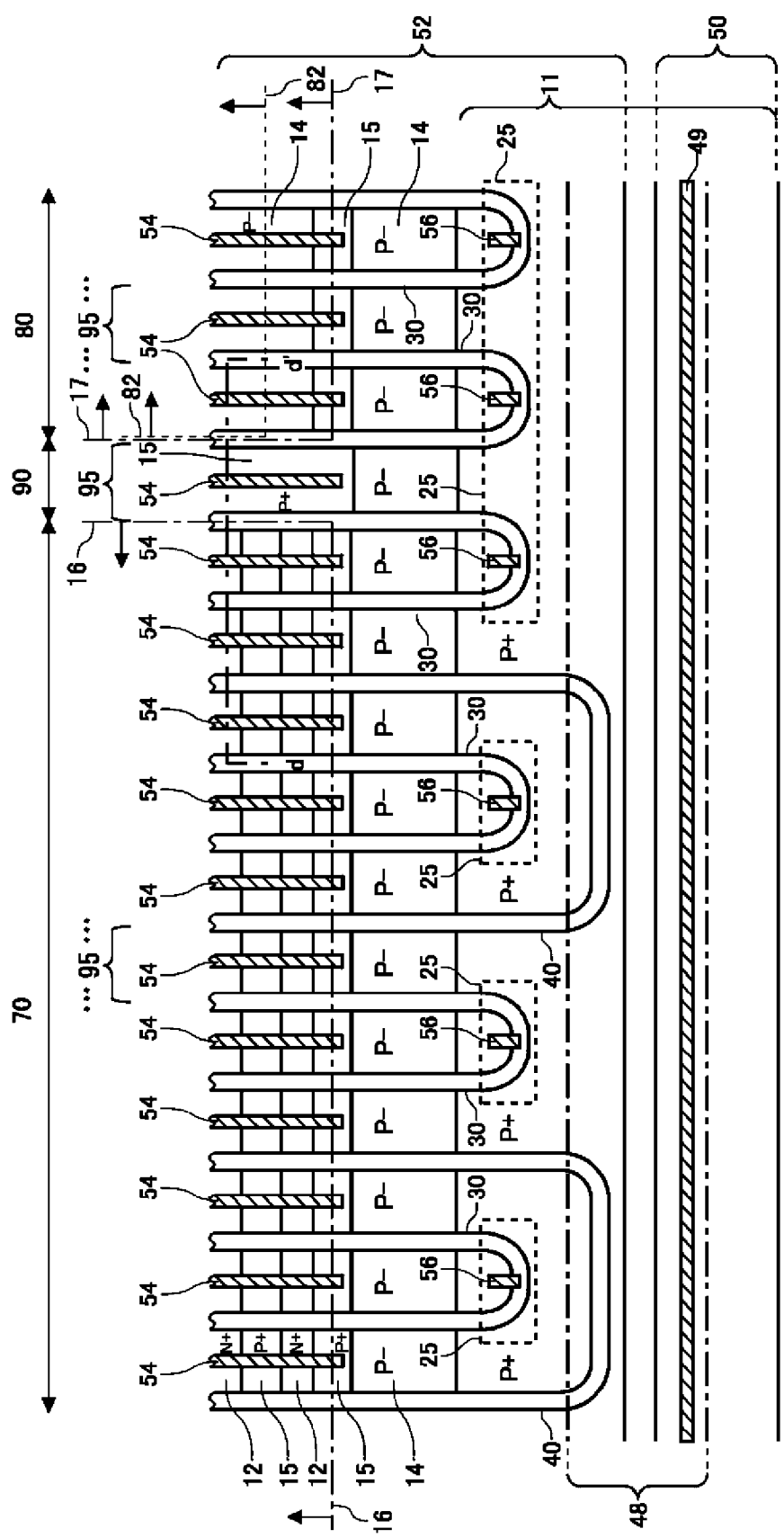
FIG. 1 is a figure showing part of the upper surface of a semiconductor device 100 according to an embodiment of the present invention.

FIG. 1 is a figure showing part of the upper surface of a semiconductor device 100 according to an embodiment of the present invention. The semiconductor device 100 in the present example is a semiconductor chip including a transistor portion 70, a diode portion 80 and a boundary portion 90. The boundary portion 90 may be part of the transistor portion 70. The transistor portion 70 includes a transistor such as an IGBT. The diode portion 80 is provided adjoining the transistor portion 70 on the upper surface of a semiconductor substrate, and includes a diode such as a FWD (free wheel diode). The boundary portion 90 is provided between the transistor portion 70 and the diode portion 80 on the upper surface of the semiconductor substrate. FIG. 1 shows the upper surface of a chip around an end portion of the chip, and other regions are omitted therein.

Also, although FIG. 1 shows an active region of the semiconductor substrate in the semiconductor device 100, the semiconductor device 100 may have an edge-termination structure portion surrounding the active region. The active region refers to a region where current flows if the semiconductor device 100 is controlled to enter an on-state. The edge-termination structure portion relaxes electric field concentration on the upper surface side of the semiconductor substrate. The edge-termination structure portion has, for example, a guard ring, field plate, RESURF or structure obtained by combining them.

The semiconductor device 100 in the present example includes gate trench portions 40, dummy trench portions 30, a well region 11, emitter regions 12, base regions 14 and contact regions 15 that are formed in the semiconductor substrate on its upper surface side. The gate trench portions 40 and the dummy trench portions 30 are one example of trench portions. Also, the semiconductor device 100 in the present example includes an emitter electrode 52 and a gate metal layer 50 that are provided above the upper surface of the semiconductor substrate. The emitter electrode 52 and the gate metal layer 50 are provided separate from each other.

Although an interlayer dielectric film is formed between the emitter electrode 52 and the gate metal layer 50, and the upper surface of the semiconductor substrate, it is omitted in FIG. 1. The interlayer dielectric film in the present example has contact holes 56, a contact hole 49 and contact holes 54 that are formed penetrating the interlayer dielectric film.

The emitter electrode 52 passes the contact holes 54, and thereby contacts the emitter regions 12, the contact regions 15 and the base regions 14 on the upper surface of the semiconductor substrate. Also, the emitter electrode 52 passes the contact holes 56, and is thereby connected with dummy conductive portions in the dummy trench portions 30. Connections 25 formed of conductive materials such as polysilicon doped with impurities may be provided between the emitter electrode 52 and the dummy conductive portions. The connections 25 are formed on the upper surface of the semiconductor substrate.

The gate metal layer 50 passes the contact hole 49, and thereby contacts a gate runner 48. The gate runner 48 is formed of polysilicon doped with impurities, or the like. The gate runner 48 is connected with the gate conductive portions in the gate trench portions 40 on the upper surface of the semiconductor substrate. The gate runner 48 is not connected with dummy conductive portions in the dummy trench portions 30. The gate runner 48 in the present example is formed in a range from below the contact hole 49 to edge portions of the gate trench portions 40. The gate conductive portions are exposed to the upper surface of the semiconductor substrate at the edge portions of the gate trench portions 40, and thereby contact the gate runner 48.

The emitter electrode 52 and the gate metal layer 50 are formed of materials including metal. For example, at least a partial region of each electrode is formed of aluminum or an aluminum-silicon alloy. Each electrode may have a barrier metal formed of titanium, a titanium compound or the like at a layer underlying a region formed of aluminum or the like, and may have a plug formed of tungsten or the like in contact holes.

The one or more gate trench portions 40 and the one or more dummy trench portions 30 are arrayed at predetermined intervals along a predetermined array direction in a region of the transistor portion 70. In the transistor portion 70, the one or more gate trench portions 40 and the one or more dummy trench portions 30 may be formed alternately along the array direction.

A gate trench portion 40 in the present example may have: two extending portions extending along an extending direction that is parallel with the upper surface of the semiconductor substrate and is perpendicular to the array direction; and a connecting portion that connects the two extending portions. At least part of the connecting portion is preferably formed in a curved form. By connecting end portions of the two extending portions of the gate trench portion 40, electric field concentration at the end portions of the extending portions can be relaxed. The gate runner 48 may be connected with a gate conductive portion at the connecting portion of the gate trench portion 40.

Dummy trench portions 30 in the present example are provided between respective extending portions of gate trench portions 40. Similar to the gate trench portions 40, the dummy trench portions 30 may have U shapes on the upper surface of the semiconductor substrate. That is, a dummy trench portion 30 in the present example has two extending portions that extend along the extending direction, and a connecting portion that connects the two extending portions. In another example, a dummy trench portion 30 may have a linear shape that extends in the extending direction.

In the boundary portion 90 and the diode portion 80, a plurality of dummy trench portions 30 are arrayed consecutively. Also, in a region that is in the transistor portion 70 and adjoins the boundary portion 90 as well, a plurality of dummy trench portions 30 may be arrayed consecutively. In the present example, a linear extending portion of each trench portion is treated as one trench portion.

The emitter electrode 52 is formed above the gate trench portions 40, the dummy trench portions 30, the well region 11, the emitter regions 12, the base regions 14 and the contact regions 15. The well region 11 is of a second conductivity-type, and is formed in a predetermined range from an end portion of an active region on a side where the gate metal layer 50 is provided. The diffusion depth of the well region 11 may be greater than the depths of gate trench portions 40 and dummy trench portions 30. Partial regions, on the gate metal layer 50 side, of a gate trench portion 40 and a dummy trench portion 30 are formed in the well region 11. The bottom of an end, in the extending direction, of the dummy trench portion 30 may be covered by the well region 11.

A base region 14 is formed in a mesa portion sandwiched by respective trench portions. The base region 14 is of a second conductivity-type having a doping concentration lower than that of the well region 11. The base region 14 in the present example is of a P$^-$-type. The mesa portion may be a portion that is in a semiconductor substrate, is sandwiched by two adjoining trench portions, and ranges from the upper surface of the semiconductor substrate to a depth of the deepest bottom portion of each trench portion.

A second conductivity-type contact region 15 having a higher doping concentration than that of a base region 14 of a mesa portion is selectively formed on the upper surface of the base region 14. The contact region 15 in the present example is of a P$^+$-type. Also, in the transistor portion 70, a first conductivity-type emitter region 12 having a doping concentration higher than that of the semiconductor substrate is selectively formed on part of the upper surface of a contact region 15. The emitter region 12 in the present example is of an N$^+$-type.

Each of the contact regions 15 and the emitter regions 12 is formed in a range from one of adjoining trench portions to the other trench portion. The one or more contact regions 15 and the one or more emitter regions 12 of the transistor portion 70 are formed so as to be exposed to the upper surfaces of the mesa portions alternately along the extending direction of the trench portions. Each of the contact regions 15 and the emitter regions 12 may contact one of adjoining trench portions or the other trench portion over a predetermined length along the extending direction of each trench portion.

In another example, in the mesa portions in the transistor portion 70, the contact regions 15 and the emitter regions 12 may be formed in a stripe-like form along the extending direction of the trench portions. For example, emitter regions 12 are formed in a region adjoining trench portions, and a contact region 15 is formed in a region sandwiched by the emitter regions 12.

Emitter regions 12 are not formed in mesa portions of the diode portion 80 and boundary portion 90 in the present example. Also, in a mesa portion of the diode portion 80, a contact region 15 is formed in a region opposite to at least one contact region 15 in the transistor portion 70. In a mesa portion of the boundary portion 90, a contact region 15 is formed in a region opposite to contact regions 15 and emitter regions 12 of the transistor portion 70. The boundary portion 90 may include a plurality of mesa portions. In the boundary portion 90, the area of a contact region 15 on the semiconductor substrate upper surface may be smaller in one or more mesa portions positioned on the diode portion 80 side than in a mesa portion adjoining the transistor portion 70. In the boundary portion 90, a base region 14 may be exposed to the upper surface of the semiconductor substrate in one or more mesa portions positioned on the diode portion 80 side.

In the transistor portion 70, the contact holes 54 are formed above respective regions of the contact regions 15 and the emitter regions 12. Contact holes 54 are not formed in regions corresponding to the base regions 14 and the well region 11.

In the diode portion 80, a contact hole 54 is formed above a contact region 15 and a base region 14. A contact hole 54 in the present example is not formed corresponding to a base region 14 closest to the gate metal layer 50 among a plurality of base regions 14 in a mesa portion of the diode portion 80.

The diode portion 80 has a first conductivity-type cathode region 82 on the lower surface side of the semiconductor substrate. The cathode region 82 in the present example is of an N$^+$-type. In FIG. 1, a region, as seen in a top view of the semiconductor substrate, to which the cathode region 82 is provided is indicated with a dashed line portion. The diode portion 80 may be a region that imaginarily appears on the upper surface of the semiconductor substrate if the cathode region 82 is imaginarily projected onto the upper surface. The region that imaginarily appears on the upper surface of the semiconductor substrate if the cathode region 82 is imaginarily projected onto the upper surface may be spaced apart from the contact region 15 in the +X-axis direction.

In the diode portion 80, a region where the cathode region 82 is not formed on the lower surface of the semiconductor substrate may have a P$^+$-type collector region formed therein. In the present example, regarding a dummy trench portion 30 or mesa portion 95 on the upper surface of the semiconductor substrate where the cathode region 82 of the lower surface 23 imaginarily appears if the cathode region 82 is imaginarily projected onto the upper surface, a collector region is formed at the position corresponding to the position of an end portion, on the outer circumference side (located in the −X-axis direction), of a contact hole 54 of the mesa portion 95 that imaginarily appears on the lower surface of the semiconductor substrate if the end portion is imaginarily projected onto the lower surface. As one example, a dummy trench portion 30 or mesa portion 95 that is: located at a position below which the cathode region 82 is formed on part of the lower surface of the semiconductor substrate; and inclusive of portions up to an end portion, in the extending direction, of the dummy trench portion 30 (including a portion connecting with a U shape) may be treated as the diode portion 80 for convenience even if a collector region is formed therebelow on the lower surface of the semiconductor substrate. The transistor portion 70 may be a region where a trench portion or mesa portion is formed in a region of the upper surface of the semiconductor substrate where a collector region imaginarily appears if the collector region is imaginarily projected onto the upper surface.

In the boundary portion 90, a contact hole 54 is formed above a contact region 15. Contact holes 54 in the present example are not formed corresponding to a base region 14 of the boundary portion 90. In the boundary portion 90, a contact hole 54 may be formed above a base region 14 in one or more mesa portions positioned on the diode portion 80 side. In the present example, contact holes 54 of the transistor portion 70, contact holes 54 of the diode portion 80 and contact holes 54 of the boundary portion 90 have the same length in the extending direction of respective trench portions.

The semiconductor device 100 has, in the semiconductor substrate, a first conductivity-type accumulation region 16 and a first conductivity-type high concentration region 17 that are formed selectively below the base regions 14. In FIG. 1, the ranges where the accumulation region 16 and the high concentration region 17 are formed are indicated with alternate long and short dash lines. The accumulation region 16 is formed in the transistor portion 70, and the high concentration region 17 is formed in the diode portion 80.

FIG. 2 is a figure showing one example of a cross-section taken along d-d' in FIG. 1. The semiconductor device 100 in the present example has, in the cross-section, a semiconductor substrate 10, interlayer dielectric films 38, the emitter electrode 52 and a collector electrode 24. The emitter electrode 52 is formed on an upper surface 21 of the semiconductor substrate 10 and the interlayer dielectric film 38.

The collector electrode 24 is formed on the lower surface 23 of the semiconductor substrate 10. The emitter electrode 52 and the collector electrode 24 are formed of conductive materials such as metal. In the present specification, the direction linking the emitter electrode 52 and the collector electrode 24 is referred to as the depth direction.

The semiconductor substrate 10 may be a silicon substrate, a silicon carbide substrate, a nitride semiconductor substrate such as a gallium nitride substrate, or the like. The semiconductor substrate 10 in the present example is a silicon substrate. P$^-$-type base regions 14 are formed on the upper surface side of the semiconductor substrate 10.

In the cross-section, N$^+$-type emitter regions 12, P$^-$-type base regions 14 and one or more N$^+$-type accumulation regions 16 are formed on the upper surface 21 side of the transistor portion 70 sequentially from the upper surface 21 side. In the cross-section, P$^-$-type base regions 14 and one or more N$^+$-type high concentration regions 17 are formed on the upper surface 21 side of the diode portion 80 sequentially from the upper surface 21 side. In the cross-section, a P$^+$-type contact region 15 and a P$^-$-type base region 14 are formed on the upper surface 21 side of the boundary portion 90 sequentially from the upper surface 21 side.

In the transistor portion 70, an N$^-$-type drift region 18 is formed on the lower surface of the accumulation region 16. By providing, between the drift region 18 and the base regions 14, the one or more accumulation regions 16 having a concentration higher than that of the drift region 18, a carrier implantation enhancement effect (IE effect) can be enhanced, and the on-state voltage can be reduced.

In the present example, a region sandwiched by trench portions in the semiconductor substrate 10 is referred to as a mesa portion 95. Specifically, it may be a portion that is in the semiconductor substrate 10, is sandwiched by two adjoining trench portions and ranges from the upper surface 21 of the semiconductor substrate 10 to a depth of the deepest bottom portion of either one of the two adjoining trench portions. One or more accumulation regions 16 are formed in each mesa portion 95 of the transistor portion 70. In the present example, in each mesa portion 95 of the transistor portion 70, a first accumulation region 16-1, a second accumulation region 16-2 and a third accumulation region 16-3 are provided at different positions in the depth direction of the semiconductor substrate 10. The accumulation regions 16 may be provided so as to cover the entire lower surface of a base region 14 in each mesa portion 95.

One or more high concentration regions 17 are formed in each mesa portion 95 of the diode portion 80. In the present example, in a mesa portion 95 of the diode portion 80, a first high concentration region 17-1 and a second high concentration region 17-2 are provided at different positions in the depth direction of the semiconductor substrate 10. The high concentration regions 17 may be provided so as to cover the entire lower surface of a base region 14 in each mesa portion 95. High concentration regions 17 are not formed in each mesa portion 95 of the boundary portion.

By providing one or more $N^+$-type high concentration regions 17 in each mesa portion 95 of the diode portion 80, one or more $N^+$-type high concentration regions 17 having concentrations higher than that of the drift region 18 are inserted between a base region 14 to function as P-type anode layers of the diode portion 80 and the N-type drift region 18. These one or more high concentration regions 17 have lowered hole concentrations as compared with the drift region 18 due to the charge neutrality condition. That is, the one or more high concentration regions 17 suppress implantation of holes from the base region 14 to the drift region 18. Thereby, the minority carrier implantation efficiency remarkably lowers. The larger the number of the high concentration regions 17 is, the higher the degree of lowering of the minority carrier implantation efficiency is. Thereby, the reverse recovery characteristics of the diode portion 80, especially the recovery current, are largely lowered.

The minority carrier implantation efficiency in the present example means a ratio of the minority carrier current density (the hole current density in the present example) to the total density of current that flows through the emitter electrode 52 if a voltage higher than a voltage applied to the collector electrode 24 is applied to the emitter electrode 52. The sum of the hole current density and the electron current density equals the total current density.

In each of the transistor portion 70, the diode portion 80 and the boundary portion 90, an $N^+$-type buffer region 20 is formed on the lower surface of the drift region 18. The buffer region 20 is formed on the lower surface side of the drift region 18. The doping concentration of the buffer region 20 is higher than the doping concentration of the drift region 18. The buffer region 20 may function as a field stop layer that prevents a depletion layer spreading from the lower surface side of the base region 14 from reaching a $P^+$-type collector region 22 and the $N^+$-type cathode region 82.

In the transistor portion 70, the $P^+$-type collector region 22 exposed to the lower surface 23 is formed below the buffer region 20. In the diode portion 80, the $N^+$-type cathode region 82 exposed to the lower surface 23 is formed below the buffer region 20. In the boundary portion 90, either the collector region 22 or the cathode region 82 is formed below the buffer region 20. In the boundary portion 90 in the present example, the collector region 22 is formed below the buffer region 20. The diode portion 80 is a region that overlaps the cathode region 82 as seen in the direction perpendicular to the lower surface 23. Also, the transistor portion 70 is a region where predetermined unit components each including an emitter region 12 and a contact region 15 are arranged regularly, in a region that overlaps the collector region 22 as seen in the direction perpendicular to the lower surface 23.

One or more gate trench portions 40 and one or more dummy trench portions 30 are formed on the upper surface 21 side. Each trench portion penetrates base regions 14 from the upper surface 21 to reach the drift region 18. In a region provided with at least any of an emitter region 12, a contact region 15, an accumulation region 16 and a high concentration region 17, each trench portion penetrates the region to reach the drift region 18. A structure in which a trench portion penetrates impurity regions is not limited to one manufactured by first forming the impurity regions and then forming the trench portion in this order. A structure manufactured by first forming trench portions and then forming an impurity region between the trench portions is also a structure in which a trench portion penetrates impurity regions.

A gate trench portion 40 has a gate trench, a gate-dielectric film 42 and a gate conductive portion 44 formed on the upper surface 21 side. The gate-dielectric film 42 is formed covering the inner wall of the gate trench. The gate-dielectric film 42 may be formed by oxidizing or nitriding a semiconductor at the inner wall of the gate trench. In the gate trench, the gate conductive portion 44 is formed on the inner side relative to the gate-dielectric film 42. That is, the gate-dielectric film 42 insulates the gate conductive portion 44 from the semiconductor substrate 10. The gate conductive portion 44 is formed of a conductive material such as polysilicon.

The gate conductive portion 44 includes, in the depth direction, a region opposite to at least an adjoining base region 14. The gate trench portion 40 in the cross-section is covered by an interlayer dielectric film 38 on the upper surface 21. If a predetermined voltage is applied to the gate conductive portion 44, a channel is formed in a surface layer of the interface in the base region 14 that contacts the gate trench.

Dummy trench portions 30 may have the same structure as the gate trench portion 40 in the cross-section. A dummy trench portion 30 has a dummy trench, a dummy dielectric film 32 and a dummy conductive portion 34 that are formed on the upper surface 21 side. The dummy dielectric film 32 is formed covering the inner wall of the dummy trench. The dummy conductive portion 34 is formed in the dummy trench and is formed on the inner side relative to the dummy dielectric film 32. The dummy dielectric film 32 insulates the dummy conductive portion 34 from the semiconductor substrate 10. The dummy conductive portion 34 may be formed of the same material as that of the gate conductive portion 44. For example the dummy conductive portion 34 is formed of a conductive material such as polysilicon. The dummy conductive portion 34 may have, in the depth direction, the same length as that of the gate conductive portion 44. The dummy trench portion 30 in the cross-section is covered by an interlayer dielectric film 38 on the upper surface 21.

In the present example, a region where an emitter region 12 is formed on the upper surface 21 side, a collector region 22 is formed on the lower surface 23 side, and one or more accumulation regions 16 are formed is referred to as the transistor portion 70. Also, a region where one or more high concentration regions 17 are formed on the upper surface 21 side and a cathode region 82 is formed on the lower surface 23 side is referred to as the diode portion 80. Also, a region that is between the transistor portion 70 and the diode portion 80, and where an emitter region 12 is not formed on the upper surface 21 side, and a cathode region 82 is not formed on the lower surface 23 of the diode portion 80 is referred to as the boundary portion 90.

In the present specification, the concentration obtained by integrating doping concentrations in the depth direction of the semiconductor substrate 10 is referred to as an integrated concentration. The integrated concentration of one or more accumulation regions 16 in at least one mesa portion 95 of the transistor portion 70 (that is, the integrated concentration of N-type regions that are between a base region 14 and the drift region 18 and have a concentration higher than that of the drift region 18) may be higher than the integrated concentration of one or more high concentration regions 17 in a mesa portion 95 of the diode portion 80 (that is, the integrated concentration of N-type regions that are between a base region 14 and the drift region 18 and have a concentration higher than that of the drift region 18).

Alternatively, the integrated concentration of accumulation regions 16 may be higher than the integrated concentration of high concentration regions 17 of the boundary portion 90. In this case, for example, it is possible to facilitate extraction of minority carriers at the time of turn-off as compared with extraction in the transistor portion 70, and it is possible to suppress latch-ups in a mesa portion 95, especially on the diode portion 80 side, of the transistor portion 70.

Alternatively, the integrated concentration of high concentration regions 17 of the boundary portion 90 may be higher than the integrated concentration of high concentration regions 17 of the diode portion 80. In this case, if it is in an operation mode in which a voltage higher than a voltage applied to the collector electrode 24 is applied to the emitter electrode 52 and the diode portion 80 becomes conductive, implantation of minority carriers (holes in the present example) of the boundary portion 90 can be more suppressed than implantation of minority carriers of the diode portion 80 can be. Alternatively, the integrated concentration of high concentration regions 17 of the boundary portion 90 may be approximately the same as or lower than the integrated concentration of high concentration regions 17 of the diode portion 80.

The integrated concentration of accumulation regions 16 of the transistor portion 70 and the integrated concentration of high concentration regions 17 of the boundary portion 90 may be approximately the same. Also, the integrated concentration of accumulation regions 16 of the transistor portion 70 and the integrated concentration of high concentration regions 17 of the diode portion 80 may be approximately the same.

In the present example, the integrated concentrations in respective mesa portions 95 of the diode portion 80 are the same with each other. All the mesa portions 95 of the diode portion 80 may have the same doping concentration distributions. The integrated concentrations in all the mesa portions 95 of the transistor portion 70 may be the same as or lower than the integrated concentration of each mesa portion 95 of the diode portion 80. On the other hand, the integrated concentrations in all the mesa portions 95 of the transistor portion 70 may be higher than the integrated concentration in each mesa portion 95 of the diode portion 80. All the mesa portions 95 of the transistor portion 70 may have the same integrated concentrations. Also, all the mesa portions 95 of the transistor portion 70 may have the same doping concentration distributions.

By providing an accumulation region 16 or a high concentration region 17 in the transistor portion 70 and the diode portion 80, implantation of holes from the upper surface 21 side to the drift region 18 can be suppressed in operation of the diode portion 80. Because of this, the reverse recovery characteristics of the semiconductor device 100 can be improved.

In the boundary portion 90 in the present example, a first conductivity-type region (high concentration region 17) having a concentration higher than that of the drift region 18 may not be formed between a base region 14 and the drift region 18. Alternatively, the number of or the integrated concentration of high concentration regions 17 of the boundary portion 90 may be smaller or lower than the numbers of or the integrated concentrations of accumulation regions 16 of the transistor portion 70 and high concentration regions 17 of the diode portion 80. Thereby, holes of the drift region 18 can be extracted through the boundary portion 90. Accordingly, holes in the drift region 18 of the diode portion 80 flowing into the transistor portion 70 can be suppressed at the time of turn-off of the transistor portion 70, and so on. Although in the examples in FIG. 1 and FIG. 2a, the boundary portion 90 has one mesa portion 95, the boundary portion 90 may have a plurality of mesa portions 95.

Figure 2A:
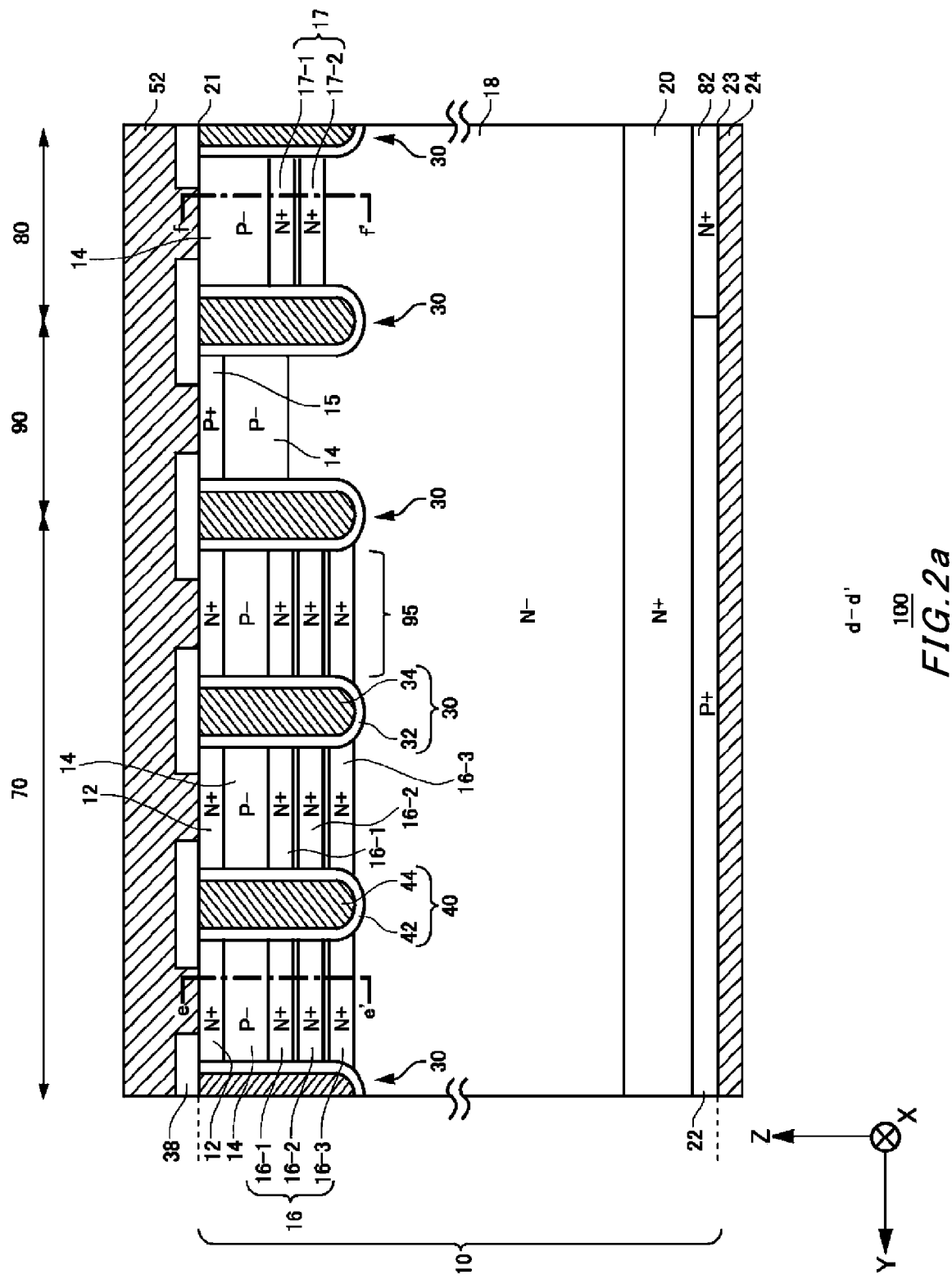
FIG. 2a is a figure showing one example of a cross-section taken along d-d' in FIG. 1.
Figure 2B:
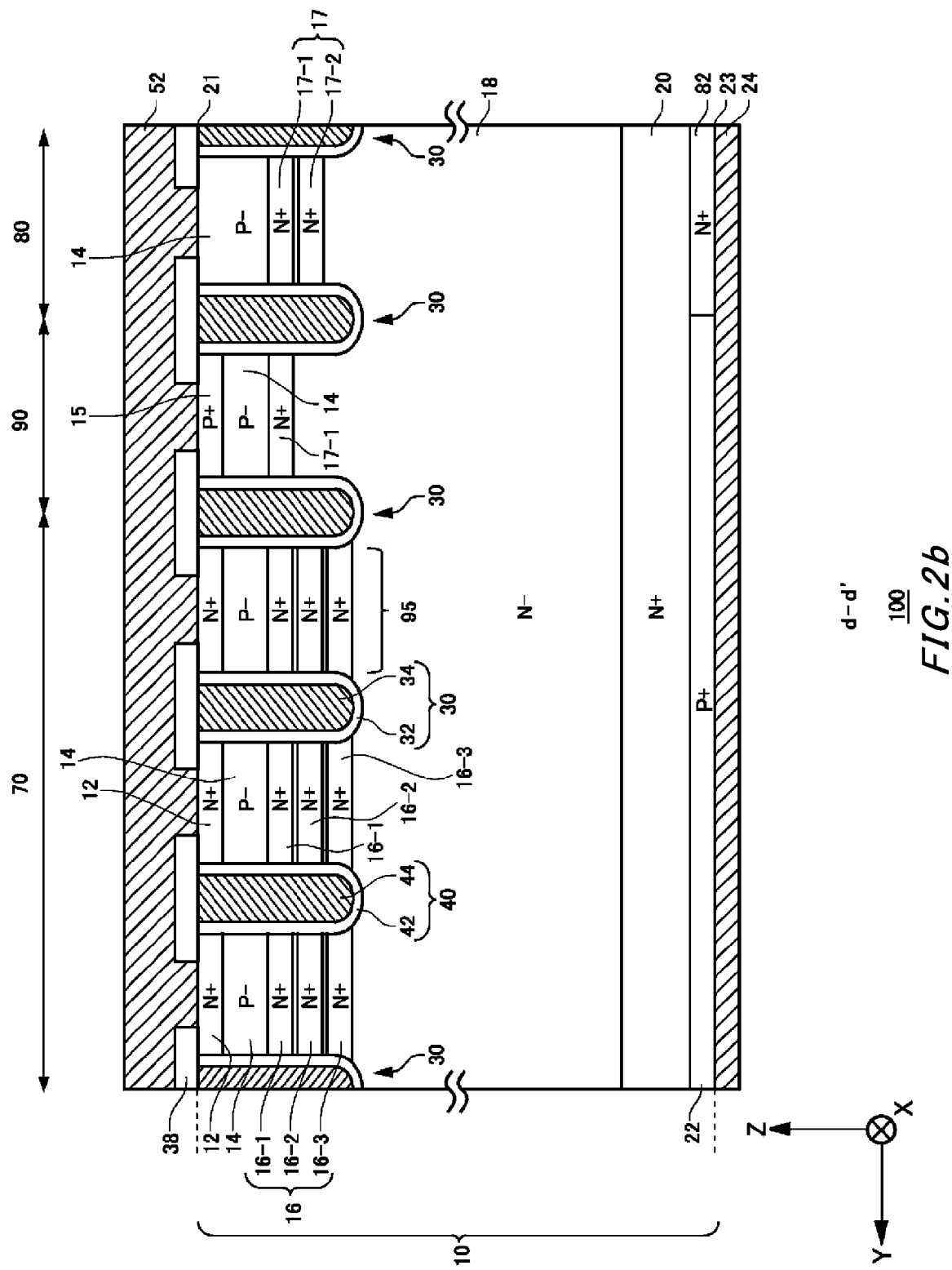
FIG. 2b is a figure showing another example of the cross-section taken along d-d' in FIG. 1.

FIG. 2b is a figure showing another example of the cross-section taken along d-d' in FIG. 1. The semiconductor device 100 shown in FIG. 2b is different from the semiconductor device 100 shown in FIG. 2a in that it is provided with a high concentration region 17-1 in a mesa portion 95 of the boundary portion 90 in the semiconductor device 100 shown in FIG. 2a. Although FIG. 2b shows one example in which one high concentration region 17-1 is provided, a plurality of high concentration regions 17 may be formed in each mesa portion 95 of the boundary portion 90.

The number of high concentration regions 17 of the boundary portion 90 may be smaller than the number of accumulation regions 16 of the transistor portion 70. In this case, for example, it is possible to facilitate extraction of minority carriers at the time of turn-off as compared with extraction in the transistor portion 70, and it is possible to suppress latch-ups in a mesa portion 95, especially on the diode portion 80 side, of the transistor portion 70. Alternatively, the number of high concentration regions 17 of the boundary portion 90 may be the same as or greater than the number of accumulation regions 16 of the transistor portion 70.

The number of high concentration regions 17 of the boundary portion 90 may be smaller than or the same as the number of high concentration regions 17 of the diode portion 80. That is, assuming that the number of accumulation regions 16 of the transistor portion 70 is Nt, the number of high concentration regions 17 of the boundary portion 90 is Nk, and the number of high concentration regions 17 of the diode portion 80 is Nd, Nt≥Nd≥Nk may hold true. Also, Nd≥Nt≥Nk may hold true for the relationship among Nt, Nk and Nd. Furthermore, Nt>Nd≥Nk, Nt≥Nd>Nk, or Nt>Nd>Nk may hold true. Alternatively, Nd>Nt≥Nk, Nd≥Nt>Nk, or Nd>Nt>Nk may hold true. In the present example, as shown in FIG. 2b, one high concentration region 17-1 is formed.

Figure 2C:
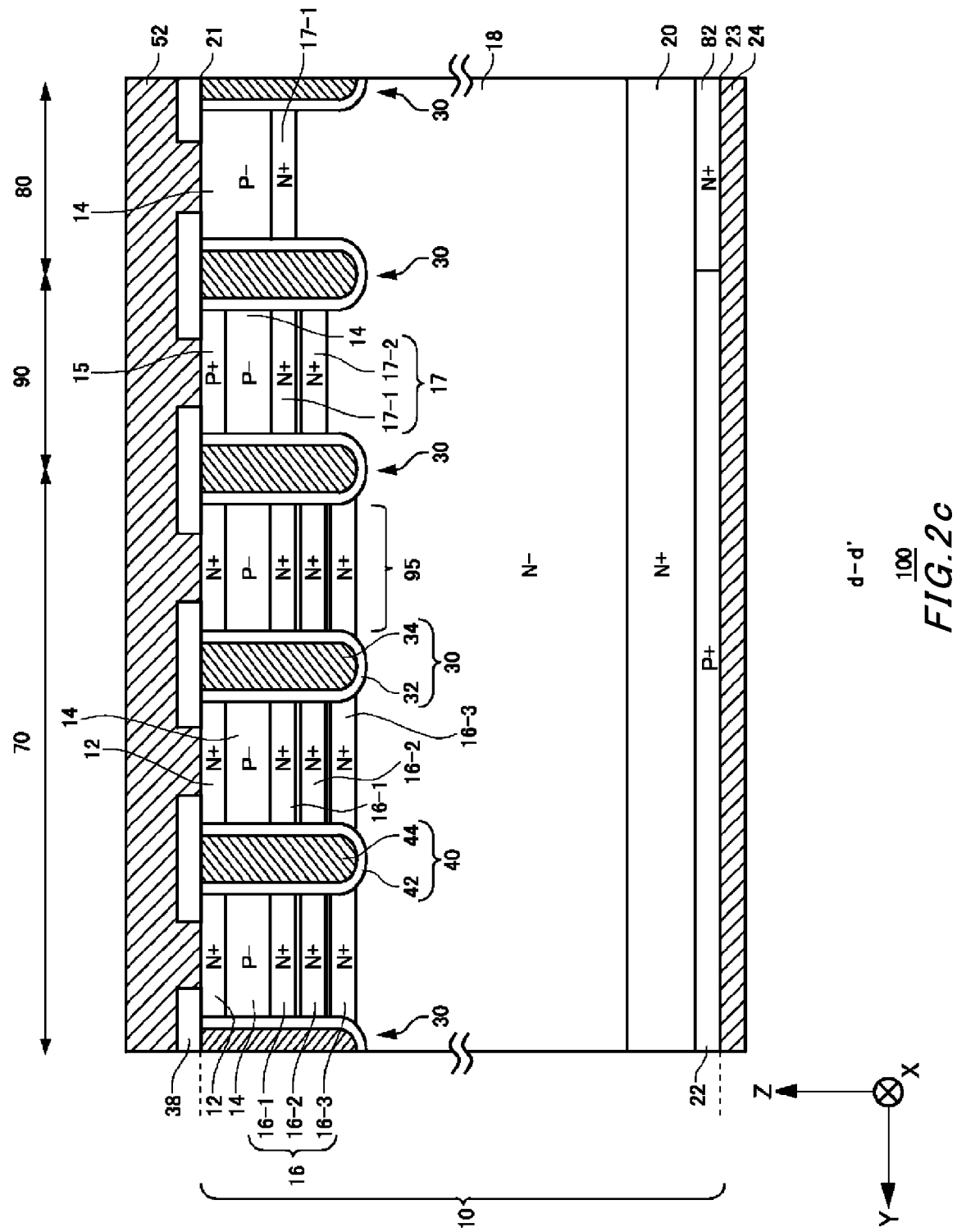
FIG. 2c is a figure showing another example of the cross-section taken along d-d' in FIG. 1.

FIG. 2c is a figure showing another example of the cross-section taken along d-d' in FIG. 1. The semiconductor device 100 shown in FIG. 2c is different from the semiconductor device 100 shown in FIG. 2a in that two high concentration region 17-1 and high concentration region 17-2 are provided to a mesa portion 95 of the boundary portion 90, and one high concentration region 17-1 is provided o a mesa portion 95 of the diode portion, in the semiconductor device 100 shown in FIG. 2a. In the present example also, the number of accumulation regions 16 of the transistor portion 70 is three.

The number of high concentration regions 17 provided to a single mesa portion 95 of the boundary portion 90 may be greater than the number of high concentration regions 17 of the diode portion 80 as shown in FIG. 2c. In this case, if it is in an operation mode in which a voltage higher than a voltage applied to the collector electrode 24 is applied to the emitter electrode 52 and the diode portion 80 becomes conductive, implantation of minority carriers (holes in the present example) of the boundary portion 90 can be more suppressed than implantation of minority carriers of the diode portion 80 can be.

The number of accumulation regions 16 of the transistor portion 70, the number of high concentration regions 17 of the boundary portion 90, and the number of high concentration regions 17 of the diode portion 80 may be the same. That is, assuming that the number of accumulation regions 16 of the transistor portion 70 is Nt, the number of high concentration regions 17 of the boundary portion 90 is Nk, and the number of high concentration regions 17 of the diode portion 80 is Nd, Nt≥Nk≥Nd may hold true. Also, Nk≥Nt≥Nd may hold true for the relationship among Nt, Nk and Nd. Furthermore, Nt≥Nk>Nd or Nt>Nk≥Nd may hold true. Alternatively, Nk≥Nt>Nd, Nk>Nt≥Nd, or Nk>Nt>Nd may hold true.

Furthermore, in the depth direction from the upper surface 21 of the semiconductor substrate 10 toward its lower surface 23, the doping concentration distribution of accumulation regions 16 of the transistor portion 70, the doping concentration distribution of high concentration regions 17 of the boundary portion 90, and the doping concentration distribution of high concentration regions 17 of the diode portion 80 may be approximately the same. In this case, the accumulation regions 16 of the transistor portion 70, the high concentration regions 17 of the boundary portion 90, and the high concentration regions 17 of the diode portion 80 may all be formed in the same ion implantation or annealing process, or may be formed in different steps.

Figure 2D:
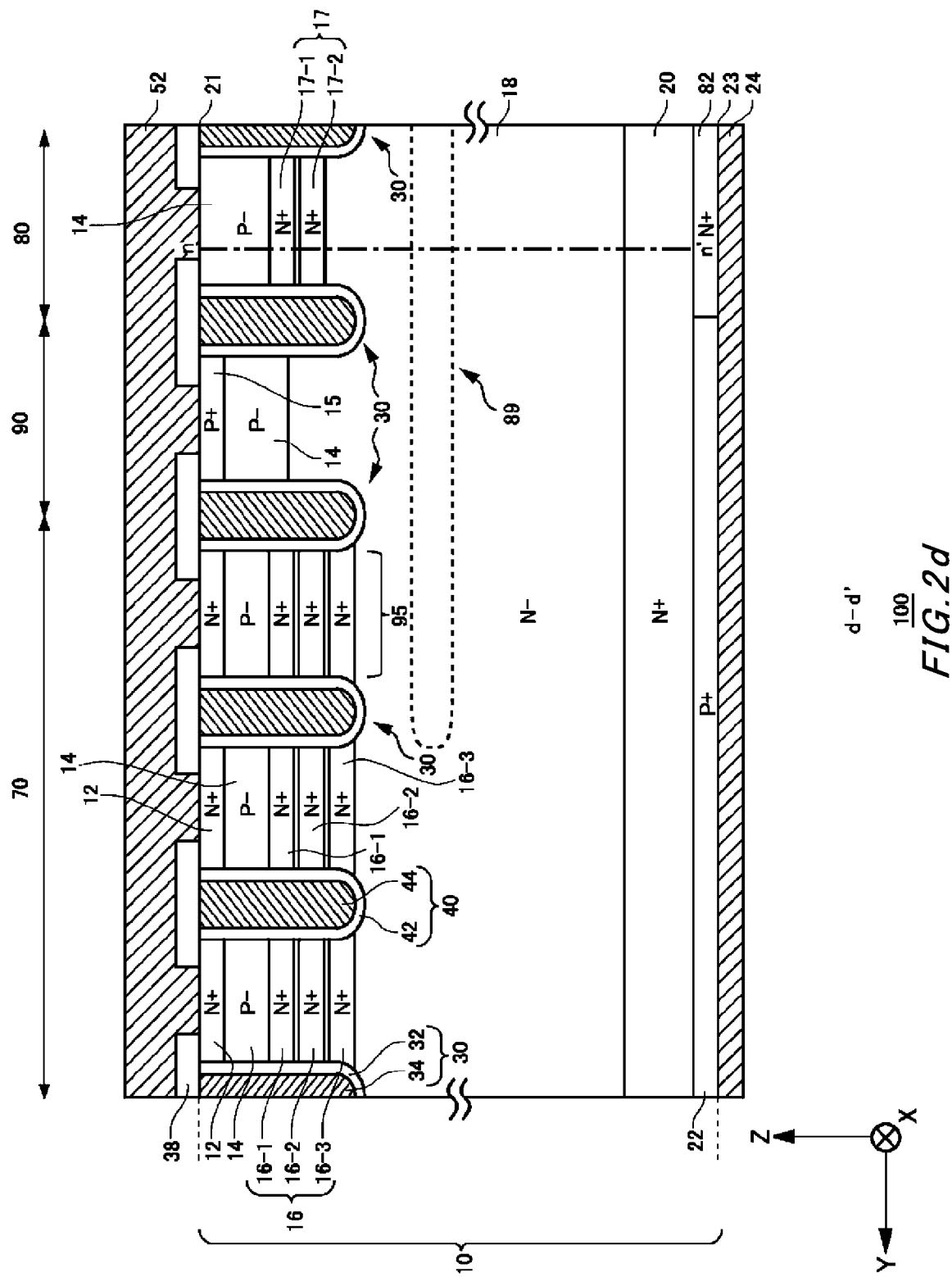
FIG. 2d is a figure showing another example of the cross-section taken along d-d' in FIG. 1.

FIG. 2d is a figure showing another example of the cross-section taken along d-d' in FIG. 1. The semiconductor device 100 shown in FIG. 2d is different from the semiconductor device 100 shown in FIG. 2a in that in the drift region 18 and at a depth position on the upper surface 21 side relative to the middle position of the semiconductor substrate 10 in the depth direction, a crystal defect layer 89 is provided lying in the Y-axis direction in a range from a region that is in the transistor portion 70 and adjoins the boundary portion 90 to the diode portion 80, in the semiconductor device 100 shown in FIG. 2a. The crystal defect layer 89 may be, as one example, formed by implanting a lifetime killer such as helium locally.

The crystal defect layer 89 is a layer containing crystal defects. The crystal defects may be any defects as long as they become recombination centers, and for example may be vacancy, divacancy, dislocation, inter-lattice atoms, helium atoms, metal atoms or the like. By adopting such a configuration also, the reverse recovery characteristics can be improved. The crystal defect layer 89 may be formed in the diode portion 80 and the boundary portion 90 in the array direction of trench portions (Y-axis direction), and extend so as to further include one or more predetermined mesa portions 95 of the transistor portion. Also, in the extending direction of the trench portions (X-axis direction), as seen in a top view, the crystal defect layer 89 may be arranged so as to cover the entire dummy trench portions 30 so as to include at least ends, in the extending direction, of the dummy trench portions 30.

Figure 2E:
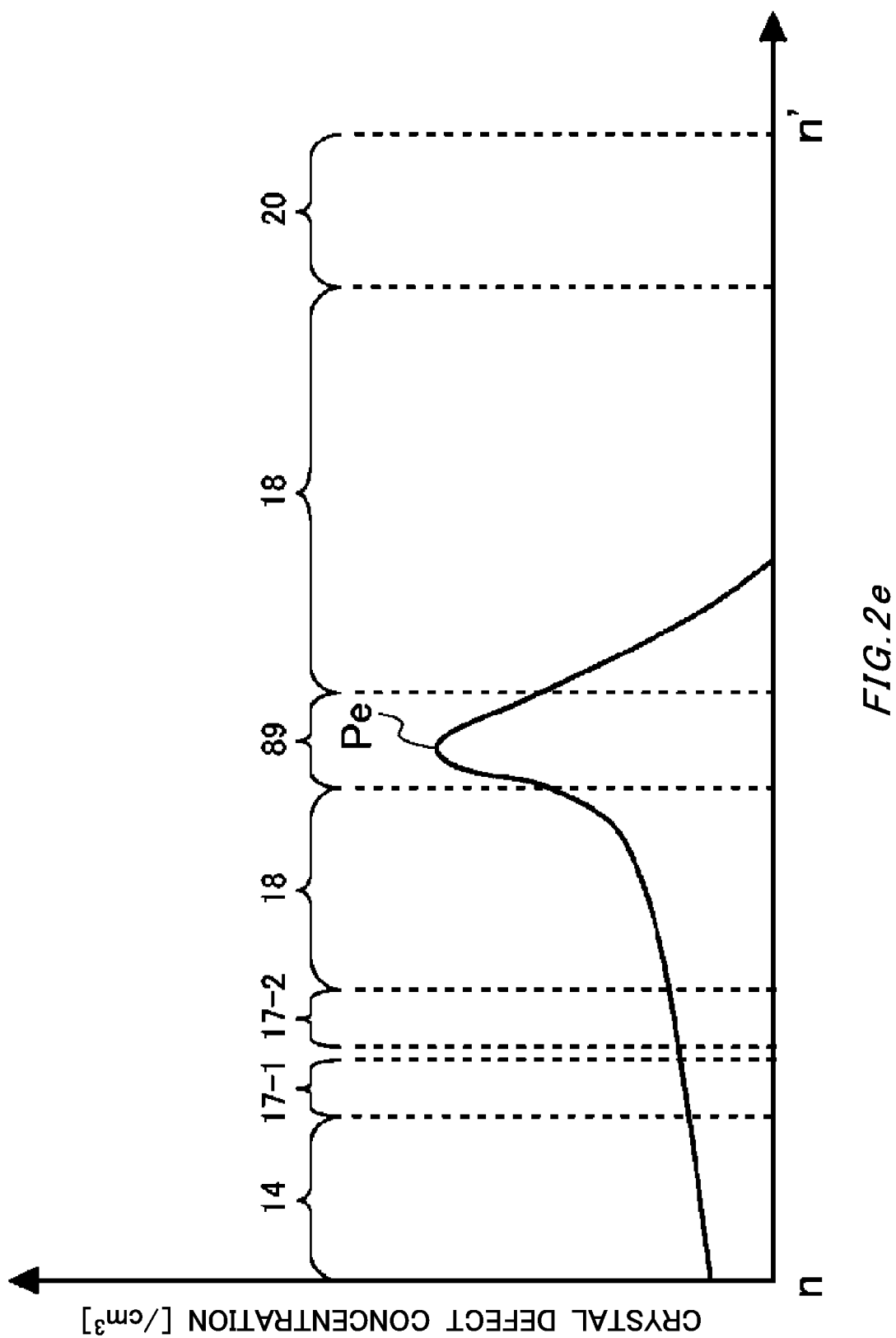
FIG. 2e is a figure showing a concentration distribution of a crystal defect layer 89 in a cross-section taken along n-n' in FIG. 2d.

FIG. 2e is a figure showing a concentration distribution of the crystal defect layer 89 in a cross-section taken along n-n' in FIG. 2d. As shown in FIG. 2e, the crystal defect layer 89 may have any configuration as long as the position of the peak concentration Pe of the crystal defects is in the drift region 18 and at a depth position on the upper surface 21 side relative to the middle position of the semiconductor substrate 10 in the depth direction. That is, part of a region that is in the crystal defect layer 89 and located on the lower surface 23 side in the depth direction relative to the position of the peak concentration Pe of the crystal defects may be distributed on the lower surface 23 side relative to the middle position of the semiconductor substrate 10 in the depth direction.

Also, the crystal defect concentration distribution of the crystal defect layer 89 in the diode portion 80 may be a distribution that exhibits skewed concentrations from the upper surface 21 to the position of the peak concentration Pe. In this case, the crystal defect concentration distribution may not reach the lower surface 23. Also, as long as it is a distribution that exhibits skewed concentrations from the upper surface 21 to the position of the peak concentration Pe, the depth position of the peak concentration Pe may be on the lower surface 23 side relative to the middle position of the semiconductor substrate 10 in the depth direction. In the present example, the depth position of the peak concentration Pe is in the crystal defect layer 89.

Figure 2F:
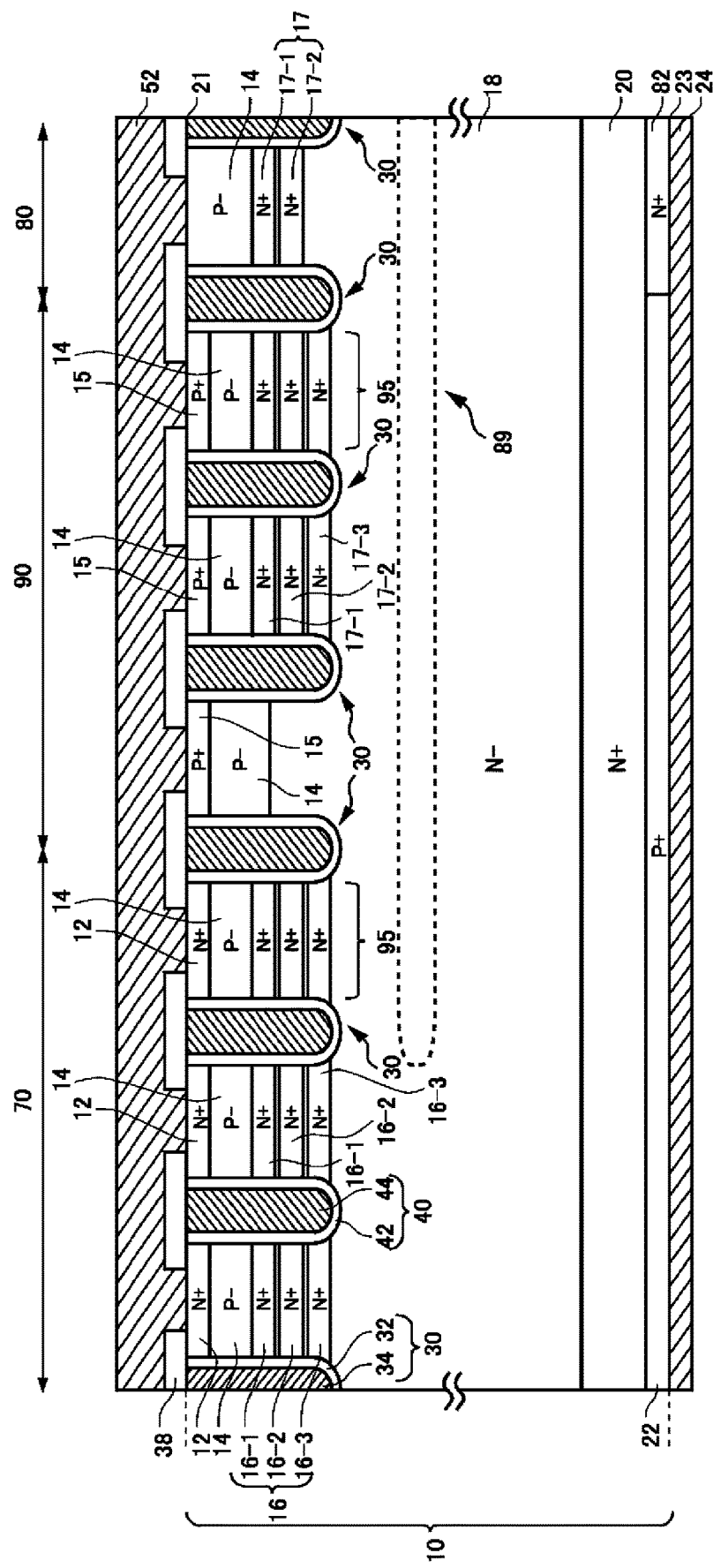
FIG. 2f is a figure showing one example of a cross-section of a semiconductor device 150 according to an embodiment of the present invention.

FIG. 2f is a figure showing one example of a cross-section of a semiconductor device 150 according to an embodiment of the present invention. The semiconductor device 150 shown in FIG. 2f is different from the semiconductor device 100 shown in FIG. 2a in that a plurality of mesa portions 95 of the boundary portion 90 are provided. Also, the semiconductor device 150 is different from the semiconductor device 100 shown in FIG. 2a in that in the drift region 18 and at a depth position on the upper surface 21 side relative to the middle position of the semiconductor substrate 10 in the depth direction, a crystal defect layer 89 is provided lying in the Y-axis direction in a range from a region that is in the transistor portion 70 and adjoins the boundary portion 90 to the diode portion 80. The crystal defect layer 89 may be vacancy, divacancy, dislocation, inter-lattice atoms, helium atoms or the like, similar to the example in FIG. 2d.

In the semiconductor device 150 in the present example, among the mesa portions 95 of the boundary portion 90, a mesa portion 95 adjoining the diode portion 80 is provided with high concentration regions 17 the number of which is greater than the number of high concentration regions 17 of the diode portion 80. Also, in the semiconductor device 150 in the present example, among the mesa portions 95 of the boundary portion 90, a mesa portion 95 adjoining the transistor portion 70 is not provided with high concentration regions 17.

Among the mesa portions 95 of the boundary portion 90, a mesa portion 95 sandwiched by the mesa portion 95 adjoining the diode portion 80 and the mesa portion 95 adjoining the transistor portion 70 may be provided with high concentration regions 17 the number of which is greater than or smaller than the number of high concentration regions 17 provided to the mesa portion 95 adjoining the diode portion 80, or may not be provided with high concentration regions 17.

According to the semiconductor device 150 in the present example, for example, it is possible to facilitate extraction of minority carriers at the time of turn-off as compared with extraction in the transistor portion 70. Because of this, latch-ups in a mesa portion 95, especially on the diode portion 80 side, of the transistor portion 70 can be suppressed.

Also, according to the semiconductor device 150 in the present example, because among the mesa portions 95 of the boundary portion 90, the mesa portion 95 adjoining the diode portion 80 is provided with high concentration regions 17 the number of which is greater than the number of the high concentration regions 17 of the diode portion 80, similar to the example shown in FIG. 2c, if it is in an operation mode in which a voltage higher than a voltage applied to the collector electrode 24 is applied to the emitter electrode 52 and the diode portion 80 becomes conductive, implantation of minority carriers (holes in the present example) of the boundary portion 90 can be more suppressed than implantation of minority carriers of the diode portion 80 can be.

Figure 2G:
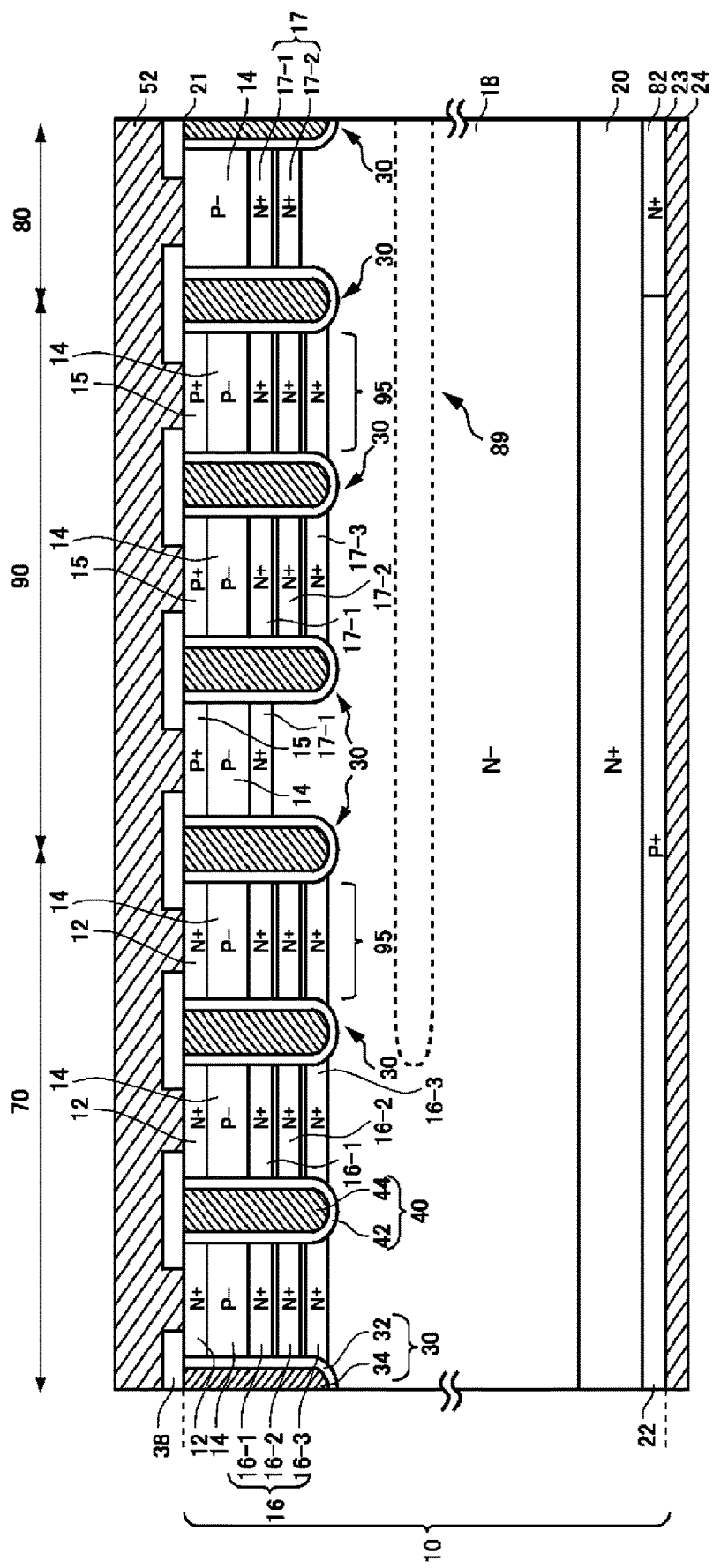
FIG. 2g is a figure showing another example of a cross-section of the semiconductor device 150 according to an embodiment of the present invention.

FIG. 2g is a figure showing another example of a cross-section of the semiconductor device 150 according to an embodiment of the present invention. The semiconductor device 150 shown in FIG. 2g is different from the semiconductor device 150 shown in FIG. 2f in that among mesa portions 95 of the boundary portion 90, a mesa portion 95 adjoining the transistor portion 70 is provided with one high concentration region 17-1, in the semiconductor device 150 shown in FIG. 2f. Thereby, if it is in an operation mode in which the diode portion 80 becomes conductive, implantation of minority carriers (holes in the present example) from the mesa portion 95 can be more suppressed than implantation of minority carriers of the diode portion 80 can be.

Also, as shown in FIG. 2g, among the mesa portions 95 of the boundary portion 90, the mesa portion 95 adjoining the transistor portion 70 may be provided with high concentration region 17 the number of which is smaller than the number of accumulation regions 16 provided to the transistor portion 70. In this case, it is possible to facilitate extraction of minority carriers for example at the time of turn-off as compared with extraction in the transistor portion 70, and it is possible to suppress latch-ups in a mesa portion 95, especially on the diode portion 80 side, of the transistor portion 70.

Assuming that the number of accumulation regions 16 of the transistor portion 70 is Nt, the number of high concentration regions 17 provided to a mesa portion 95 that is in the boundary portion 90 and adjoins the transistor portion 70 is Nkt, the number of high concentration regions 17 provided to a mesa portion 95 that is in the boundary portion 90 and adjoins the diode portion 80 is Nkd, and the number of high concentration regions 17 of the diode portion 80 is Nd, Nkd≥Nd and Nt≥Nkt may hold true in the examples in FIG. 2f and FIG. 2g. Also, Nkt≥Nkd or Nkd≥Nkt may true hold for the relationship between Nkt and Nkd.

On the other hand, the tradeoff between on-state voltage and off-state loss in the transistor portion 70 deteriorates in some cases if a lifetime killer is implanted. Because in the present example, a lifetime killer is not used or can be used less, the reverse recovery characteristics can be improved while at the same time deterioration of on-state voltage-off-state loss characteristics is suppressed. Also, characteristic variations due to the lifetime killer, and leakage current can be suppressed. Also, the manufacturing cost can be reduced by using a photo resist mask the unit price of which is more inexpensive than a metal mask for lifetime killer implantation.

If the integrated concentration of high concentration regions 17 in the diode portion 80 becomes too high, the tradeoff between on-state loss and switching loss at the time of reverse recovery for a forward voltage in the diode portion 80 deteriorates in some cases. To cope with this, by making the integrated concentration of high concentration regions 17 in the diode portion 80 lower than the integrated concentration of accumulation regions 16 in the transistor portion 70, deterioration of the tradeoff can be suppressed.

The integrated concentration in the diode portion 80 may be 70% or 50% of the integrated concentration in the transistor portion 70, or lower.

Figure 3:
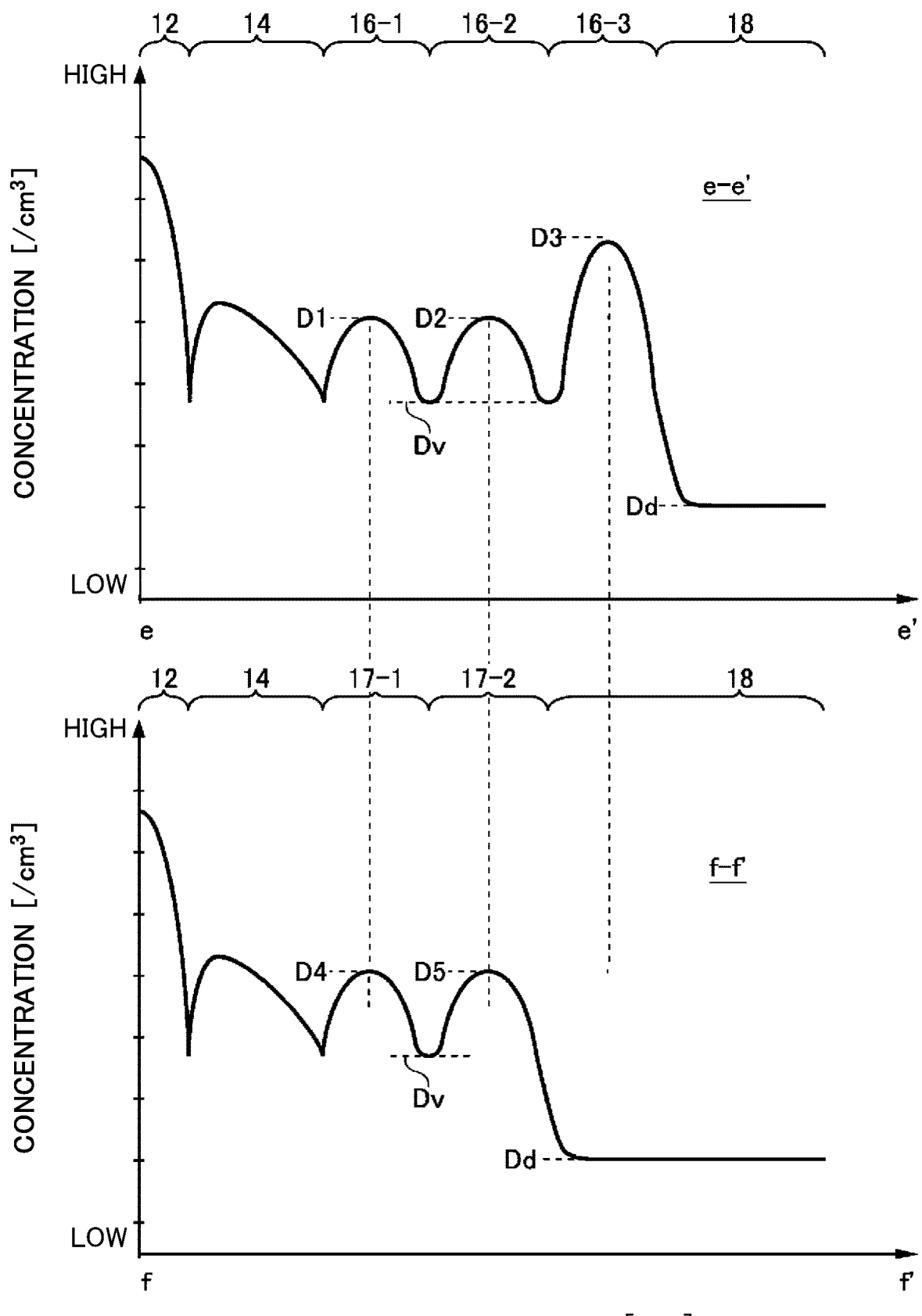

FIG. 3 is a figure showing one example of doping concentration distributions in a cross-section taken along e-e' and cross-section taken along f-f' in FIG. 2a. The cross-section taken along e-e' is a cross-section at a mesa portion 95 of the transistor portion 70, and the cross-section taken along f-f' is a cross-section along a mesa portion 95 of the diode portion 80.

In each accumulation region 16 and high concentration region 17, the doping concentration distribution in the depth direction of the semiconductor substrate 10 has one peak. If a plurality of accumulation regions 16 or high concentration regions 17 are formed in the depth direction of the semiconductor substrate 10, in the doping concentration distributions in the depth direction, the accumulation regions 16 and the high concentration regions 17 have a plurality of peaks (maximal values) and minimal values at positions sandwiched by the plurality of peaks in the depth direction. In other words, regions between a plurality of minimal values may each be regarded as a single accumulation region 16 or single high concentration region 17. Each accumulation region 16 and high concentration region 17 may be formed by implanting impurities from the upper surface 21 or lower surface 23.

FIG. 3 shows the doping concentration distribution from the emitter region 12 to the upper end of the drift region 18. As shown in FIG. 3, vertical axes of figures showing concentrations of impurities are logarithmic axes. An increase by a single tick mark on a vertical axis corresponds to a 10-fold increase. Doping concentrations in the present specification refer to the concentrations of impurities that are doped to function as donors or acceptors. The doping concentrations shown in FIG. 3 correspond to the concentration differences of donors and acceptors.

Each mesa portion 95 of the transistor portion 70 in the present example has a plurality of accumulation regions 16. In the example in FIG. 3, the transistor portion 70 has a first accumulation region 16-1, a second accumulation region 16-2 and a third accumulation region 16-3. The doping concentration of the first accumulation region 16-1 is represented as D1, the doping concentration of the second accumulation region 16-2 is represented as D2, and the doping concentration of the third accumulation region 16-3 is represented as D3. Peak values may be used as the values of the doping concentrations.

Also, the doping concentrations Dv at the boundaries between the respective accumulation regions 16 are the minimal values of the doping concentration distributions of the accumulation regions 16. The doping concentrations Dv are higher than the doping concentration Dd of the drift region 18. The doping concentrations Dv may be 1/10 or 1/100 of the doping concentration D1, or lower.

In the plurality of accumulation regions 16, there may be a plurality of boundaries between the respective accumulation regions 16. There may be a plurality of minimal values (Dv) of the doping concentrations at the boundaries of the respective accumulation regions 16. The minimal values (Dv) of the plurality of doping concentrations may be mutually different values. In the present example, the two doping concentrations Dv are approximately the same values.

Each mesa portion 95 of the diode portion 80 in the present example has a plurality of high concentration regions 17. However, the number of high concentration regions 17 formed in the depth direction in each mesa portion 95 of the diode portion 80 may be smaller than the number of accumulation regions 16 formed in the depth direction in each mesa portion 95 of the transistor portion 70. Thereby, the integrated concentration of the one or more high concentration regions 17 in each mesa portion 95 of the diode portion 80 can be readily made lower than the integrated concentration of the one or more accumulation regions 16 in each mesa portion 95 of the transistor portion 70. In the example in FIG. 3, the diode portion 80 has a first high concentration region 17-1 and a second high concentration region 17-2. The doping concentration of the first high concentration region 17-1 is represented as D4, and the doping concentration of the second high concentration region 17-2 is represented as D5.

Each high concentration region 17 of the diode portion 80 may be provided at the same depth position as any of the accumulation regions 16 of the transistor portion 70. The depth position of each region may be a position where the doping concentration distribution peaks in the region. In the present example, the first high concentration region 17-1 is formed at the same depth position as the first accumulation region 16-1, and the second high concentration region 17-2 is formed at the same depth position as the second accumulation region 16-2. Two regions may be regarded as being formed at the same depth position, even if there is a predetermined amount of error. For example, even if there is an error in the positions of peaks which is within 10% of the half widths of the mountain shaped doping concentration distributions including the peaks, they may be regarded as being positioned at the same depth position. By forming respective regions at the same depth position, manufacturing steps can be simplified readily.

Also, the doping concentration of each high concentration region 17 in the diode portion 80 may be equal to the doping concentration of an accumulation region 16 provided at the same depth in the transistor portion 70. Here, doping concentrations of regions may be peak values of the doping concentrations in the regions. In the present example, the doping concentration D4 of the first high concentration region 17-1 is equal to the doping concentration D1 of the first accumulation region 16-1. Also, the doping concentration D5 of the second high concentration region 17-2 is equal to the doping concentration D2 of the second accumulation region 16-2. Two regions may be regarded as having equal doping concentrations even if there is a predetermined amount of error. For example, even if there is an error in the doping concentrations which is within 10%, they may be regarded as having the same doping concentrations. Also, the doping concentration Dv at the boundary between two high concentration regions 17 may be equal to the doping concentration Dv at the boundary between two accumulation regions 16.

In this manner, by making the depth position and doping concentration of each high concentration region 17 the same as those of any of accumulation regions 16, the high concentration region 17 can be formed in the same manufacturing step as that for the accumulation region 16. Because of this, manufacturing steps can be simplified.

Among a plurality of accumulation regions 16 in each mesa portion 95 of the transistor portion 70, the doping concentration of any of the accumulation regions 16 may be higher than the doping concentration of another accumulation region 16 formed at a different depth position. In the transistor portion 70 in the present example, the doping concentration D3 of the third accumulation region 16-3 provided at the deepest position is higher than the doping concentrations (D1, D2) of all the other accumulation regions 16 of the transistor portion 70. The doping concentration D3 may approximately three times the doping concentration D1 or higher and seven times the doping concentration D1 or lower. The doping concentrations D1 and D2 may be the same.

In a plurality of accumulation regions 16 of each mesa portion 95 of the transistor portion 70, a plurality of doping concentrations Dv may become lower as the depths from the upper surface 21 increase. The doping concentrations Dv correspond to troughs of the doping concentration distribution in contrast to the peak concentrations D1, D2, D3. Because of the trough concentrations of a plurality of doping concentrations becoming lower in relation to the depth direction, the capacitance between a gate and a collector can be adjusted to a predetermined magnitude.

The diode portion 80 may not have a high concentration region 17 corresponding to an accumulation region 16 having the highest doping concentration among the accumulation regions 16 of the transistor portion 70. Thereby, the integrated concentration of high concentration regions 17 of the diode portion 80 can be made sufficiently lower than the integrated concentration of accumulation regions 16 in the transistor portion 70. In the present example, the diode portion 80 does not have a high concentration region 17 at the same depth as the third accumulation region 16-3 provided at the deepest position in the transistor portion 70.

If three or more high concentration regions 17 are formed in the diode portion 80, the plurality of doping concentrations Dv may become lower as the depths from the upper surface 21 increase. If three or more high concentration regions 17 are formed in the boundary portion 90, the plurality of doping concentrations Dv may become lower as the depths from the upper surface 21 increase.

As one example, the peak positions of the doping concentrations of respective accumulation regions 16 are arranged at regular intervals in the depth direction. In another example, the peak positions of the doping concentrations of respective accumulation regions 16 may be arranged at irregular intervals in the depth direction. By providing a plurality of accumulation regions 16 in the transistor portion 70, a transient capacitance between the gate conductive portion 44 and the collector electrode 24 at the time of turn-on can be increased. Thereby, the turn-on loss can be reduced while at the same time improving the tradeoff between on-state voltage and turn-off loss in the transistor portion 70.

Figure 4:
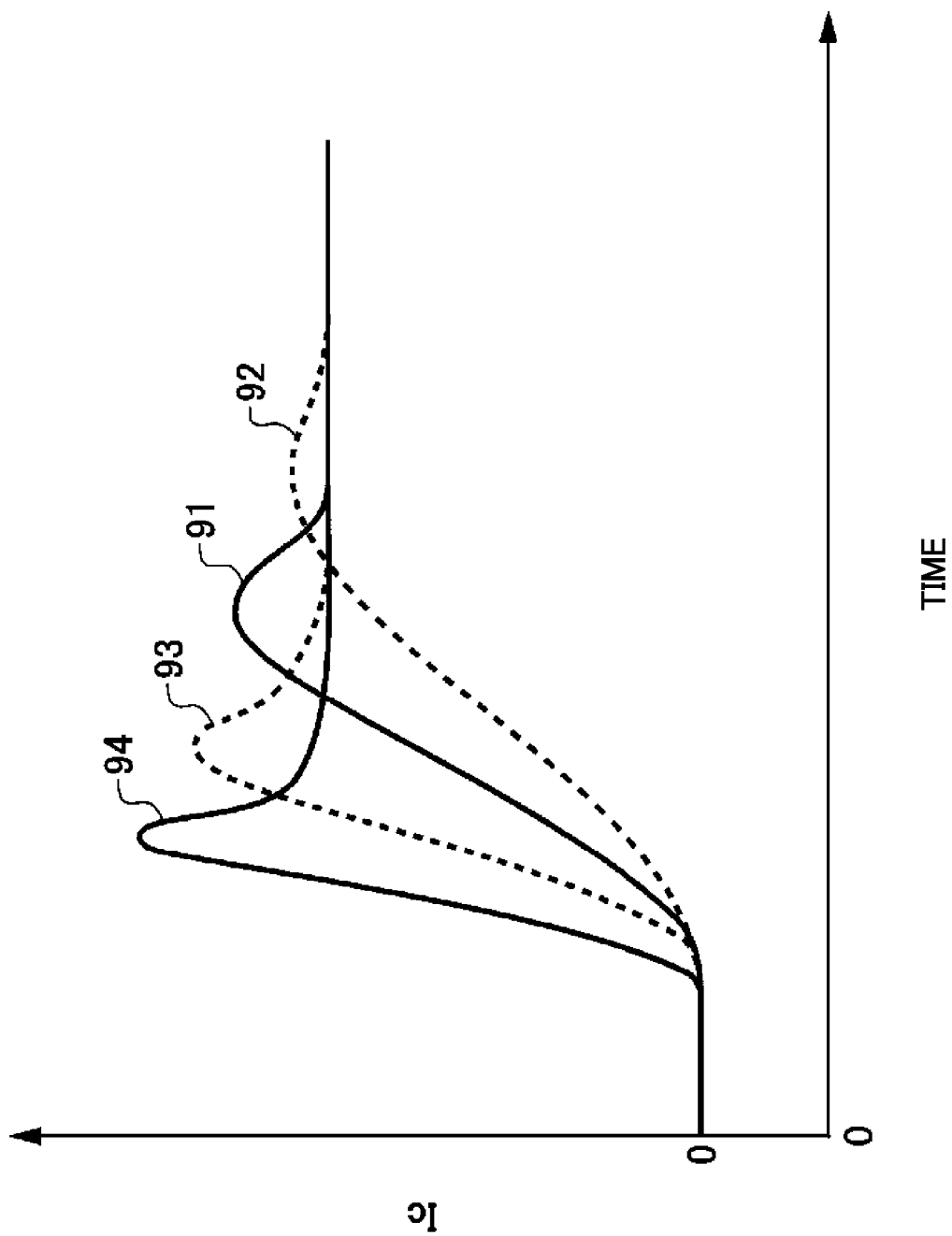

FIG. 4 is a figure showing waveform examples of collector currents Ic at the time of turn-on. A waveform 93 shows a collector current Ic in a case where accumulation regions 16 are not provided. A waveform 94 shows a collector current Ic in a case where a first accumulation region 16-1 is provided. Because the first accumulation region 16-1 is provided in the proximity of a base region 14, it increases the negative capacitance between a gate and a collector. Because of this, di/dt of the collector current Ic at the time of turn-on increases. Although the tradeoff between on-state voltage and turn-off loss can be improved by providing the first accumulation region 16-1, because di/dt at the time of turn-on increases, if the gate resistance is increased to suppress increase in di/dt, the turn-on loss increases inevitably.

A waveform 91 shows a collector current Ic in a case where a first accumulation region 16-1 and a third accumulation region 16-3 are provided. Because the third accumulation region 16-3 is provided at a position spaced apart from a base region 14, it increases the capacitance between a gate and a collector. Because of this, di/dt of the collector current Ic at the time of turn-on decreases. Accordingly, the turn-on loss can be reduced while at the same time improving the tradeoff between on-state voltage and turn-off loss.

A waveform 92 shows a collector current Ic in a case where a first accumulation region 16-1, a second accumulation region 16-2 and a third accumulation region 16-3 are provided. By providing the second accumulation region 16-2, the capacitance between a gate and a collector further increases. Because of this, the turn-on loss can further be reduced while at the same time improving the tradeoff between on-state voltage and turn-off loss.

Figure 5:
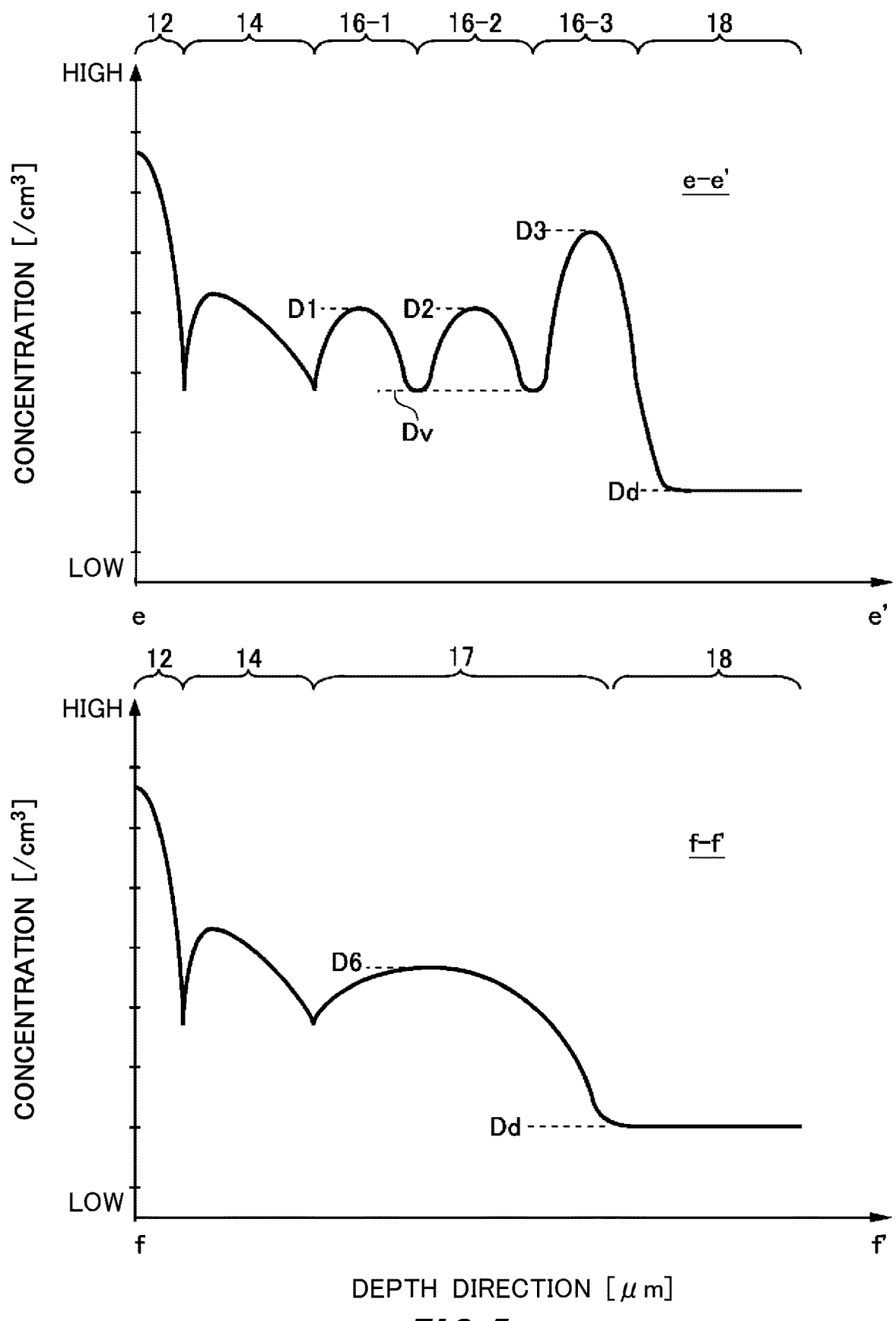

FIG. 5 is a figure showing another example of doping concentration distributions in the cross-section taken along e-e' and cross-section taken along f-f' in FIG. 2. In the present example, the doping concentration distribution in the transistor portion 70 is the same as that in the example in FIG. 3.

The diode portion 80 in the present example has a single high concentration region 17 in each mesa portion 95. That is, an N-type doping concentration distribution having a concentration higher than that of the drift region 18 has one peak between a base region 14 and the drift region 18. The high concentration region 17 in the present example may be formed in a longer range in the depth direction than any of accumulation regions 16 is. A doping concentration D6 of the high concentration region 17 is set such that the integrated concentration of the high concentration region 17 becomes lower than the integrated concentration of one or more accumulation regions 16 in the transistor portion 70. The doping concentration D6 of the high concentration region 17 may be lower than or higher than the doping concentration D1 of a first accumulation region 16.

With such a configuration also, the reverse recovery characteristics can be improved while at the same time suppressing deterioration of the on-state voltage-off-state loss characteristics in the transistor portion 70. Also, deterioration of the tradeoff between on-state loss and switching loss at the time of reverse recovery for a forward voltage in the diode portion 80 can be suppressed.

Figure 6:
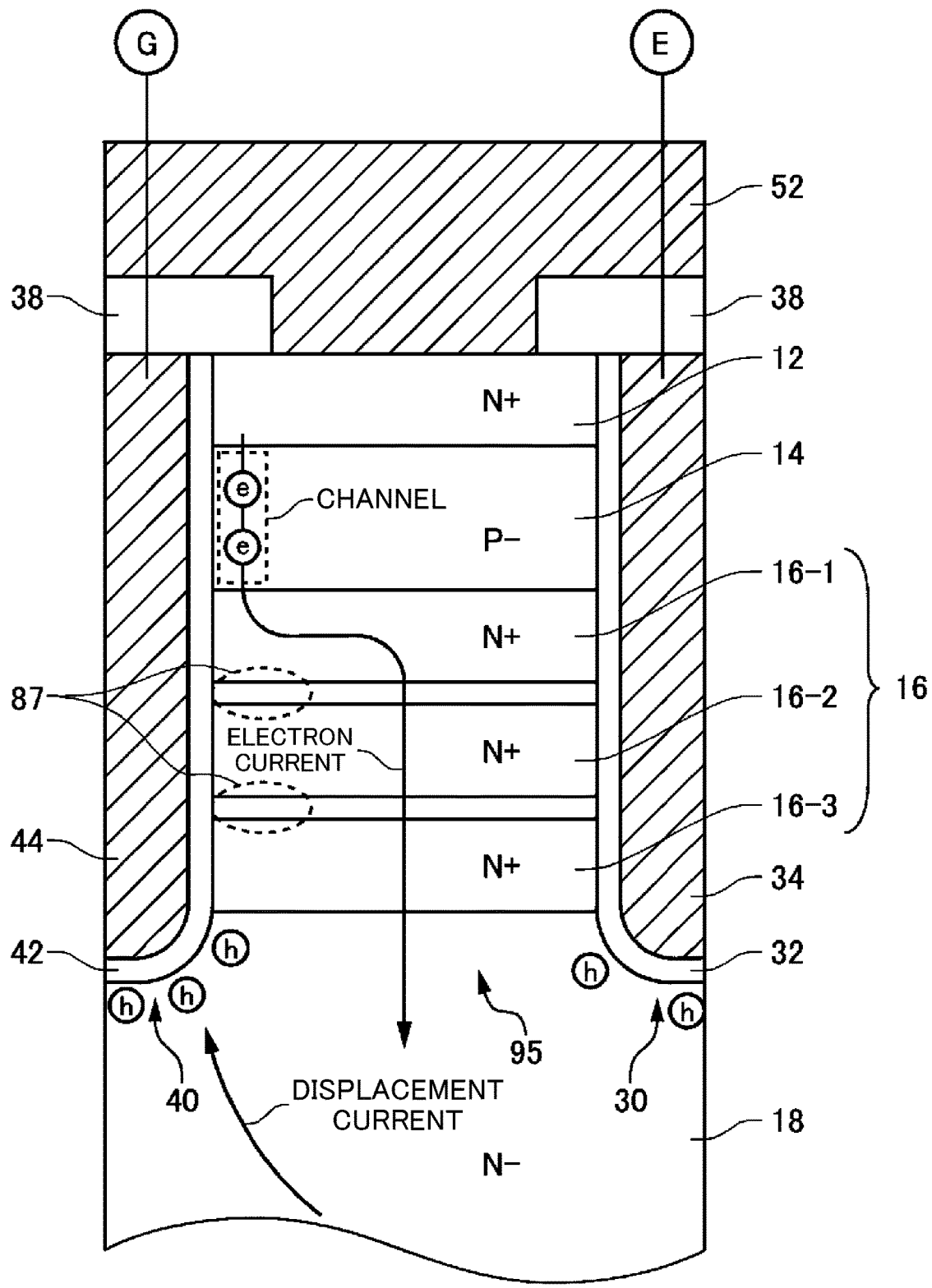
FIG. 6 is a figure showing electron current and displacement current at the time of turn-on in the semiconductor device 100 including a first accumulation region 16-1, a second accumulation region 16-2 and a third accumulation region 16-3.

FIG. 6 is a figure showing electron current and displacement current at the time of turn-on in a case where a first accumulation region 16-1, a second accumulation region 16-2 and a third accumulation region 16-3 are provided at a predetermined mesa portion 95 of the transistor portion 70, and a gate trench portion 40 and a dummy trench portion 30 that contact the mesa portion 95. Electrons that have passed through a channel almost advance in the array direction (X-axis direction) in the first accumulation region 16-1. However, in the present example, the second accumulation region 16-2 and the third accumulation region 16-3 are provided below the first accumulation region 16-1.

In the present example, the impedance for the electron current is lower in the path for the electron current to directly flow from the first accumulation region 16-1 to the second accumulation region 16-2 than in the path for the electron current to flow from the proximity of the middle of the first accumulation region 16-1 to return to the proximity of the gate trench portion 40 and to flow to the second accumulation region 16-2. Likewise, the impedance is lower in the path for the electron current to directly flow from the second accumulation region 16-2 to the third accumulation region 16-3 than in the path for the electron current to return from the proximity of the middle of the second accumulation region 16-2 to return to the proximity of the gate trench portion 40 and to flow to the third accumulation region 16-3.

It is easy for holes to accumulate in hole high-concentration regions 87 that are in regions below the respective accumulation regions 16 and adjoin the gate trench portion 40. Also, because the electron current flows not through the proximity of the gate trench portion 40 but through the proximity of the middle of the mesa portion 95, accumulation of holes in the hole high-concentration regions 87 is promoted. Because of this, flow of the electron current through the proximity of the middle of the mesa portion 95 is promoted. Although FIG. 6 schematically shows the hole high-concentration regions 87 where holes are accumulated, the hole high-concentration regions 87 may be present only at the proximity of the boundaries between the gate trench portion 40 and the semiconductor substrate 10.

As mentioned above, the electron current in the present example never returns to the proximity of the gate trench portion 40, but does advance downward near the middle of the mesa portion 95 sandwiched by the gate trench portion 40 and the dummy trench portion 30. That is, the electron current in the present example flows not through the proximity of the gate trench portion 40 but near the middle of the mesa portion 95. An effect of this electron current flowing near the middle of the mesa portion 95 arises because of the plurality of accumulation regions 16-1 to 16-3 being arrayed in the depth direction.

If the electron current flows near the middle of the mesa portion 95, the hole distribution at the proximity of a bottom portion of the mesa portion 95 is divided near the middle of the mesa portion 95. Because of this, holes on the dummy trench portion 30 side relative to the electron current path do not flow toward the gate trench portion 40 side. This division of the hole distribution at a middle portion of the mesa portion 95 suppresses accumulation of holes at the lower end of the gate trench portion 40. As a result of this, the displacement current can be made small. Because the displacement current can be made small, charging of the gate conductive portion 44 becomes small, and instantaneous increase in a gate metal layer Vge is also suppressed. Thereby, the voltage reduction ratio (dV/dt) between the collector electrode 24 and the emitter electrode 52 can also be suppressed. The hole distribution in the example in FIG. 6 is considered as being attributable to the hole distribution between the gate trench portion 40 and the dummy trench portion 30 being divided by the electron current. Also, due to the hole distribution, at the time of turn-on, the displacement current to flow from the proximity of the lower end of the dummy trench portion 30 to the proximity at the lower end of the gate trench portion 40 can be reduced.

The second accumulation region 16-2 and the third accumulation region 16-3 may not contact the dummy trench portion 30. In this case, holes can be present, ranging from the lower end of the dummy trench portion 30 to a region directly below the first accumulation region 16-1 at a side portion of the dummy trench portion 30. Thereby, extraction of holes to the emitter electrode 52 at the time of turn-off can be promoted.

Figure 7A:
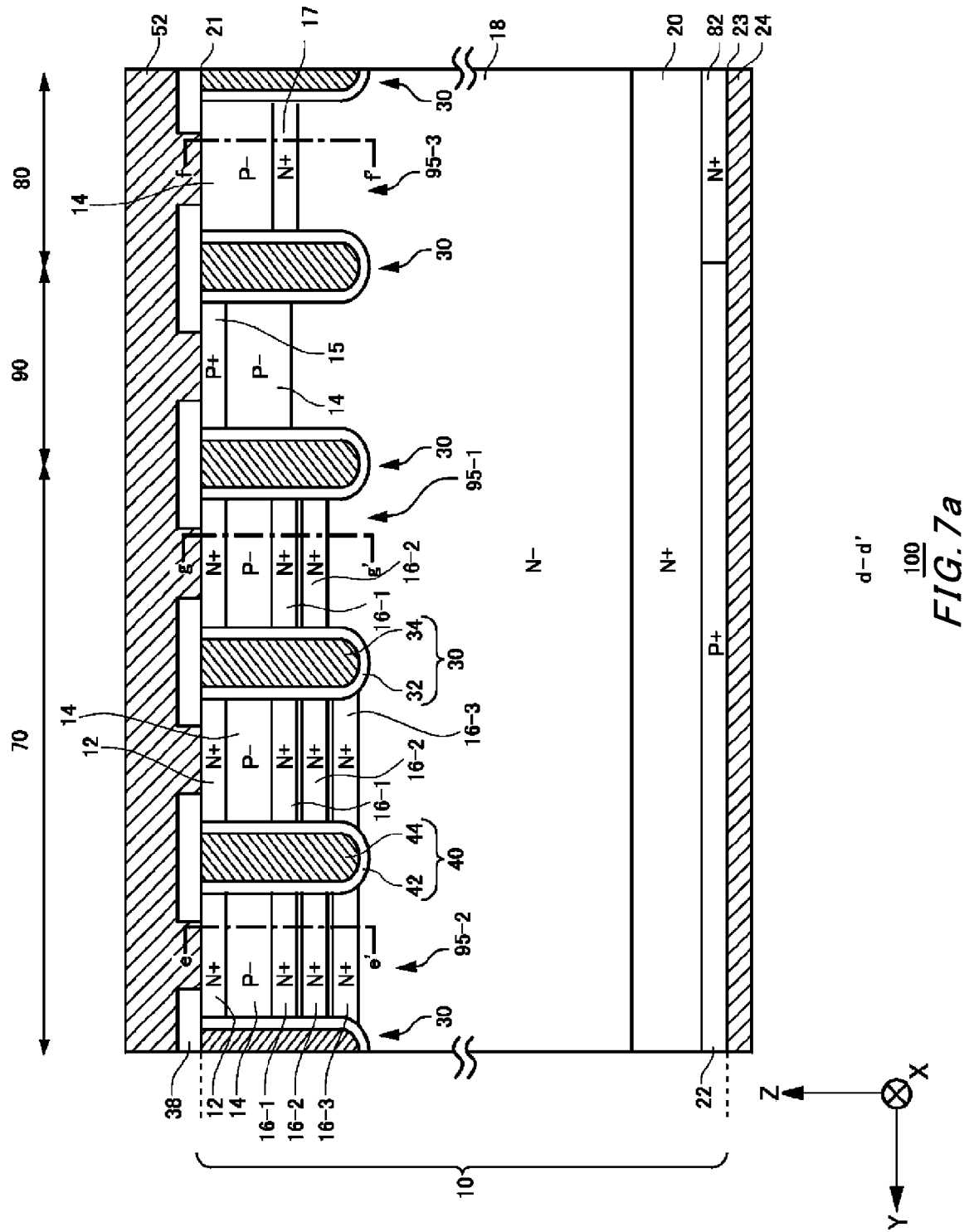
FIG. 7a is a figure showing another example of the cross-section taken along d-d' in FIG. 1.

FIG. 7a is a figure showing another example of the cross-section taken along d-d' in FIG. 1. In the present example, the structures of the diode portion 80 and the boundary portion 90 are the same those in any of the examples shown in FIG. 1 to FIG. 5.

The integrated concentration of one or more accumulation regions 16 in a mesa portion 95-1 provided closest to the diode portion 80 among mesa portions 95 of the transistor portion 70 in the present example is lower than the integrated concentration of one or more accumulation regions 16 in another mesa portion 95 (mesa portion 95-2, for example) of the transistor portion 70. Thereby, changes in the integrated concentrations between adjoining mesa portions 95 can be made gentle, and concentration of electric fields, current or the like can be suppressed. In a plurality of mesa portions 95 on the diode portion 80 side among mesa portions 95 of the transistor portion 70, the integrated concentrations may decrease as the distances to the diode portion 80 decrease.

Also, the integrated concentration of the one or more accumulation regions 16 in the mesa portion 95-1 may be higher than the integrated concentration of one or more high concentration regions 17 in a mesa portion 95-3 of the diode portion 80. By making the integrated concentration at the mesa portion 95-1 which is at an end of the transistor portion 70 higher than the integrated concentration at the mesa portion 95-3 of the diode portion 80, implantation of holes from the transistor portion 70 to the diode portion 80 can be suppressed.

Figure 7B:
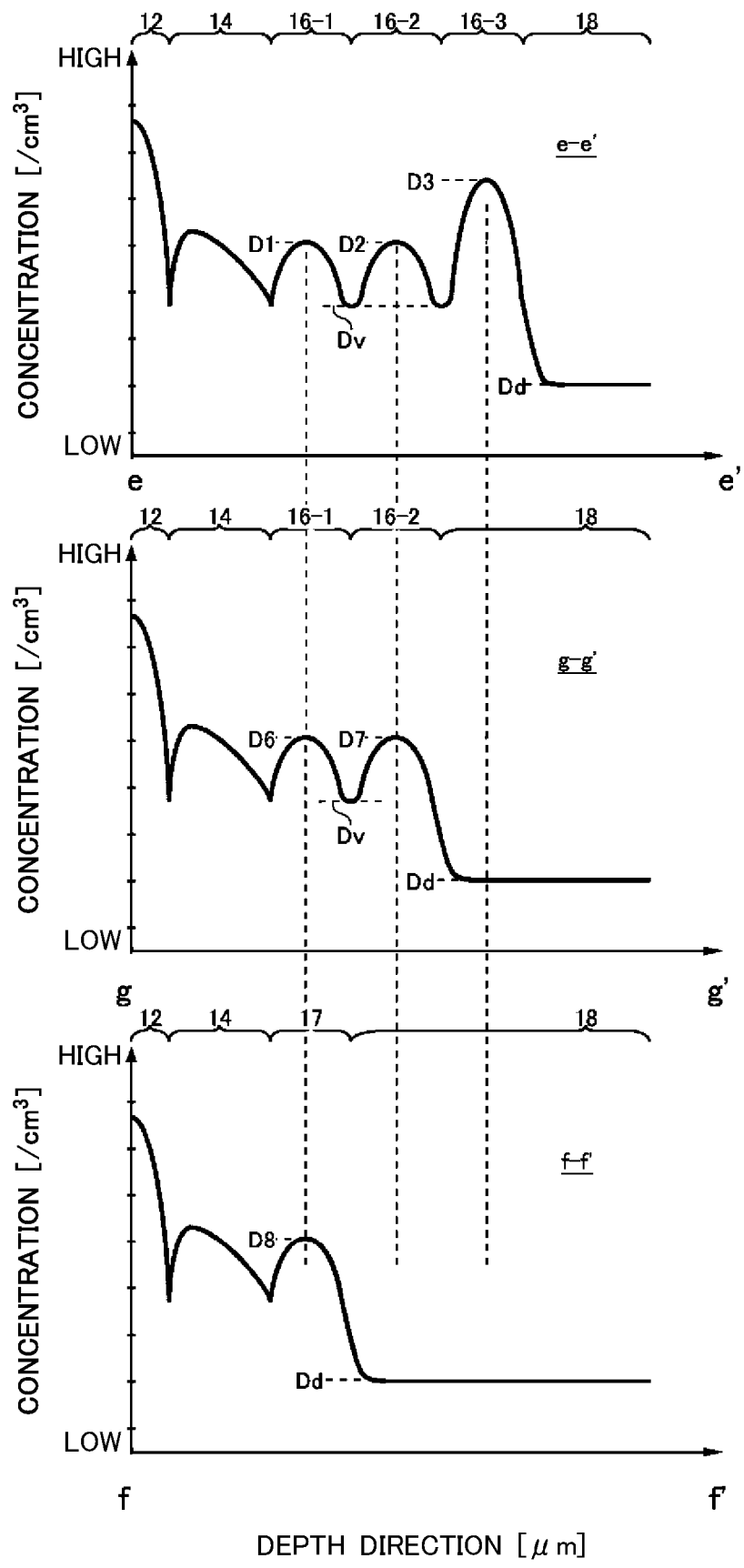

FIG. 7b is a figure showing one example of doping concentration distributions in a cross-section taken along e-e', cross-section taken along f-f' and cross-section taken along g-g' in FIG. 7a. The cross-section taken along e-e' is a cross-section along the mesa portion 95-2, the cross-section taken along f-f' is a cross-section along the mesa portion 95-3, and the cross-section taken along g-g' is a cross-section along the mesa portion 95-1.

In the present example, the number of the accumulation regions 16 in the mesa portion 95-1 at an end of the transistor portion 70 is smaller than the number of the accumulation regions 16 in the other mesa portion 95-2 of the transistor portion 70. Also, the number of the high concentration regions 17 in the diode portion 80 is smaller than the number of the accumulation regions 16 in the mesa portion 95-1. With such a configuration, the integrated concentration in each mesa portion 95 can be regulated readily.

In the present example, each accumulation region 16 in the mesa portion 95-1 is provided at the same depth position as any of the accumulation regions 16 in the mesa portion 95-2. Accumulation regions 16 formed at the same depth have the same doping concentrations. An accumulation region 16 corresponding to a third accumulation region 16-3 having the highest doping concentration among accumulation regions 16 provided at the mesa portion 95-2 is not formed in the mesa portion 95-1 in the example in FIG. 7b. In another example, an accumulation region 16 corresponding to the third accumulation region 16-3 having the highest doping concentration may be formed in the mesa portion 95-1. In this case, an accumulation region 16 corresponding to a first accumulation region 16-1 or a second accumulation region 16-2 is not formed in the mesa portion 95-1.

A high concentration region 17 in the mesa portion 95-3 is provided at the same depth position as any of the accumulation regions 16 in the mesa portion 95-1. In the present example, it is provided at the same depth position as the first accumulation region 16-1.

High concentration N-type regions formed at the same depth position in the mesa portion 95-1, the mesa portion 95-2 and the mesa portion 95-3 may have the same doping concentrations. In the example in FIG. 7b, D1=D6=D8, and D2=D7. With such a configuration, manufacturing steps can be simplified.

The doping concentration distribution of high concentration N-type regions in each mesa portion 95 is not limited by the example shown in FIG. 7b. For example, a single high concentration N-type region may be formed in each of the mesa portion 95-1 and the mesa portion 95-3. In this case, the doping concentration of the high concentration N-type regions in the mesa portion 95-1 is higher than the doping concentration of a high concentration N-type region in the mesa portion 95-3.

Figure 8:
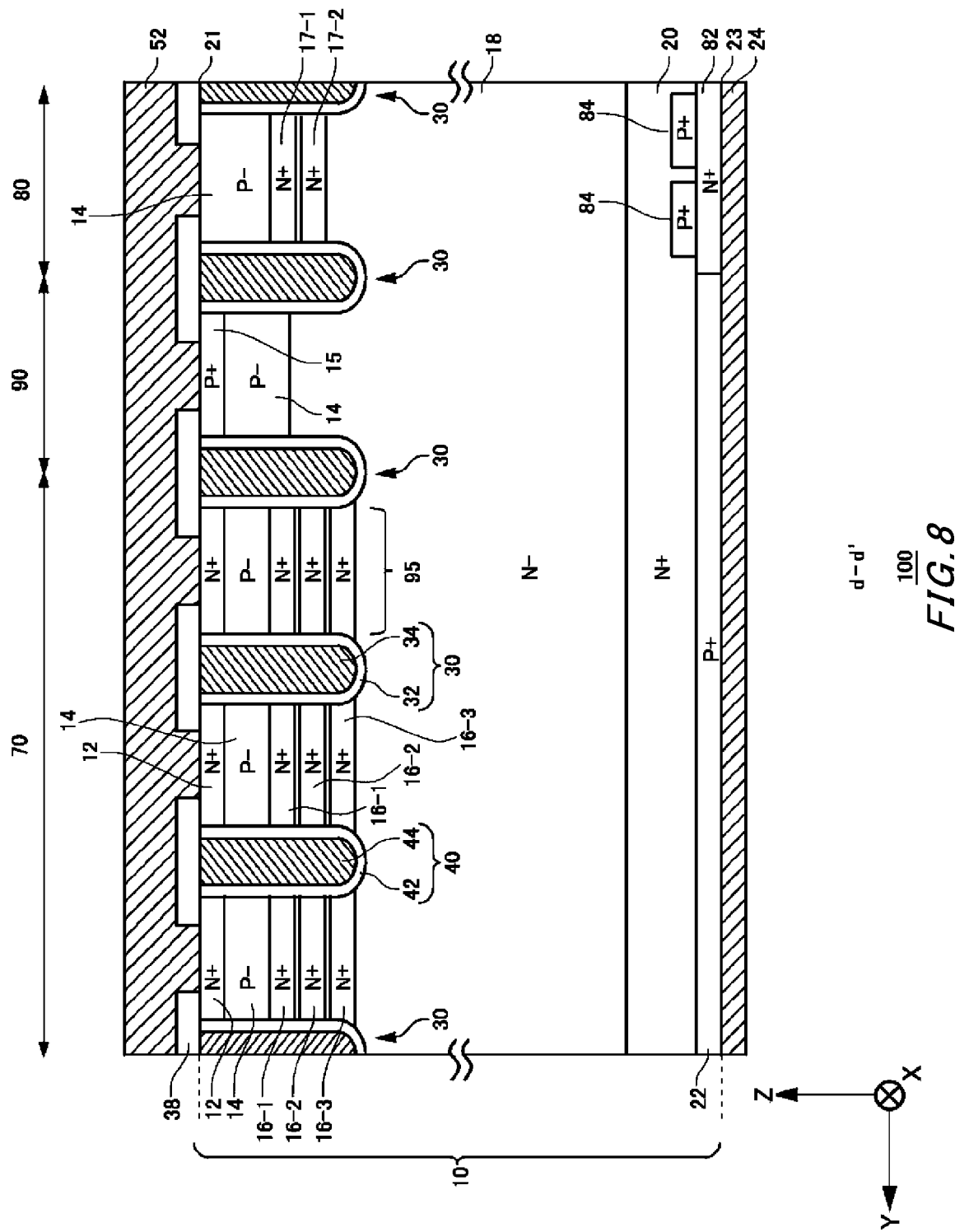
FIG. 8 is a figure showing another example of the cross-section taken along d-d' in FIG. 1.

FIG. 8 is a figure showing another example of the cross-section taken along d-d' in FIG. 1. The semiconductor device 100 in the present example further includes floating regions 84 in the configuration of any of the semiconductor devices 100 explained with reference to FIG. 2a to FIG. 7b. The floating regions 84 are provided to the lower surface 23 side in the diode portion 80. The lower surface 23 side in the present example refers to a region between the middle of the semiconductor substrate 10 in the depth direction and the upper end of the cathode region 82. The floating regions 84 in the present example are formed contacting the upper end of the cathode region 82.

The floating regions 84 are second conductivity-type (P+ in the present example) regions which are in an electrically floating state. An electrically floating state refers to a state where it is electrically connected to none of the collector electrode 24 and the emitter electrode 52. By providing the floating regions 84, implantation of electrons from the cathode region 82 can be suppressed. Thereby, the carrier distribution in the depth direction of the semiconductor substrate 10 can be regulated even without forming a lifetime killer on the rear surface side of the semiconductor substrate 10. Because of this, the cost can be reduced, and also leakage current due to the lifetime killer can be lowered.

The floating regions 84 are formed so as to cover the cathode region 82 partially. That is, part of the cathode region 82 is not covered by the floating regions 84. Thereby, the diode portion 80 can operate as a diode even if the floating regions 84 are provided. In order to suppress implantation of electrons, the floating regions 84 may be formed covering a range greater than half of the upper surface of the cathode region 82.

Figure 9:
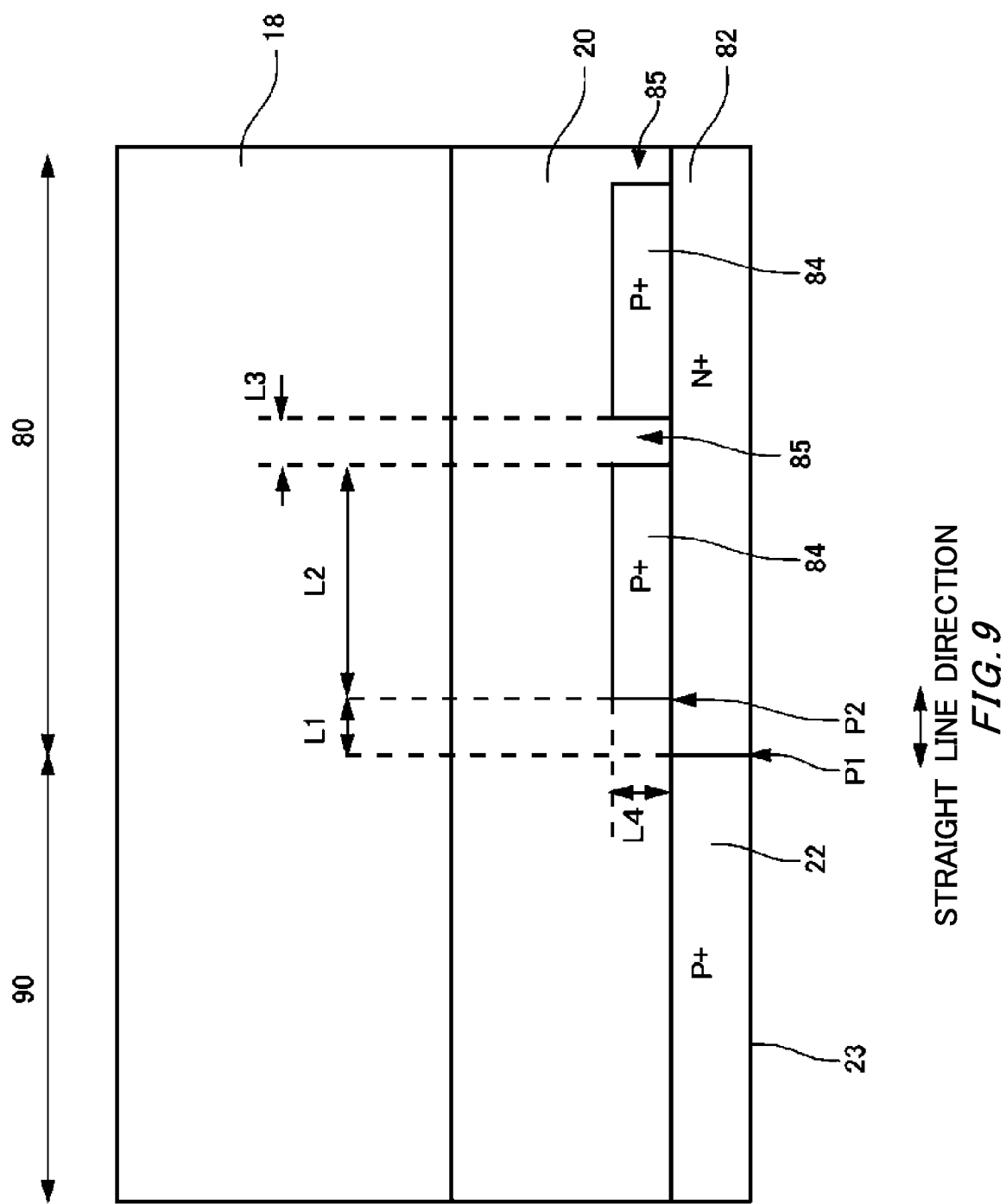
FIG. 9 is a cross-sectional view for explaining an arrangement example of a floating region 84.

FIG. 9 is a cross-sectional view for explaining an arrangement example of the floating regions 84. FIG. 9 shows an enlarged view of the proximity of the floating regions 84. In FIG. 9, the collector electrode 24 is omitted. Although the boundary portion 90 is provided adjoining the diode portion 80 in FIG. 9, in another example, the transistor portion 70 may be provided adjoining the diode portion 80.

In the present example, within a plane parallel with the lower surface 23, the boundary position between the collector region 22 and the cathode region 82 is assumed as P1. In FIG. 9, the boundary position in a cross-section parallel with the cross-section taken along d-d' is assumed as P1. As one example, the cross-section taken along d-d' is a plane perpendicular to the lower surface 23 and is parallel with the array direction of respective trench portions.

Also, an end portion position of the floating regions 84 within the plane parallel with the lower surface 23 is assumed as P2. The end portion position P2 is an end portion position closest to the boundary position P1 among end portion positions of the floating regions 84. The distance from the boundary position P1 to the end portion position P2 within the plane parallel with the lower surface 23 is assumed as L1. The distance L1 may be a distance L1 in a cross-section parallel with the cross-section taken along d-d'.

Also, the width of a floating region 84 within the plane parallel with the lower surface 23 is assumed as L2. The width L2 of a floating region 84 is the width of the floating region 84 in a straight line direction linking the boundary position P1 and the end portion position P2. The straight line direction may be a direction parallel with the array direction of the trench portions.

In the present example, the distance L1 from the boundary position P1 to the end portion position P2 is shorter than the width L2 of a floating region 84. The distance L1 may be half of the width L2 or shorter, or ¼ of the width L2 or shorter. The distance L1 may be longer than 0. That is, the floating region 84 may not be continuous with the collector region 22. In another example, the floating region 84 may be formed extending to above the collector region 22.

If in the cross-section, a plurality of the floating regions 84 are provided, the width L2 of the floating regions 84 used may be the average value of the widths of the plurality of the floating regions 84. By reducing the distance L1, implantation of electrons from the cathode region 82 can be suppressed at an end portion of the diode portion 80.

Also, the diode portion 80 has an opening region 85 not provided with a floating region 84 at the same depth position as the floating regions 84. The opening region 85 may refer to a region sandwiched by the floating regions 84. As one example, the opening region 85 is an N-type region. The doping concentration of the opening region 85 may be the same as the doping concentration of the drift region 18 or buffer region 20. The opening region 85 may be part of the drift region 18 or buffer region 20 that is left free of floating regions 84 being formed therein.

In the present example, the width of the opening region 85 in the above-mentioned straight line direction is assumed as L3. The distance L1 from the boundary position P1 to the end portion position P2 may be shorter than the width L3 of the opening region 85. The distance L1 may be half of the width L3 or shorter, or ¼ of the width L3 or shorter. Also, the width L2 may be twice, three times or five times the width L3, or greater.

If in the cross-section, a plurality of the opening regions 85 are provided, the width L3 of the opening regions 85 used may be the average value of the widths of the plurality of the opening regions 85. By reducing the distance L1, implantation of electrons from the cathode region 82 can be suppressed at an end portion of the diode portion 80.

Also, the length of the floating regions 84 in the depth direction is assumed as L4. The depth direction refers to a direction perpendicular to the lower surface 23. The distance L1 from the boundary position P1 to the end portion position P2 may be longer than the length L4 of the floating regions 84 in the depth direction. The distance L1 may be twice or three times the length L4 or longer. L4 may be 1 µm or shorter, or 0.75 µm or shorter. Also, the doping concentration distribution of a floating region 84 in at least one of the depth direction of the semiconductor substrate 10 and the direction parallel with the lower surface 23 may be a Gaussian distribution or a distribution that resembles it. The peak concentration of the floating region 84 may be $5 \times 10^{16}/\text{cm}^3$ or higher and $1 \times 10^{18}/\text{cm}^3$ or lower, and is $3 \times 10^{17}/\text{cm}^3$ in the present example.

Figure 10:
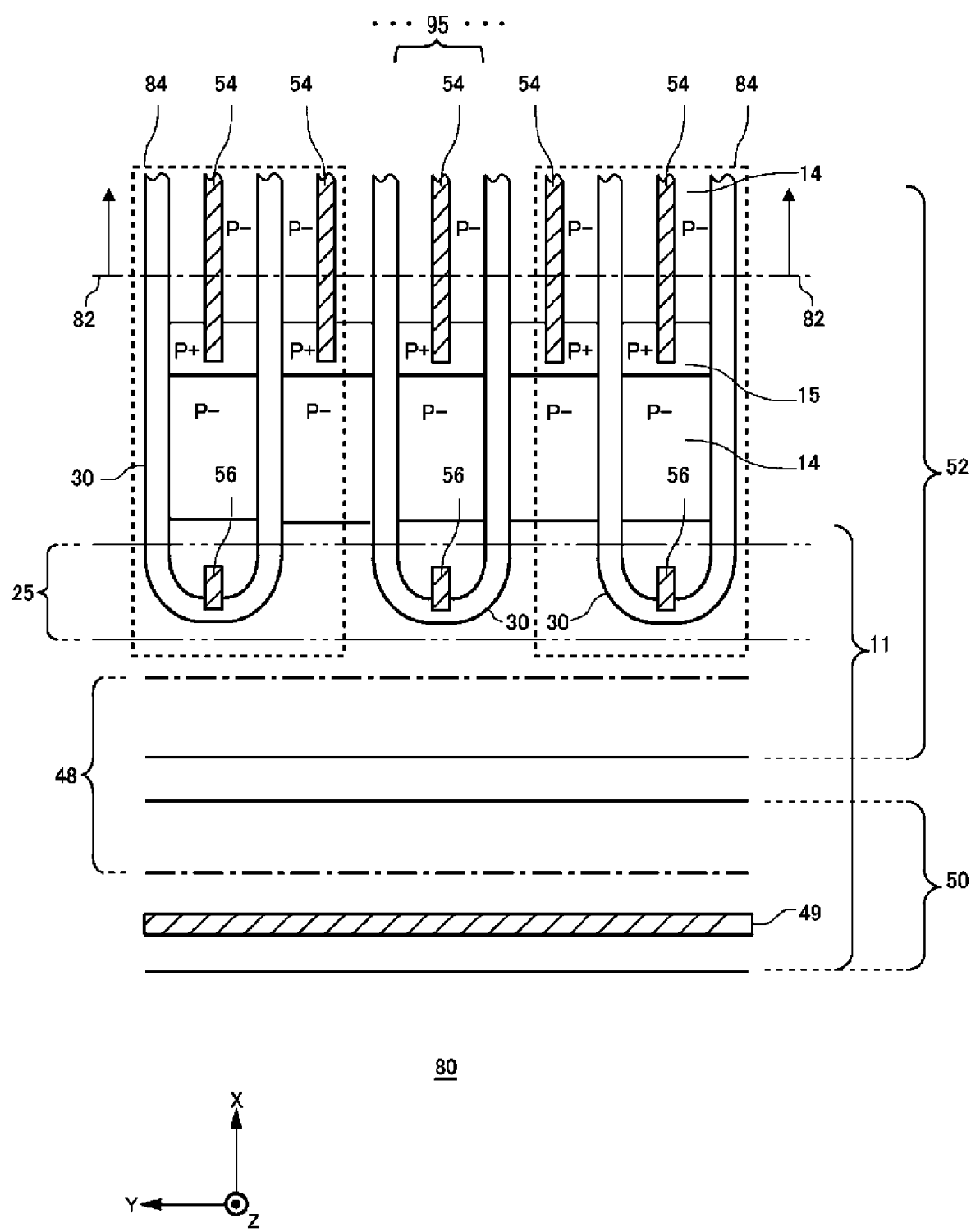
FIG. 10 is a plan view showing an arrangement example of the floating region 84 in a diode portion 80.

FIG. 10 is a plan view showing an arrangement example in a case where floating regions 84 in the diode portion 80 are imaginarily projected onto the upper surface 21 of the semiconductor substrate 10 from the lower surface 23 side of the semiconductor substrate 10. The floating regions 84 are, on the upper surface 21 of the semiconductor substrate 10, arranged in regions provided with dummy trench portion 30. The floating regions 84 in the present example are arranged, in the X-axis direction, up to positions beyond the positions of ends of the dummy trench portions 30 in their longitudinal direction (extending direction) or the positions of a connection 25 at which the dummy trench portions 30 electrically connect with the emitter electrode 52. The floating regions 84 in the present example do not reach positions to overlap the gate runner 48 or the gate metal layer 50. End portions of the floating regions 84 in the extending direction of trench portions may be provided at positions overlapping the well region 11.

The cathode region 82 in the present example is positioned on the inner side (located in the +X-axis direction) relative to the contact regions 15 formed at ends of contact holes 54. End portions of the floating regions 84 in the extending direction of the dummy trench portions 30 are positioned on the outer circumference side (located in the −X-axis direction) relative to ends of the contact holes 54 in the X-axis direction.

Figure 11:
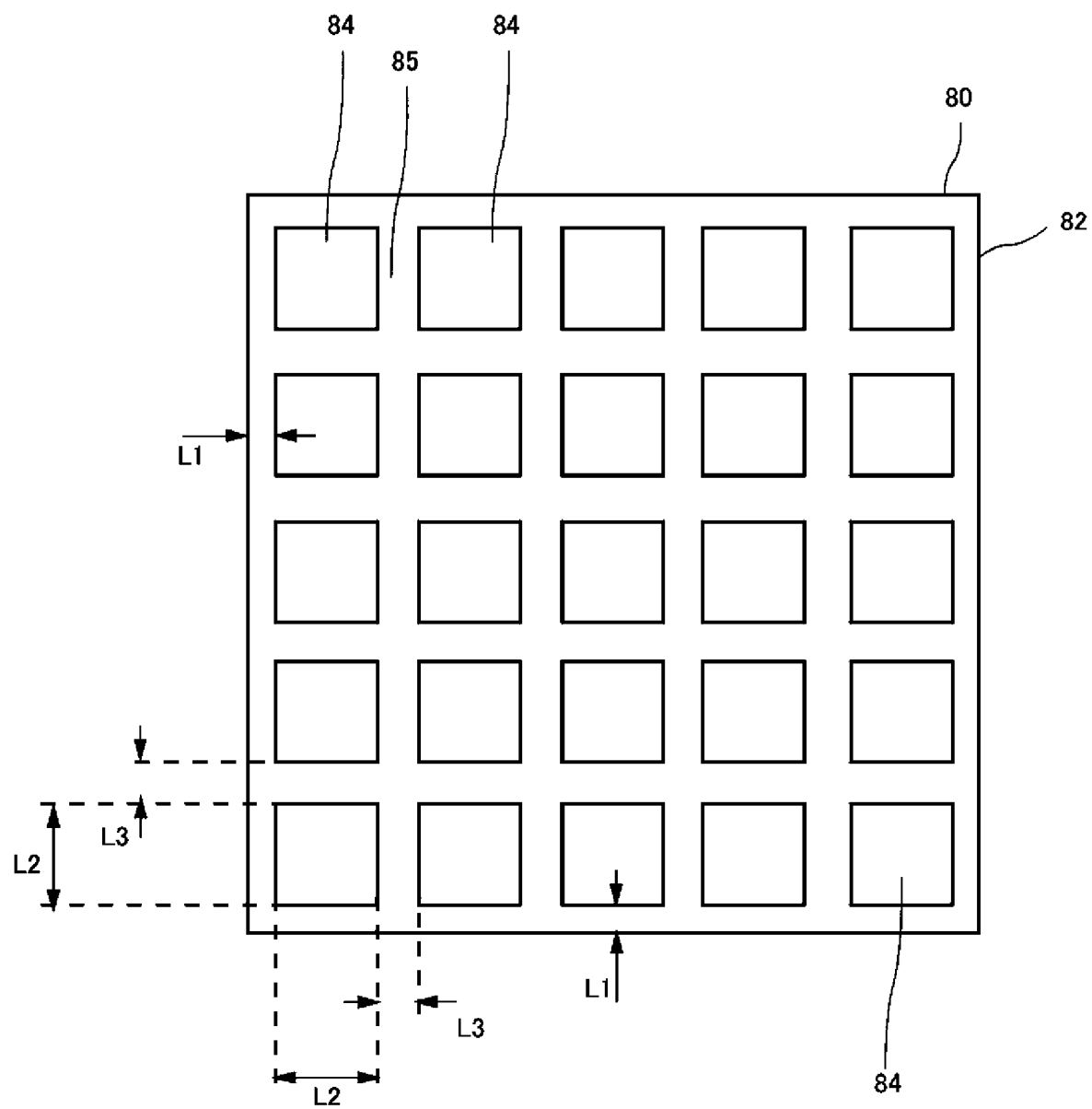
FIG. 11 is a plan view showing an arrangement example of the floating region 84 in the diode portion 80.

FIG. 11 is a plan view showing an arrangement example of floating regions 84 in the diode portion 80. While FIG. 10 shows part of the diode portion 80, FIG. 11 shows the entire region of the diode portion 80 where dummy trench portions 30 are provided. The diode portion 80 may be assumed as a region where the cathode region 82 is formed.

In the present example, on the upper surface of the semiconductor substrate 10, a plurality of floating regions 84 are arranged discretely. Opening region 85 are arranged between respective floating regions 84. The respective opening regions 85 may be connected to each other. On the upper surface of the semiconductor substrate 10, the area ratio of the floating regions 84 to the total area of the floating regions 84 and the opening regions 85 may be 80%, 90% or 95% or higher. The distance L2 of a floating region 84 may be 5 µm or longer and 1000 µm or shorter, and is 720 µm in the present example. The distance L3 of an opening region 85 between adjoining floating regions 84 may be 1 µm or longer and 200 µm or shorter, and is 180 µm in the present example.

Figure 12:
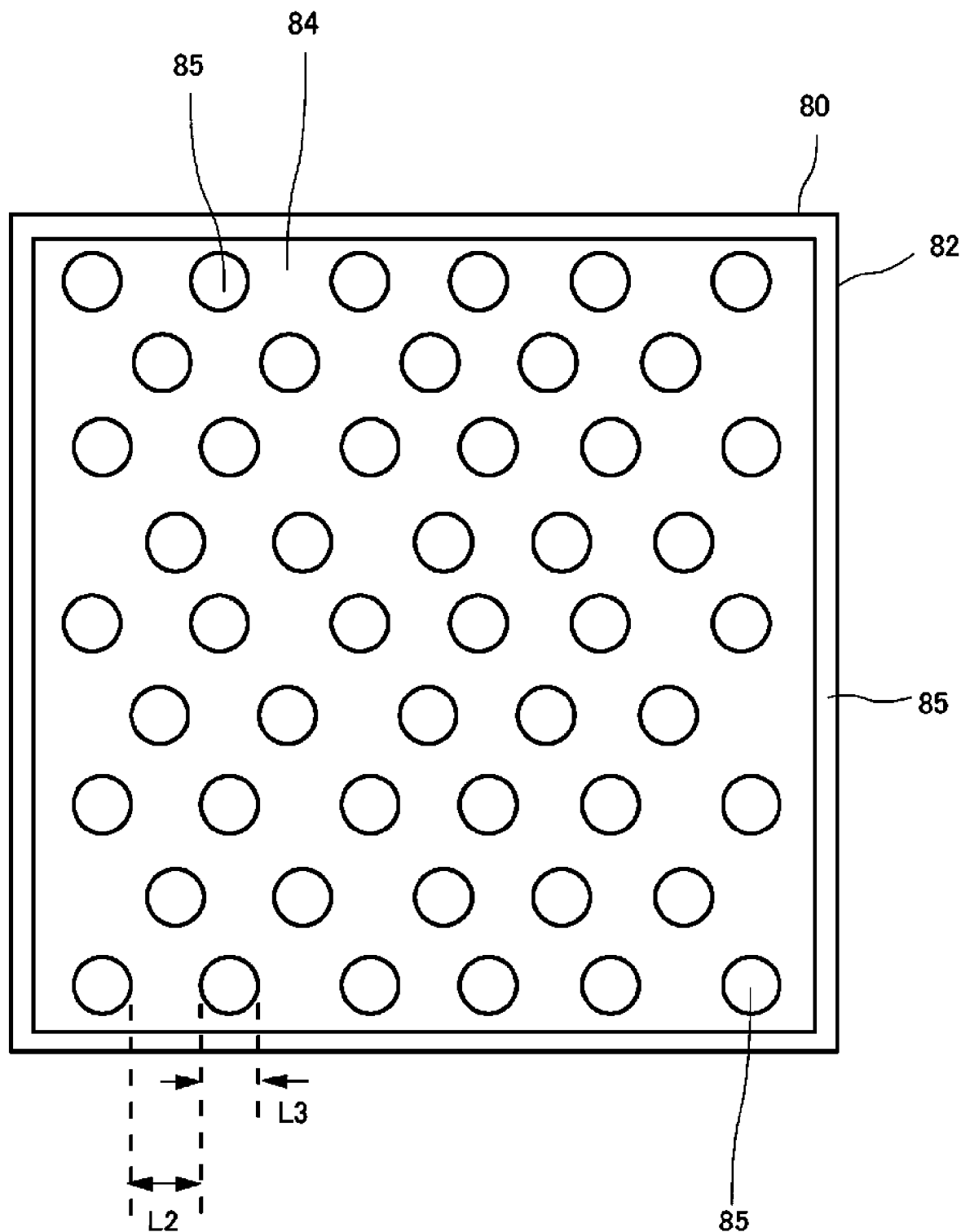
FIG. 12 is a plan view showing another arrangement example of the floating region 84 in the diode portion 80.

FIG. 12 is a plan view showing another arrangement example of floating regions 84 in the diode portion 80. In the present example, on the upper surface of the semiconductor substrate 10, a plurality of opening regions 85 are arranged discretely. Floating regions 84 are arranged between the respective opening regions 85. The respective floating regions 84 may be connected to each other. The diode portion 80 may be assumed as a region where the cathode region 82 is formed.

On the upper surface of the semiconductor substrate 10, the area ratio of the floating regions 84 to the total area of the floating regions 84 and the opening regions 85 may be 80%, 90% or 95% or higher. The distance L2 of a floating region 84 may be 5 µm or longer and 1000 µm or shorter, and is 720 µm in the present example. The distance L3 of an opening region 85 between adjoining floating regions 84 may be 1 µm or longer and 200 µm or shorter, and is 180 µm in the present example.

Figure 13:
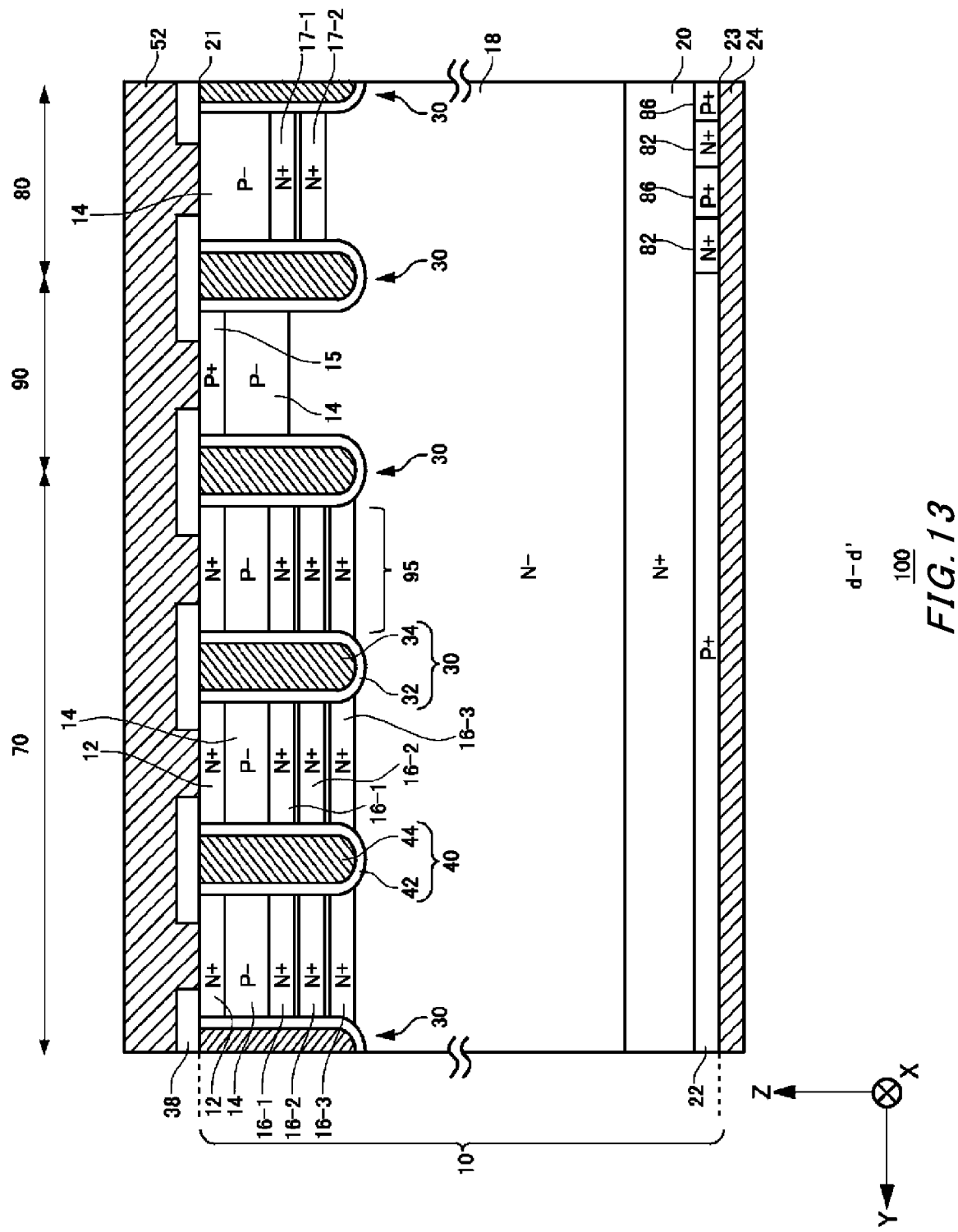
FIG. 13 is a figure showing another example of the cross-section taken along d-d' in FIG. 1.

FIG. 13 is a figure showing another example of the cross-section taken along d-d' in FIG. 1. The semiconductor device 100 in the present example further includes, in the configuration of any of the semiconductor devices 100 shown in FIG. 2a to FIG. 7b, second conductivity-type (P+ in the present example) dummy regions 86. On the lower surface 23 of the diode portion 80, the dummy regions 86 and the cathode regions 82 are provided so as to be exposed alternately. The dummy regions 86 may be electrically connected with the collector electrode 24.

With such a configuration also, implantation of electrons from the cathode region 82 can be suppressed. The area on the lower surface 23 where the dummy regions 86 are formed may be greater than the area where the cathode regions 82 are formed.

Figure 14:
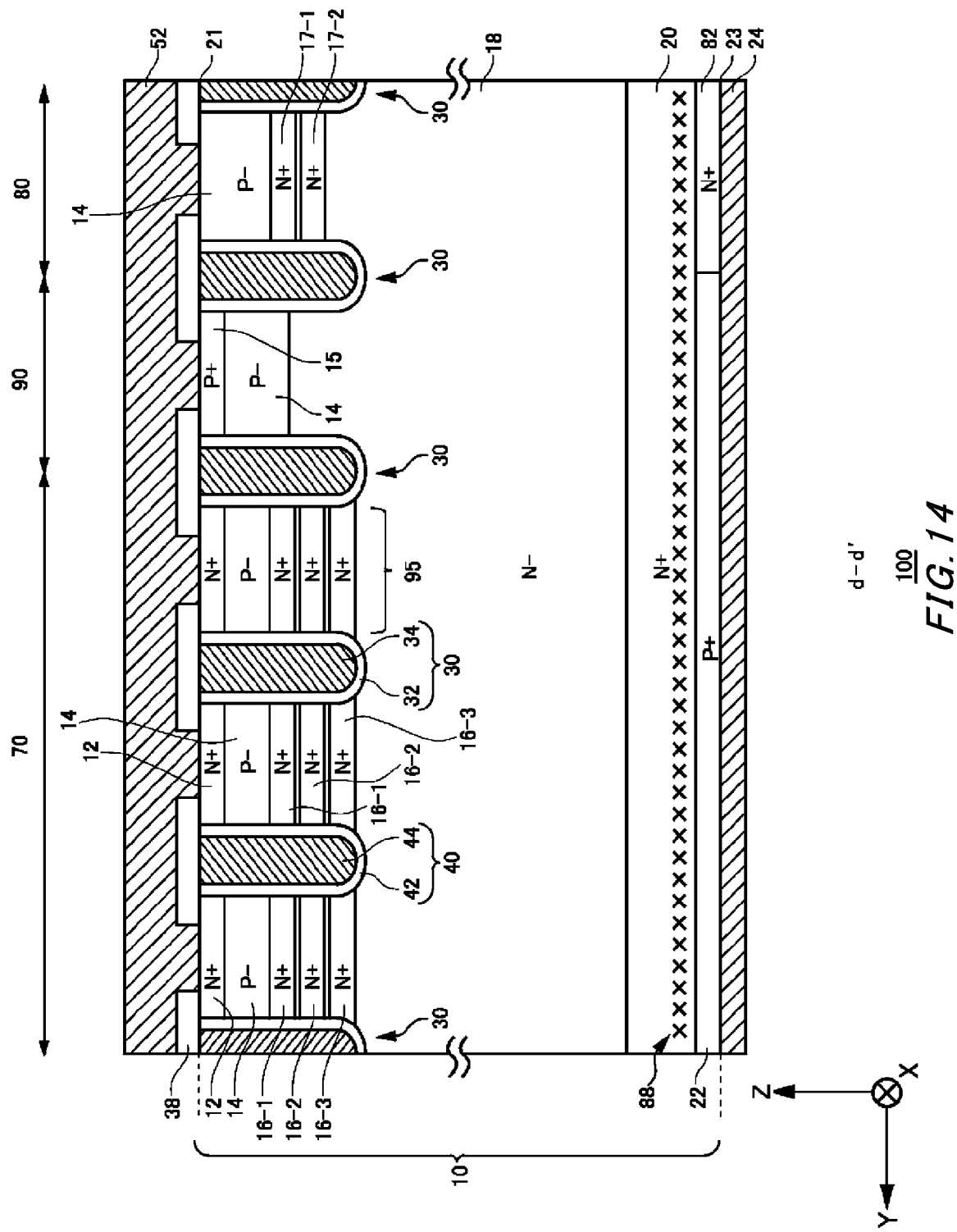
FIG. 14 is a figure showing another example of the cross-section taken along d-d' in FIG. 1.

FIG. 14 is a figure showing another example of the cross-section taken along d-d' in FIG. 1. The semiconductor device 100 in the present example further includes the lifetime killer 88 in the configuration of any of the semiconductor devices 100 shown in FIG. 2a to FIG. 7b. The lifetime killer 88 is formed on the lower surface 23 side. The lower surface 23 side in the present example refers to a region between the middle of the semiconductor substrate 10 in the depth direction and the lower surface 23.

Also, the lifetime killer 88 is formed locally in the depth direction of the semiconductor substrate 10. That is, a region where the lifetime killer 88 is formed has a defect density higher than those in other regions of the semiconductor substrate 10. The lifetime killer 88 in the present example is helium implanted to a predetermined depth position. By implanting helium, crystal defects can be formed in the semiconductor substrate 10. The lifetime killer 88 may be formed over the entire surfaces of the transistor portion 70, the diode portion 80 and the boundary portion 90.

The upper surface 21 side may not be provided with a local lifetime killer. The upper surface 21 side in the present example refers to a region between the middle of the semiconductor substrate 10 in the depth direction and a bottom portion position of the trench portion. In the present example, a region where a helium concentration (or crystal defect density) is locally high is not formed on the upper surface 21 side.

Because as mentioned above, the semiconductor device 100 is provided with high concentration N-type regions in respective mesa portions 95 of the transistor portion 70 and the diode portion 80, a crystal defect layer formed of a lifetime killer is not formed on the upper surface 21 side, or alternatively, the crystal defect density of a crystal defect layer can be lowered, so the implantation efficiency of minority carriers of the diode portion 80 can be regulated. Because of this, the cost for forming a lifetime killer can be reduced, and also leakage current due to the lifetime killer and the like can be suppressed.

The lower surface 23 side may not have a local lifetime killer formed therein. In this case, the lower surface 23 side preferably has a structure as shown in FIG. 8 or FIG. 13. Thereby, the cost for forming a lifetime killer can be further reduced, and also leakage current due to the lifetime killer and the like can be further suppressed.

Figure 15:
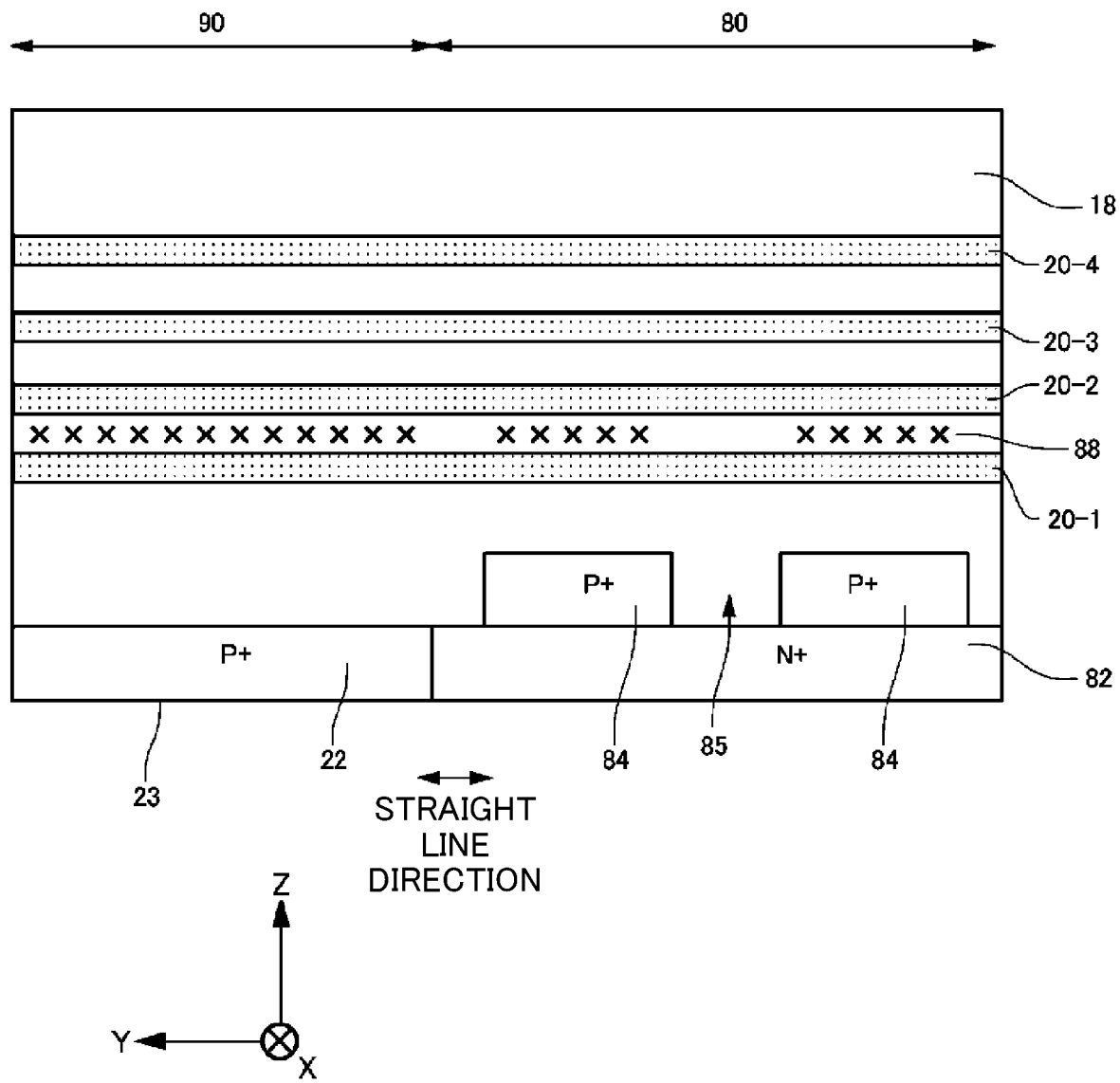
FIG. 15 is a figure showing another arrangement example of a lifetime killer 88.

FIG. 15 is a figure showing another arrangement example of the lifetime killer 88. The diode portion 80 in the present example is provided with floating regions 84 and an opening region 85. In the present example, at least a partial region above the floating regions 84 is provided with the lifetime killer 88, and at least a partial region above the opening region 85 is not provided with the lifetime killer 88. Thereby, the lifetime of carriers implanted from the floating regions 84 can be regulated. Also, above the opening region 85, the density of defects due to implantation of the lifetime killer can be lowered.

The lifetime killer 88 may be provided over the entire region above the floating regions 84. Also, the lifetime killer 88 may not be provided over the entire region above the opening region 85.

The semiconductor device 100 in the present example has a plurality of the buffer regions 20 that are located at different positions in the depth direction. The plurality of buffer regions 20 can be formed by implanting impurities such as proton multiple times with varied stopping ranges. FIG. 15 shows peak positions of doping concentrations of the respective buffer regions 20 in the depth direction. The doping concentrations between the respective buffer regions 20 may be higher than the doping concentration of the drift region 18.

Also, in FIG. 15, the peak positions of the concentration of the lifetime killer 88 in the depth direction are indicated with x. The peak positions of the lifetime killer 88 are preferably different from the peak positions of the buffer regions 20. Thereby, termination of defects in the lifetime killer 88 by proton in the buffer regions 20 can be suppressed. The peak positions of the concentrations of the lifetime killer 88 may be arranged between the peak positions of the doping concentrations of two buffer regions 20.

Figure 16:
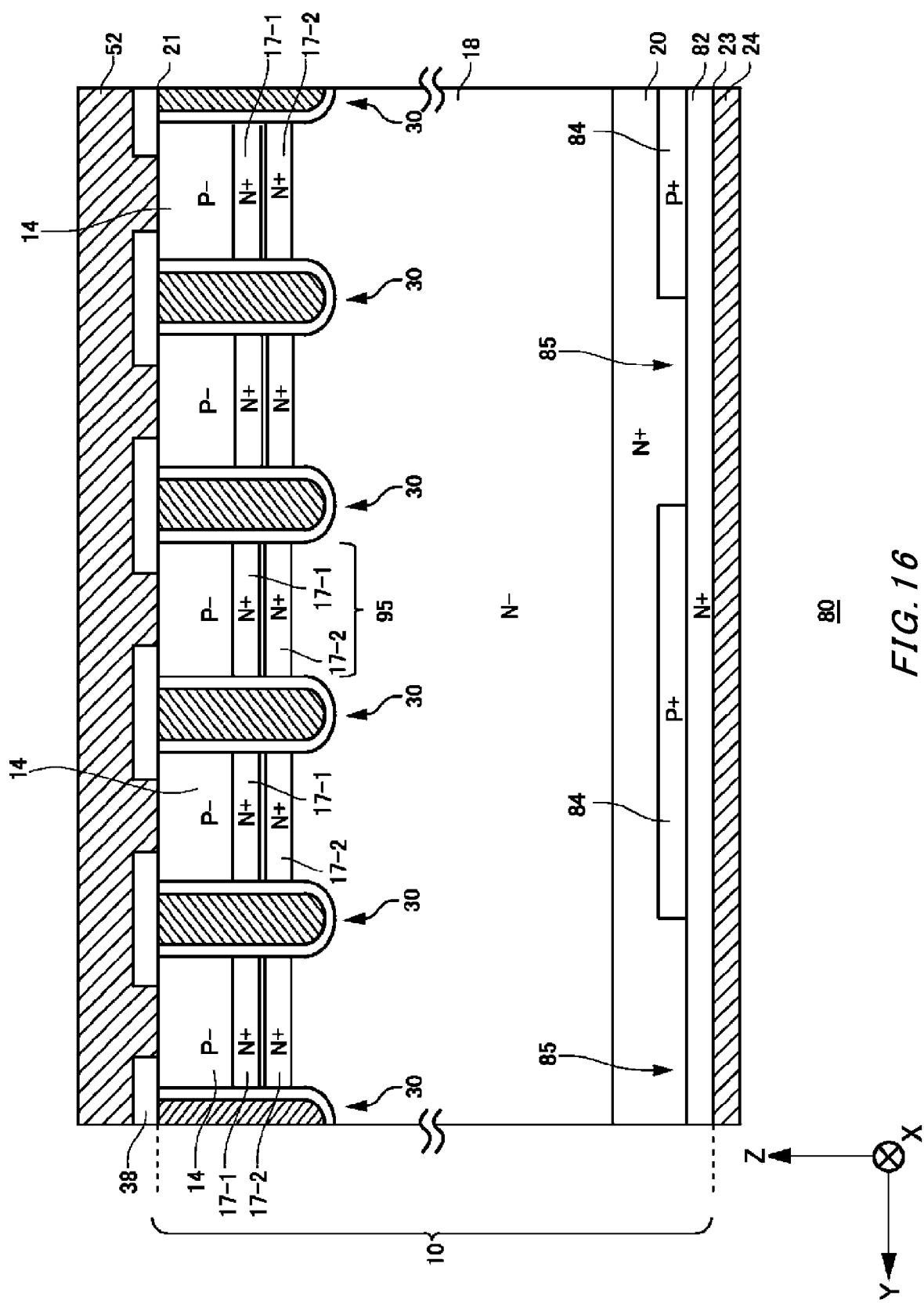
FIG. 16 is a figure showing one example of the configuration of the diode portion 80.

FIG. 16 is a figure showing one example of the configuration of the diode portion 80. The diode portion 80 in the present example is provided with two or more high concentration regions 17 at each mesa portion 95. As one example, each mesa portion 95 may be provided with two high concentration regions 17.

Also, the structure of the lower surface 23 side may be the same as the structure of any of the diode portions 80 shown in FIG. 1 to FIG. 15. The diode portion 80 of the example in FIG. 16 has floating regions 84 and opening regions 85 similar to the example shown in FIG. 8.

With reference to FIG. 1 to FIG. 15, the semiconductor device 100 including the transistor portion 70, the boundary portion 90 and the diode portion 80 has been explained. In another example, the semiconductor device 100 may include only the diode portion 80.

Figure 17:
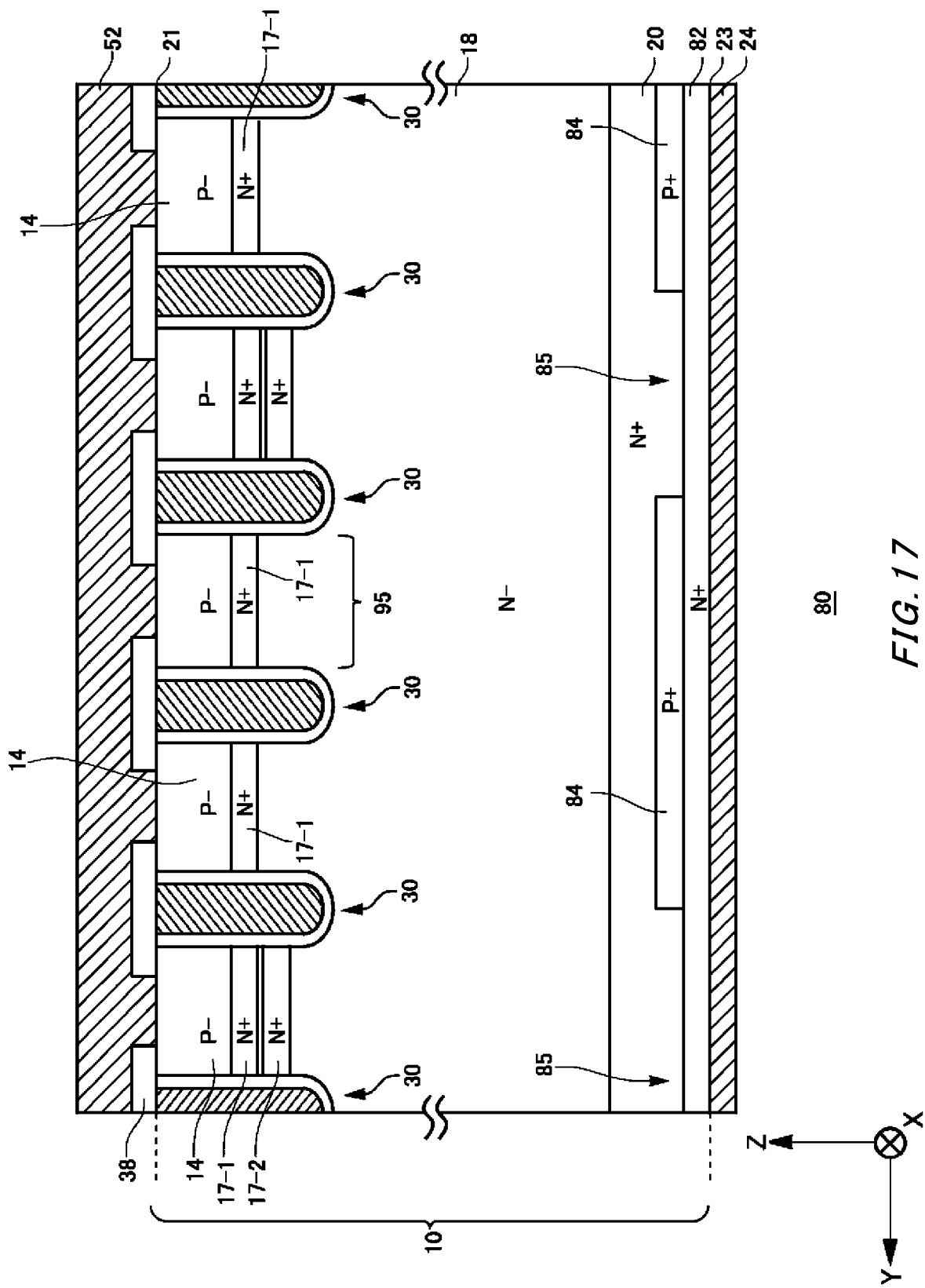
FIG. 17 is a figure showing another example of the configuration of the diode portion 80.

FIG. 17 is a figure showing another example of the configuration of the diode portion 80. The diode portion 80 in the present example is the same as the diode portion 80 shown in FIG. 16 in respects other than the arrangement of high concentration regions 17. In the present example, the integrated concentration of high concentration regions 17 in at least one mesa portion 95 among mesa portions 95 arranged above floating regions 84 is lower than the integrated concentration of high concentration regions 17 in at least one mesa portion 95 among mesa portions 95 arranged above opening regions 85. As one example, a mesa portion 95 entirely arranged above a floating region 84 has an integrated concentration of high concentration regions 17 lower than that of a mesa portion 95 entirely arranged above an opening region 85.

In the example in FIG. 17, the number of high concentration regions 17 arranged in the depth direction in a mesa portion 95 arranged above a floating region 84 is smaller than the number of high concentration regions arranged in the depth direction in a mesa portion 95 arranged above an opening region 85. With such a structure, differences in diode characteristics can be made small between a portion provided with a floating region 84 and a portion provided with an opening region 85.

Figure 18:
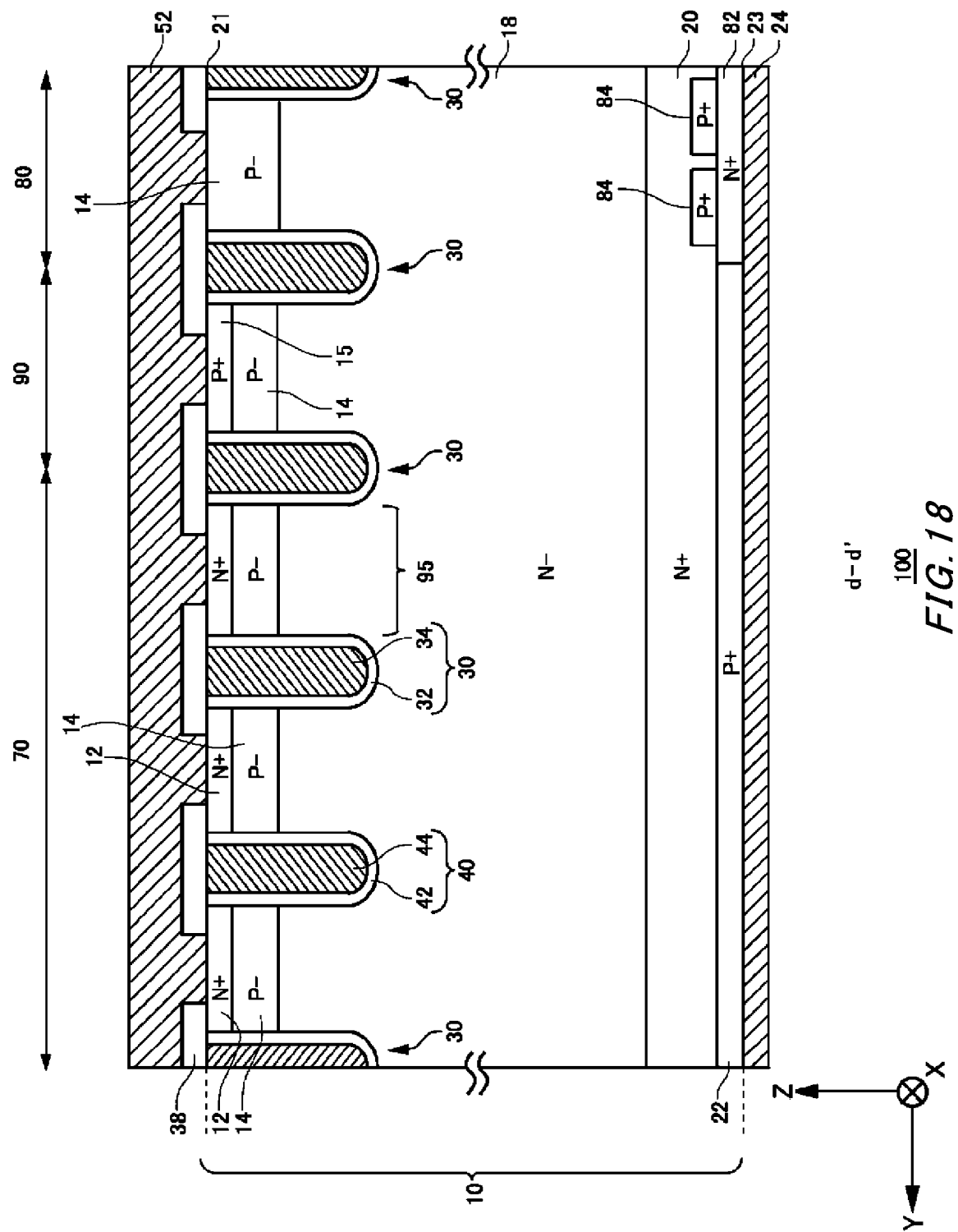
FIG. 18 is a figure showing another example of the semiconductor device 100.

FIG. 18 is a figure showing another example of the semiconductor device 100. The semiconductor device 100 in the present example includes floating regions 84, but does not include an accumulation region 16 and a high concentration region 17. In other respects, it has the same structure as those of the semiconductor devices 100 shown in FIG. 1 to FIG. 17. At least one of the upper surface 21 side and the lower surface 23 side may be or may not be provided with a local lifetime killer. Also, the boundary portion 90 may not be provided.

Figure 19:
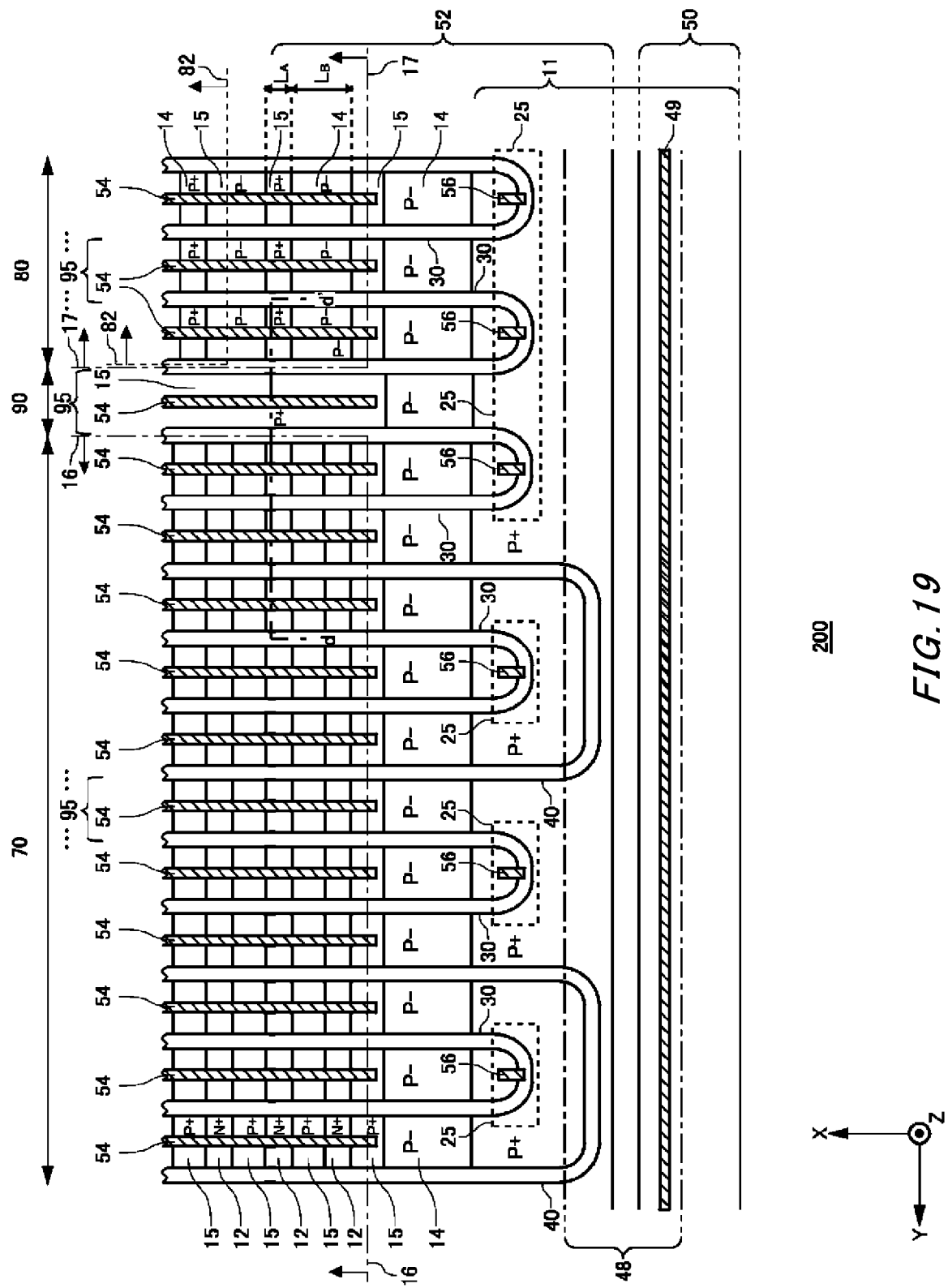
FIG. 19 is a figure showing part of the upper surface of a semiconductor device 200 according to another embodiment of the present invention.

FIG. 19 is a figure showing part of the upper surface of a semiconductor device 200 according to another embodiment of the present invention. The semiconductor device 200 in the present example is different from the semiconductor device 100 shown in FIG. 1 in that base regions 14 and contact regions 15 on the upper surface of the diode portion 80 are provided adjoining alternately such that they are exposed to the upper surfaces of mesa portions 95 along the extending direction of trench portions. As one example, the width of a base region 14 in the trench portion extending direction may be provided greater than the width of a contact region 15 in the trench portion extending direction.

In the diode portion 80, assuming the length of a contact region 15 along the extending direction of trench portions is $L_A$, and the length of a base region 14 along the extending direction of the trench portions is $L_B$, $L_A > L_B$ may hold true. For example, $dI_{AK}/dV_{AK}$ increases at the rate of two to three times of the rated current density, and high surge current tolerance can be ensured.

Alternatively, in the diode portion 80, assuming that the length of a contact region 15 along the extending direction of trench portions is $L_A$, and the length of a base region 14 along the extending direction of the trench portions is $L_B$, $L_A < L_B$ may hold true. For example, because $dI_{AK}/dV_{AK}$ increases at the rate of five to ten times of the rated current density, an effect of lowering reverse recovery current is maintained for reverse recovery approximately at the rated current density, and high surge current tolerance can be ensured for surge current which is five times the rated current density or greater. For example, the ratio obtained by dividing the length $L_A$ with the length $L_B$, $L_A/L_B$, may be 10% or higher and 90% or lower.

At the position corresponding to the position of an end of the cathode region 82 on the outer circumference side in the X-axis direction that imaginarily appears on the upper surface 21 when the end is imaginarily projected onto the upper surface 21, there may be a region that is sandwiched by contact regions 15 that adjoin in the X-axis direction and where contact regions 15 are not formed. Base regions 14 may be exposed to the front surface of a mesa portion 95 on the outer circumference side (−X-axis direction) relative to the position corresponding to the position of an end of the cathode region 82 on the outer circumference side in the X-axis direction that imaginarily appears on the upper surface 21 when the end is imaginarily projected onto the upper surface 21.

Figure 20:
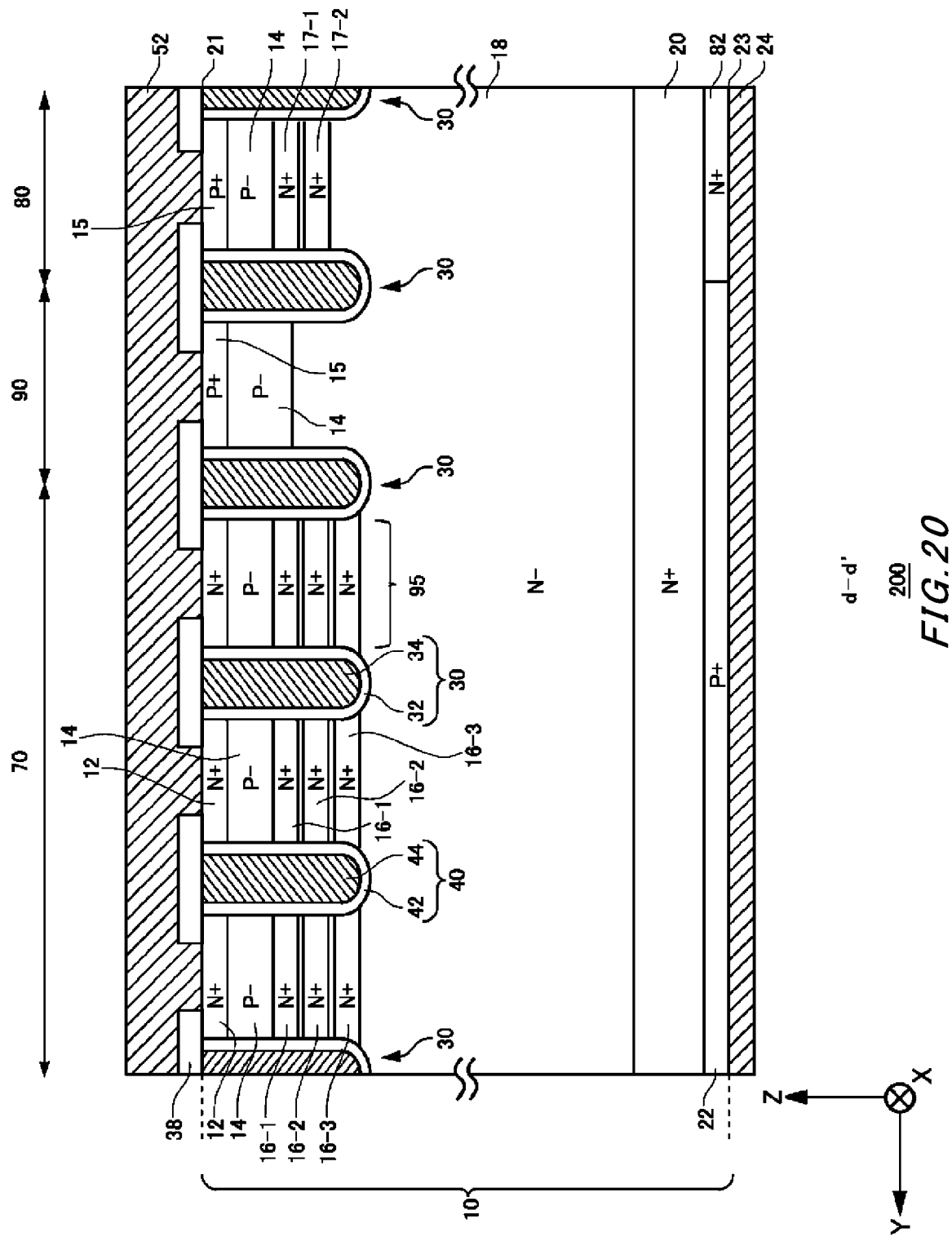
FIG. 20 is a figure showing one example of a cross-section taken along d-d' in FIG. 19.

FIG. 20 is a figure showing one example of a cross-section taken along d-d' in FIG. 19. The semiconductor device 200 in the present example is different from the semiconductor device 100 shown in FIG. 2a in that it has contact regions 15 on base regions 14 in the cross-section. By adopting, for the upper surface of the diode portion 80, an arrangement in which a base region 14 and a contact region 15 adjoin alternately, forward voltage Vf at the time of large current can be made small.

Figure 21A:
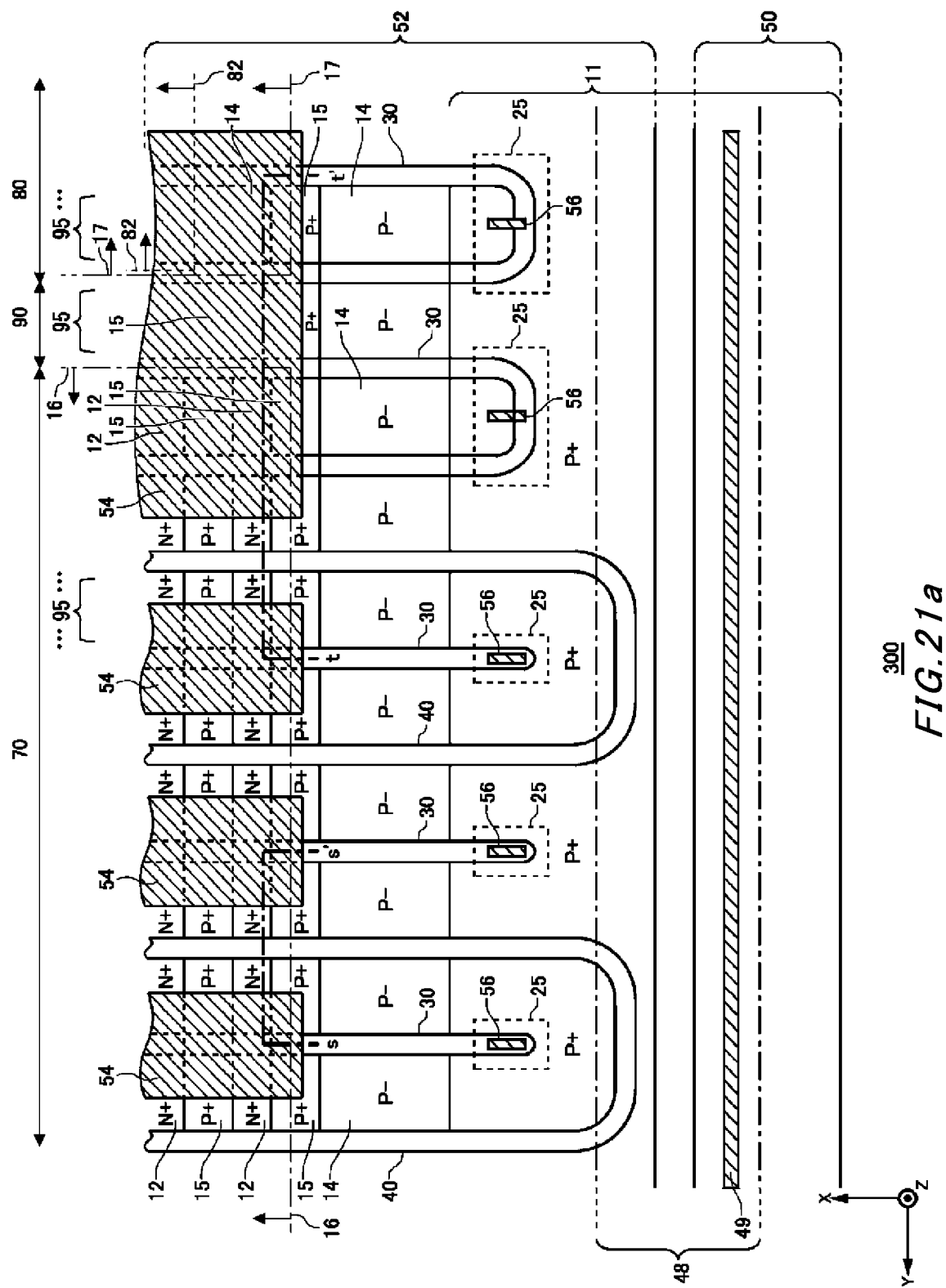
FIG. 21a is a figure showing part of the upper surface of a semiconductor device 300 according to another embodiment of the present invention.

FIG. 21a is a figure showing part of the upper surface of a semiconductor device 300 according to another embodiment of the present invention. The semiconductor device 300 in the present example is different from the semiconductor device 100 shown in FIG. 1 in that a contact hole 54 is provided in a range from the negative side in the Y-axis direction to the positive side in the Y-axis direction of a dummy trench portion 30 above the semiconductor substrate 10.

A gate trench portion 40 is not provided in a region ranging from a region of the transistor portion 70 adjoining the boundary portion 90 to the diode portion 80, but dummy trench portions 30 are provided. Because of this, in a range from the region of the transistor portion 70 adjoining the boundary portion 90 to the diode portion 80, the width of the contact hole 54 in the Y-axis direction is greater than a contact hole 54 provided to a region of the transistor portion 70 excluding the boundary portion 90.

The position of an end, in the +X-axis direction (on the inner circumference side of the semiconductor device), of a contact region 15 formed at an end of the diode portion 80 in the X-axis direction may be located in the −X-axis direction (on the outer circumference side) relative to the position corresponding to the cathode region 82 that imaginarily appears on the front surface of the semiconductor substrate 10 if the cathode region 82 is imaginarily projected onto the front surface, similar to the semiconductor device 100 shown in FIG. 1. The area of the front surface of a base region 14 of the diode portion 80 may be greater than that of the region corresponding to the cathode region 82 that imaginarily appears on the front surface of the semiconductor substrate 10 if the cathode region 82 is projected onto the front surface.

The contact hole 54 of the diode portion 80 may be formed across a plurality of mesa portions 95 and dummy trench portions 30 in the array direction of the dummy trench portions 30. By the contact hole 54 being formed across the plurality of mesa portions 95 and the dummy trench portions 30 in the diode portion 80, the area at which it contacts the emitter electrode 52 in the diode portion 80 increases. Because of this, it becomes difficult for carriers to accumulate directly below the interlayer dielectric film 38, so the minority carrier implantation efficiency can be lowered.

The contact hole 54 of the diode portion 80 may extend to the boundary portion 90. Furthermore, the contact hole 54 of the diode portion 80 may extend beyond the boundary portion 90 and to a mesa portion 95 contacting, on the diode portion 80 side, a gate trench portion 40 positioned closest to the diode portion 80 in the Y-axis direction among gate trench portions 40 of the transistor portion 70. Thereby, it is possible to facilitate extraction of accumulated carriers from a region at the boundary including the boundary portion 90 between the transistor portion 70 and the diode portion 80.

Figure 21B:
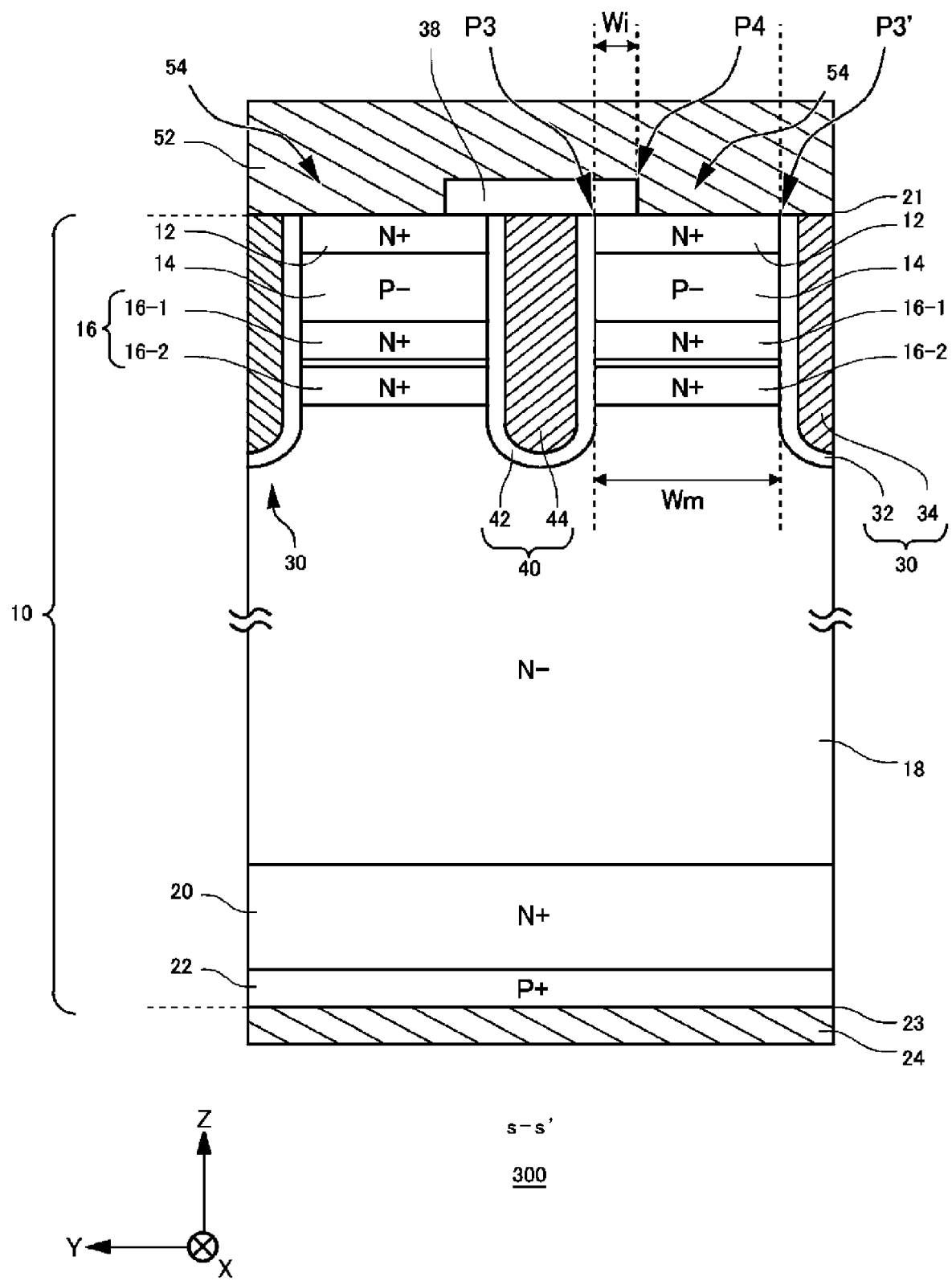

FIG. 21b is a figure showing one example of a cross-section taken along s-s' in FIG. 21a. The cross-section taken along s-s' is the YZ plane that: is in the transistor portion 70 of the semiconductor device 300 in the present example; is in a range from a dummy trench portion 30 that adjoins a gate trench portion 40 on the negative side of it in the Y-axis direction to a dummy trench portion 30 that adjoins the gate trench portion 40 on the positive side of it in the Y-axis direction; and passes through emitter regions 12.

In the cross-section taken along s-s', the semiconductor device 300 has the collector electrode 24 provided to the lower surface 23 and the emitter electrode 52 provided to the upper surface 21. Also, on the upper surface 21 side, N$^+$-type emitter regions 12, P$^−$-type base regions 14, and one or more N$^+$-type accumulation regions 16 are sequentially arranged from the upper surface 21 side. The N$^−$-type drift region 18 is formed below the accumulation regions 16. The N$^+$-type buffer region 20 is formed below the drift region 18. The P$^+$-type collector region 22 exposed to the lower surface 23 is formed below the buffer region 20.

Above the gate trench portion 40, an interlayer dielectric film 38 is provided to the upper surface 21. In the Y-axis direction, between the dummy trench portions 30 and the interlayer dielectric film 38 on the gate trench portion 40, interlayer dielectric films 38 are not provided to the upper surface 21. Also, above the dummy trench portions 30, interlayer dielectric films 38 are not provided to the upper surface 21.

In the cross-section taken along s-s', a width Wi is a width, in the Y-axis direction, from an end portion P3 of the gate trench portion 40 in the Y-axis direction to an end portion P4 of the contact hole 54. The end portion P3 is a position where a trench side wall of the gate trench portion 40 contacts the upper surface 21 on the XZ plane. The end portion P4 is a position, in a cross-section parallel with the YZ plane, of an end surface of the interlayer dielectric film 38 in the XZ plane. More specifically, the end portion P4 may be a position where the end surface of the interlayer dielectric film 38 in the XZ plane contacts the upper surface 21. If the upper surface or side surface of the interlayer dielectric film 38 is not planar, but curved, the end portion P4 may be a position where the interlayer dielectric film 38 contacts the upper surface 21.

A width Wm is a width from the end portion P3 of the gate trench portion 40 to an end portion P3', on the gate trench portion 40 side, of the dummy trench portion 30 adjoining the gate trench portion 40, that is, a mesa width. The width Wm may be 1.5 times the width Wi or greater and 3.5 times the width or smaller. The width Wm may be, as one example, 0.5 μm. The width Wi may be, as one example, 0.2 μm.

A width from the end portion P4 to the end portion P3' of the dummy trench portion 30 adjoining the gate trench portion 40 may be greater than the width Wi. With the width from the end portion P4 to the end portion P3' being greater than the width Wi, it is possible to facilitate extraction of carriers of the transistor portion 70 especially at the time of turn-off. Also, latch-ups of the transistor portion 70 are suppressed.

Alternatively, the width from the end portion P4 to the end portion P3' of the dummy trench portion 30 adjoining the gate trench portion 40 may be smaller than the width Wi. With the width from the end portion P4 to the end portion P3' being smaller than the width Wi, it is possible to facilitate increase in the carrier concentration around the gate trench portion 40. Because of this, this leads to reduction of on-state voltage of the transistor portion 70.

The semiconductor device 300 in the present example is not provided with interlayer dielectric films 38 above the dummy trench portions 30 and above regions of the semiconductor substrate 10 on the positive side and negative side of the dummy trench portions 30 in the Y-axis direction. That is, the emitter electrode 52 consecutively contacts a region across the upper surfaces of the plurality of dummy trench portion 30 and mesa portions 95 along the Y-axis direction. Because of this, large margins can be reserved in the mesa portions 95 in setting the position of the end portion P4 of the contact hole 54 in the Y-axis direction. That is, even if the width Wi is increased relative to the width Wm to increase the percentage of the width Wi to the width Wm, the area of contact between the emitter regions 12 and the emitter electrode 52 provided to the contact holes 54 can be ensured. Also, by increasing the width Wi relative to the width Wm, the gate metal layer 50 and the gate conductive portion 44 can be more surely insulated.

Also, because in the semiconductor device 300 in the present example, interlayer dielectric films 38 are not provided between the end portion P4 and the end portion P3' in regions above the emitter regions 12, the area of contact between the emitter regions 12 and the emitter electrode 52 provided to the contact holes 54 can be ensured even if the width Wm is reduced relative to the width Wi to increase the percentage of the width Wi to the width Wm. That is, the mesa width Wm can be reduced. Because of this, characteristics of the transistor portion 70 can be improved. Also, because fine processing of the contact holes 54 is not necessary, the manufacturing cost of the semiconductor device 300 can be reduced.

Figure 21C:
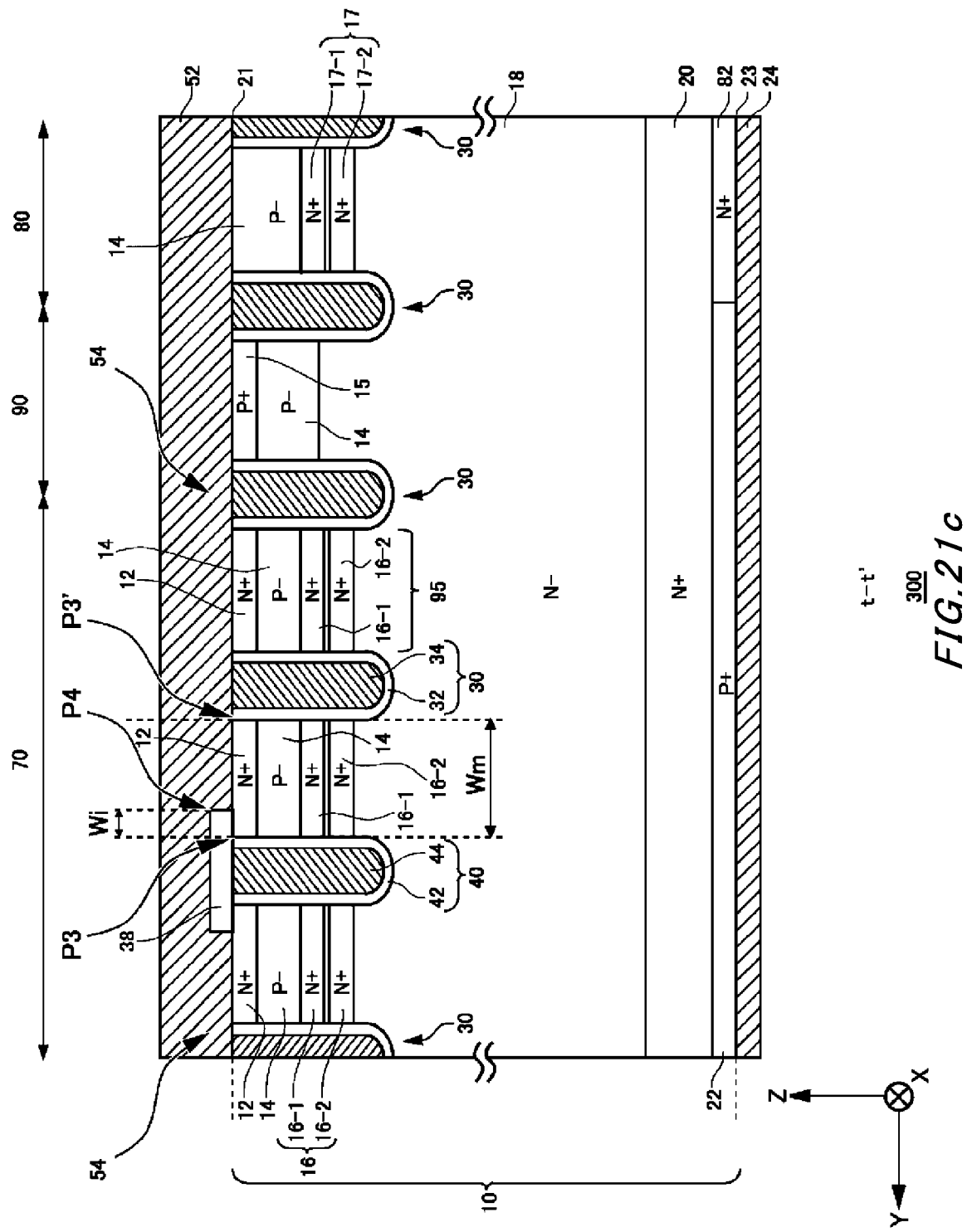

FIG. 21c is a figure showing one example of a cross-section taken along t-t' in FIG. 21a. The cross-section taken along t-t' is the YZ plane that is in a range from the transistor portion 70 of the semiconductor device 300 in the present example to its diode portion 80, and passes through emitter regions 12, a contact region 15 and base regions 14.

In the cross-section taken along t-t', the transistor portion 70 has the collector electrode 24 provided to the lower surface 23 and the emitter electrode 52 provided to the upper surface 21. Also, on the upper surface 21 side, $N^+$-type emitter regions 12, $P^-$-type base regions 14, and one or more $N^+$-type accumulation regions 16 are sequentially formed from the upper surface 21 side. The $N^-$-type drift region 18 is formed below the accumulation regions 16.

The $N^+$-type buffer region 20 is formed below the drift region 18. The $P^+$-type collector region 22 exposed to the lower surface 23 is formed below the buffer region 20. Above a gate trench portion 40, an interlayer dielectric film 38 is provided to the upper surface 21.

In the Y-axis direction of the cross-section taken along t-t' of the transistor portion 70, between dummy trench portions 30 and the interlayer dielectric film 38 on the gate trench portion 40, interlayer dielectric films 38 are not provided to the upper surface 21. Also, above the dummy trench portions 30, interlayer dielectric films 38 are not provided to the upper surface 21. That is, the emitter electrode 52 contacts a region across the upper surfaces of the plurality of dummy trench portion 30 and mesa portions 95 consecutively along the Y-axis direction.

In the cross-section taken along t-t', the boundary portion 90 has the collector electrode 24 provided to the lower surface 23 and the emitter electrode 52 provided to the upper surface 21. Also, on the upper surface 21 side, a $P^+$-type contact region 15 and a $P^{31}$-type base region 14 are formed sequentially from the upper surface 21 side. The $N^-$-type drift region 18 is formed below the base region 14.

The $N^-$-type buffer region 20 is formed below the drift region 18. The $P^+$-type collector region 22 exposed to the lower surface 23 is formed below the buffer region 20. The collector region 22 may be a region formed by the collector region 22 of the transistor portion 70 extending in the Y-axis direction. In the Y-axis direction in the cross-section taken along t-t' of the boundary portion 90, above the dummy trench portions 30 and above the contact region 15, interlayer dielectric films 38 are not provided to the upper surface 21.

The emitter electrode 52 does not include interlayer dielectric films 38, but consecutively contacts the upper surfaces of the dummy trench portions 30 and the mesa portions 95 along the Y-axis direction in a region from a gate trench portion 40 provided closest to the boundary portion 90 to the boundary portion 90.

In the cross-section taken along t-t', the diode portion 80 has the collector electrode 24 provided to the lower surface 23 and the emitter electrode 52 provided to the upper surface 21. Also, on the upper surface 21 side, $P^-$-type base regions 14 and one or more $N^+$-type accumulation regions 16 are formed sequentially from the upper surface 21 side. The $N^-$-type drift region 18 is formed below the accumulation regions 16. The $N^+$-type buffer region 20 is formed below the drift region 18. The $N^+$-type cathode region 82 exposed to the lower surface 23 is formed below the buffer region 20.

In the cross-section taken along t-t', in the diode portion 80, interlayer dielectric films 38 are not provided to the upper surface 21 above the dummy trench portions 30 and above the base region 14. That is, the emitter electrode 52 consecutively contacts the upper surfaces of the plurality of dummy trench portion 30 and mesa portions 95 along the Y-axis direction. The emitter electrode 52 does not include interlayer dielectric films 38 between the boundary portion 90 and the diode portion 80, but consecutively contacts the upper surfaces of the dummy trench portions 30 and the mesa portions 95.

The semiconductor device 300 in the present example is provided, consecutively in the Y-axis direction, with contact holes 54 in a range from a region that is in the transistor portion 70 and adjoins the boundary portion 90 to the diode portion 80. Here, that the contact holes 54 are consecutively provided in the Y-axis direction means that there are no regions in the Y-axis direction where a contact hole 54 is not provided, in a range from the region that is in the transistor portion 70 and adjoins the boundary portion 90 to the diode portion 80.

Because in the semiconductor device 300 in the present example, interlayer dielectric films 38 are not provided between the end portion P4 and the end portion P3' in regions above the emitter regions 12, the area of contact between the emitter regions 12 and the emitter electrode 52 provided to the contact holes 54 can be ensured even if the width Wi is increased relative to the width Wm to increase the percentage of the width Wi to the width Wm. That is, large margins can be reserved for the end portion P3 and the end portion P4. Also, by increasing the width Wi relative to the width Wm, the gate metal layer 50 and the gate conductive portion 44 can be more surely insulated.

Also, because in the semiconductor device 300 in the present example, interlayer dielectric films 38 are not provided between the end portion P4 and the end portion P3' in regions above the emitter regions 12, the area of contact between the emitter regions 12 and the emitter electrode 52 provided to the contact holes 54 can be ensured even if the width Wm is reduced relative to the width Wi to increase the percentage of the width Wi to the width Wm. That is, the mesa width Wm can be reduced. Because of this, characteristics of the transistor portion 70 can be improved. Also, because fine processing of the contact holes 54 is not necessary, the manufacturing cost of the semiconductor device 300 can be reduced.

Figure 22:
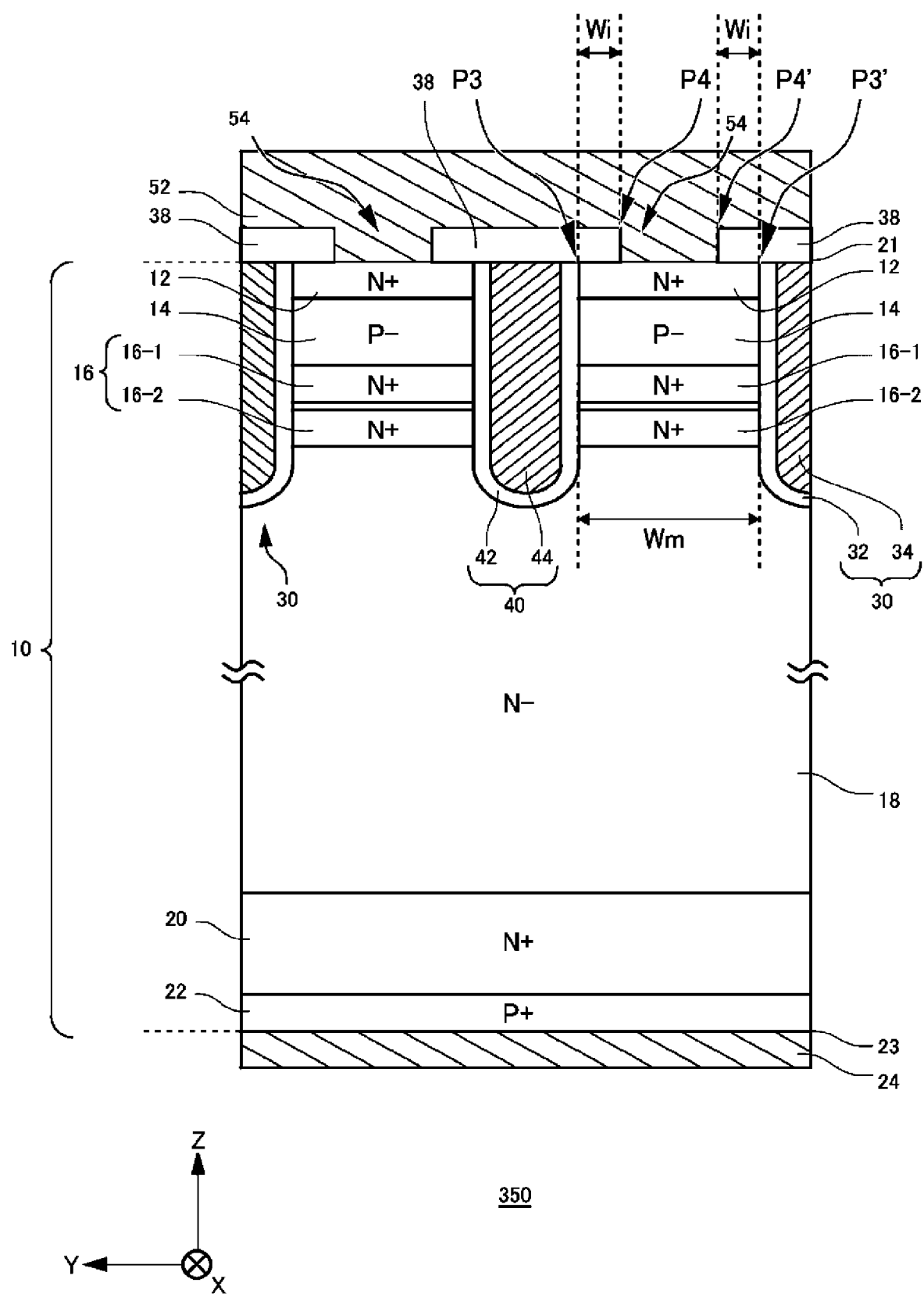
FIG. 22 is a cross-sectional view of a semiconductor device 350 of a comparative example.

FIG. 22 is a cross-sectional view of a semiconductor device 350 of a comparative example. The semiconductor device 350 of the comparative example is provided with an interlayer dielectric film 38 above a gate trench portion 40 and above dummy trench portions 30. Because of this, in addition to the end portion P4, an end portion P4' of an interlayer dielectric film 38 above a dummy trench portion 30 is arranged at an interval of the width Wi on the side of the gate trench portion 40 relative to the end portion P3' of the dummy trench portion 30. Because of this, in the semiconductor device 350 of the comparative example, if the width Wi is increased relative to the width Wm to increase the percentage of the width Wi to the width Wm, the end portion P4 and the end portion P4' become close to each other. Because of this, it is difficult in the semiconductor device 350 of the comparative example to ensure the area of contact between emitter regions 12 and the emitter electrode 52 provided to the contact hole 54, as compared with the semiconductor device 300 in FIG. 21b. That is, it is difficult to reserve large margins for the end portion P3 and the end portion P4. Also, it is difficult to reserve large margins for the end portion P3' and the end portion P4'.

Also, because in the semiconductor device 350 of the comparative example, in addition to the end portion P4, the end portion P4' of the interlayer dielectric film 38 above the dummy trench portion 30 is arranged on the side of the gate trench portion 40 relative to the end portion P3' of the dummy trench portion 30, the end portion P4 and the end portion P4' become close to each other if the width Wm is reduced relative to the width Wi to increase the percentage of the width Wi to the width Wm. Because of this, it is difficult in the semiconductor device 350 of the comparative example to ensure the area of contact between emitter regions 12 and the emitter electrode 52 provided to the contact hole 54, as compared with the semiconductor device 300 in FIG. 21b. That is, it is difficult to reduce the mesa width Wm. Because of this, it is difficult to improve characteristics of the transistor portion 70. Also, because fine processing of the contact holes 54 is necessary, it is difficult to reduce the manufacturing cost of the semiconductor device 300.

Figure 23A:
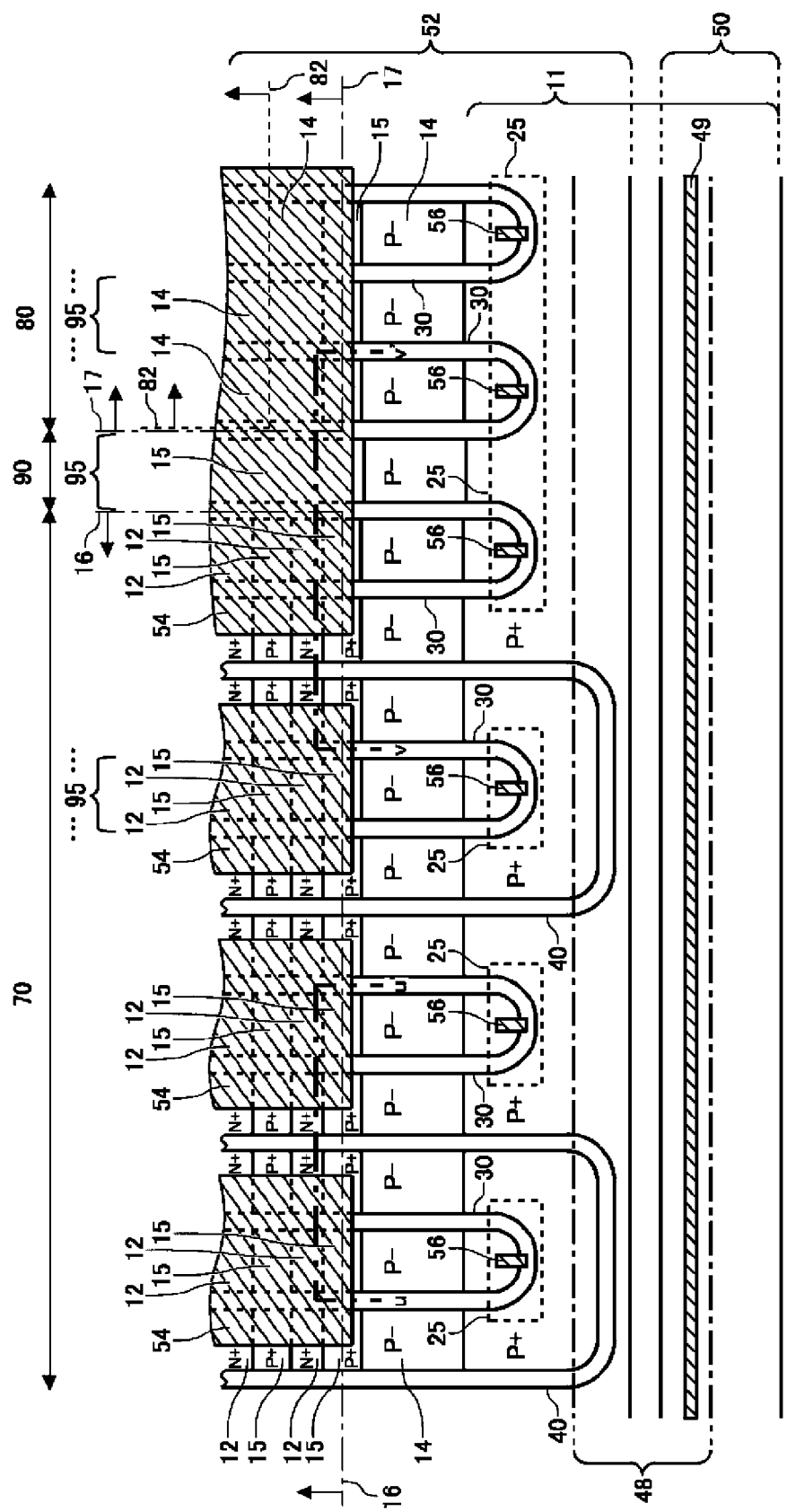
FIG. 23a is a figure showing part of the upper surface of the semiconductor device 300 according to another embodiment of the present invention.

FIG. 23a is a figure showing part of the upper surface of the semiconductor device 300 according to another embodiment of the present invention. The semiconductor device 300 in the present example is different from the semiconductor device 300 in FIG. 21a in that dummy trench portions 30 have U shapes as seen in a top view, and above emitter regions 12 and contact regions 15, a plurality of dummy trench portions 30 are sandwiched by gate trench portions 40 in the Y-axis direction. Because in the semiconductor device 300 in the present example, above the emitter regions 12 and the contact regions 15, the plurality of dummy trench portions 30 are sandwiched by the gate trench portions 40 in the Y-axis direction, in the transistor portion 70, contact holes 54 are provided to have large widths in the Y-axis direction as compared with those in the semiconductor device 300 shown in FIG. 21a.

At the position corresponding to the position of an end of the cathode region 82 on the outer circumference side in the X-axis direction that imaginarily appears on the upper surface 21 when the end is imaginarily projected onto the upper surface 21, there may be a region that is sandwiched by contact regions 15 that adjoin in the X-axis direction and where contact regions 15 are not formed. Base regions 14 may be exposed to the front surface of a mesa portion 95 on the outer circumference side (−X-axis direction) relative to the position corresponding to the position of an end of the cathode region 82 on the outer circumference side in the X-axis direction that imaginarily appears on the upper surface 21 when the end is imaginarily projected onto upper surface 21.

Figure 23B:
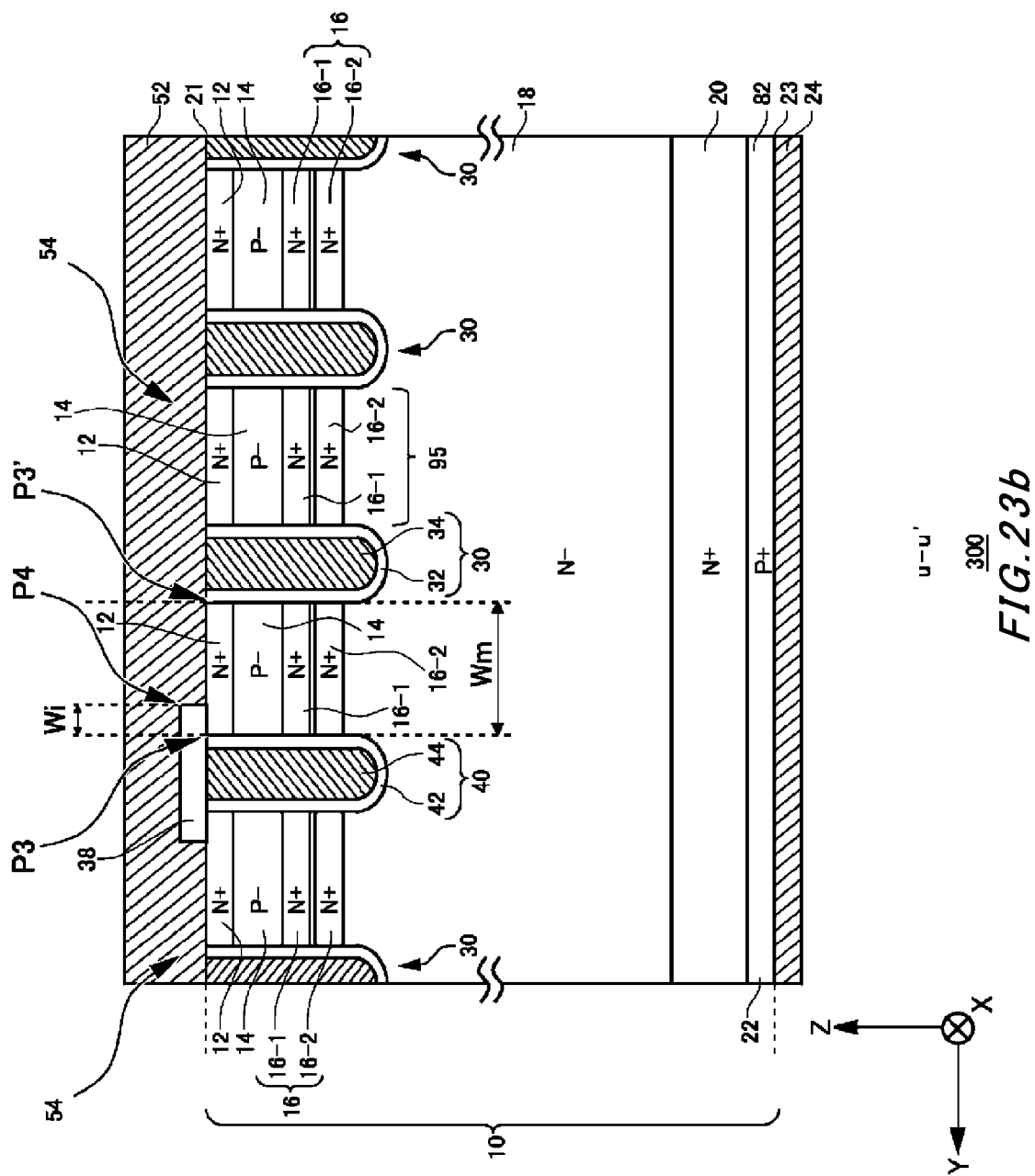

FIG. 23b is a figure showing one example of a cross-section taken along u-u' in FIG. 23a. The cross-section taken along u-u' is the YZ plane that: is in the transistor portion 70 of the semiconductor device 300 in the present example; is in a range from a dummy trench portion 30 positioned on the positive side in the Y-axis direction among two dummy trench portions 30 arranged on the positive side in the Y-axis direction relative to the gate trench portion 40 to a dummy trench portion 30 positioned on the negative side in the Y-axis direction among two dummy trench portions 30 arranged on the negative side in the Y-axis direction relative to the gate trench portion 40; and passes through emitter regions 12.

Because in the semiconductor device 300 in the present example, interlayer dielectric films 38 are not provided between the end portion P4 and the end portion P3' above the emitter regions 12, similar to the semiconductor device 300 shown in FIG. 21b, the area of contact between the emitter regions 12 and the emitter electrode 52 provided to the contact holes 54 can be ensured even if the width Wi is increased relative to the width Wm to increase the percentage of the width Wi to the width Wm. That is, large margins can be reserved for the end portion P3 and the end portion P4. Also, by increasing the width Wi relative to the width Wm, the gate metal layer 50 and the gate conductive portion 44 can be more surely insulated.

Also, because in the semiconductor device 300 in the present example, interlayer dielectric films 38 are not provided between the end portion P4 and the end portion P3' above the emitter regions 12, similar to the semiconductor device 300 shown in FIG. 21b, the area of contact between the emitter regions 12 and the emitter electrode 52 provided to the contact holes 54 can be ensured even if the width Wm is reduced relative to the width Wi to increase the percentage of the width Wi to the width Wm. That is, the mesa width Wm can be reduced. Because of this, characteristics of the transistor portion 70 can be improved. Also, because fine processing of the contact holes 54 is not necessary, the manufacturing cost of the semiconductor device 300 can be reduced.

Figure 23C:
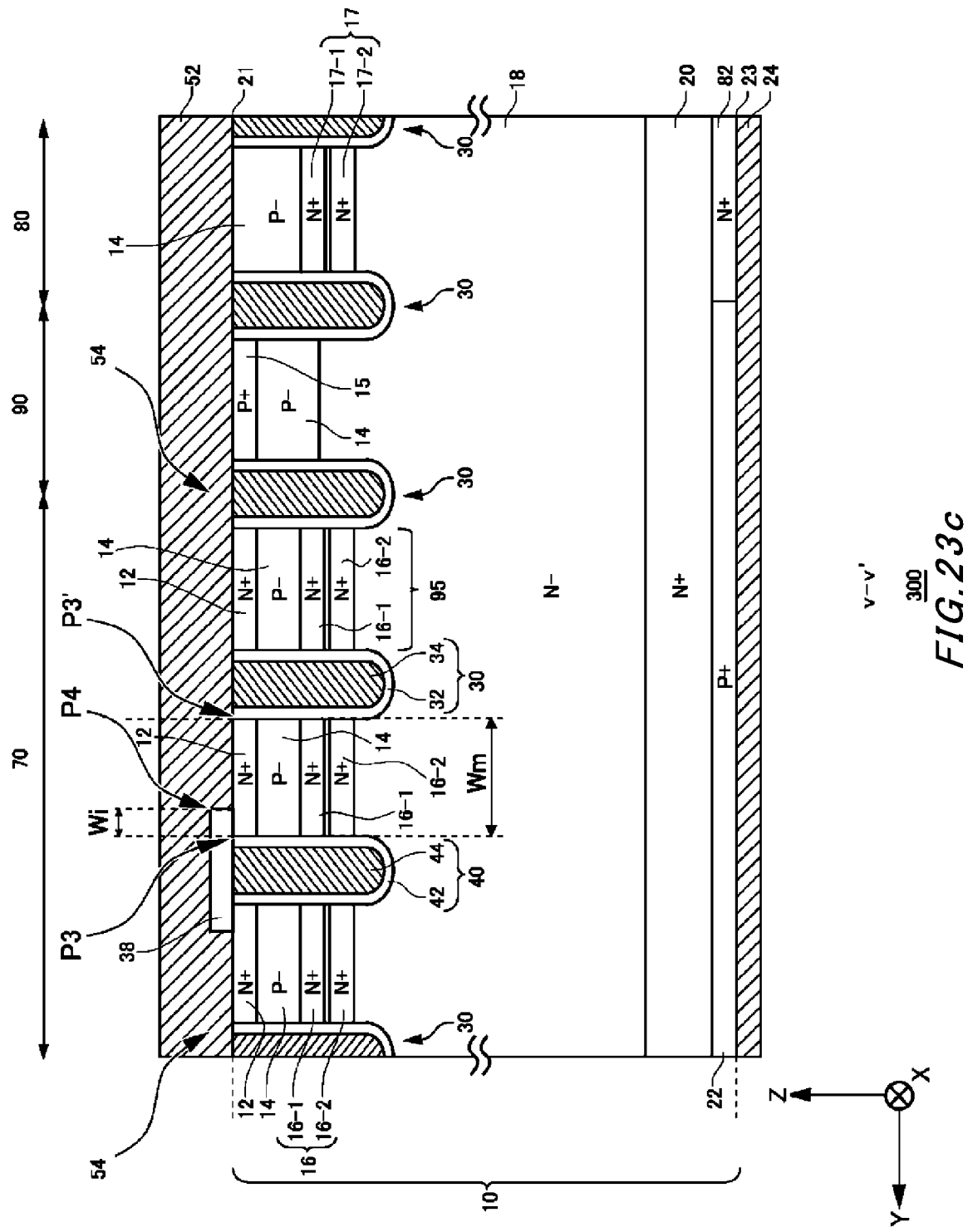

FIG. 23c is a figure showing one example of a cross-section taken along v-v' in FIG. 21a. The cross-section taken along v-v' is the YZ plane that is in a range from the transistor portion 70 of the semiconductor device 300 in the present example to its diode portion 80, and passes through emitter regions 12, a contact region 15 and base regions 14.

The semiconductor device 300 in the present example is provided with contact holes 54 in a range from the transistor portion 70 to the diode portion 80, similar to the semiconductor device 300 shown in FIG. 21c. Because in the semiconductor device 300 in the present example, interlayer dielectric films 38 are not provided between the end portion P4 and the end portion P3' above the emitter regions 12, similar to the semiconductor device 300 shown in FIG. 21c, the area of contact between the emitter regions 12 and contacts provided to the contact holes 54 can be ensured even if the width Wi is increased relative to the width Wm to increase the percentage of the width Wi to the width Wm. That is, large margins can be reserved for the end portion P3 and the end portion P4.

Also, because in the semiconductor device 300 in the present example, interlayer dielectric films 38 are not provided between the end portion P4 and the end portion P3' above the emitter regions 12, similar to the semiconductor device 300 shown in FIG. 21c, the area of contact between the emitter regions 12 and the emitter electrode 52 provided to the contact holes 54 can be ensured even if the width Wm is reduced relative to the width Wi to increase the percentage of the width Wi to the width Wm. That is, the mesa width Wm can be reduced. Because of this, characteristics of the transistor portion 70 can be improved. Also, because fine processing of the contact holes 54 is not necessary, the manufacturing cost of the semiconductor device 300 can be reduced.

Figure 24:
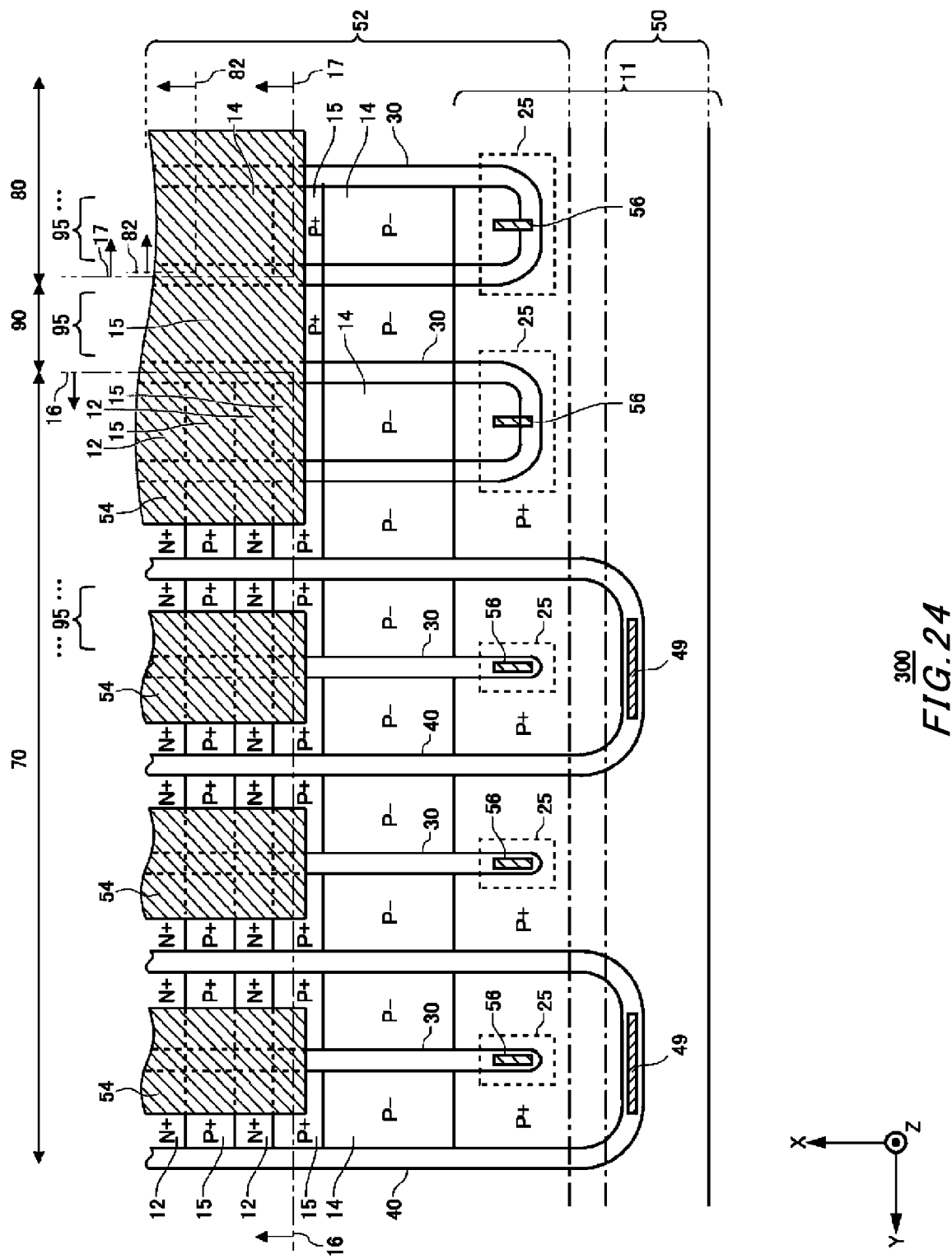
FIG. 24 is a figure showing part of the upper surface of the semiconductor device 300 according to another embodiment of the present invention.

FIG. 24 is a figure showing part of the upper surface of the semiconductor device 300 according to another embodiment of the present invention. The semiconductor device 300 in the present example is different from the semiconductor device 300 in FIG. 21a in that in the semiconductor device 300 in FIG. 21a, gate runners 48 to electrically connect gate trench portions 40 and the gate metal layer 50 are not provided, but the gate metal layer 50 is electrically connected with the gate trench portions 40 through contact holes 49 provided on the gate trench portions 40 at the negative-most positions of the gate trench portion 40 in the X-axis direction.

Because the semiconductor device 300 in the present example is not provided with interlayer dielectric films 38 above dummy trench portions 30, similar to the semiconductor device 300 shown in FIG. 21a to FIG. 21c, the area of contact between contacts provided to the contact holes 54 and the emitter regions 12 can be ensured, as compared with a case where interlayer dielectric films 38 are provided above dummy trench portions 30. Because of this, characteristics of the transistor portion 70 can be improved. Also, because fine processing of the contact holes 54 is not necessary, the manufacturing cost of the semiconductor device 300 can be reduced.

Figure 25:
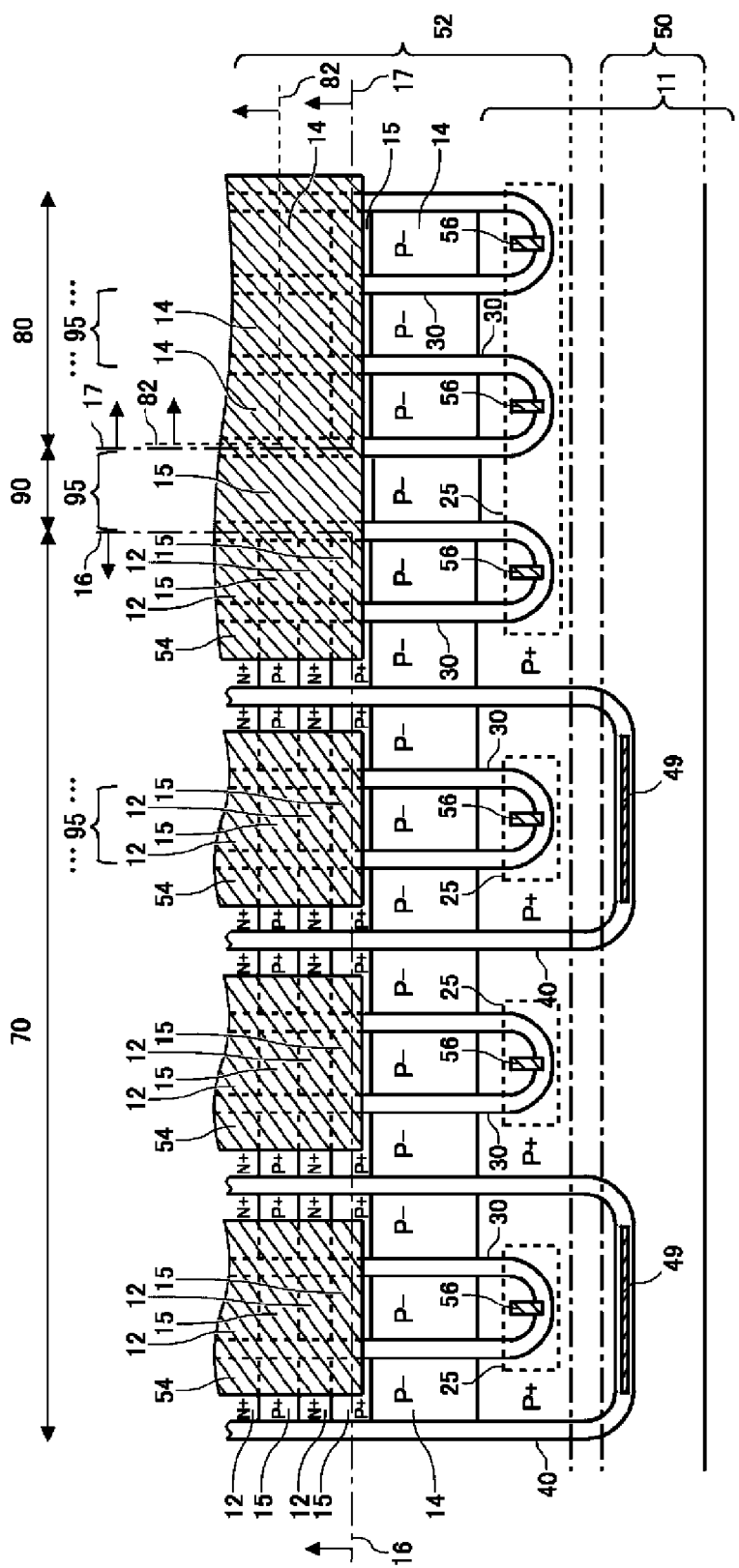
FIG. 25 is a figure showing part of the upper surface of the semiconductor device 300 according to another embodiment of the present invention.

FIG. 25 is a figure showing part of the upper surface of the semiconductor device 300 according to another embodiment of the present invention. The semiconductor device 300 in the present example is different from the semiconductor device 300 in FIG. 23a in that in the semiconductor device 300 in FIG. 23a, gate runners 48 to electrically connect gate trench portions 40 and the gate metal layer 50 are not provided, but the gate metal layer 50 is electrically connected with the gate trench portions 40 through contact holes 49 provided on the gate trench portions 40 at the negative-most positions of the gate trench portions 40 in the Y-axis direction.

Because the semiconductor device 300 in the present example is not provided with interlayer dielectric films 38 above dummy trench portions 30, similar to the semiconductor device 300 shown in FIG. 23a to FIG. 23c, the area of contact between contacts provided to the contact holes 54 and the emitter regions 12 can be ensured, as compared with a case where interlayer dielectric films 38 are provided above dummy trench portions 30. Because of this, characteristics of the transistor portion 70 can be improved. Also, because fine processing of the contact holes 54 is not necessary, the manufacturing cost of the semiconductor device 300 can be reduced.

Figure 26:
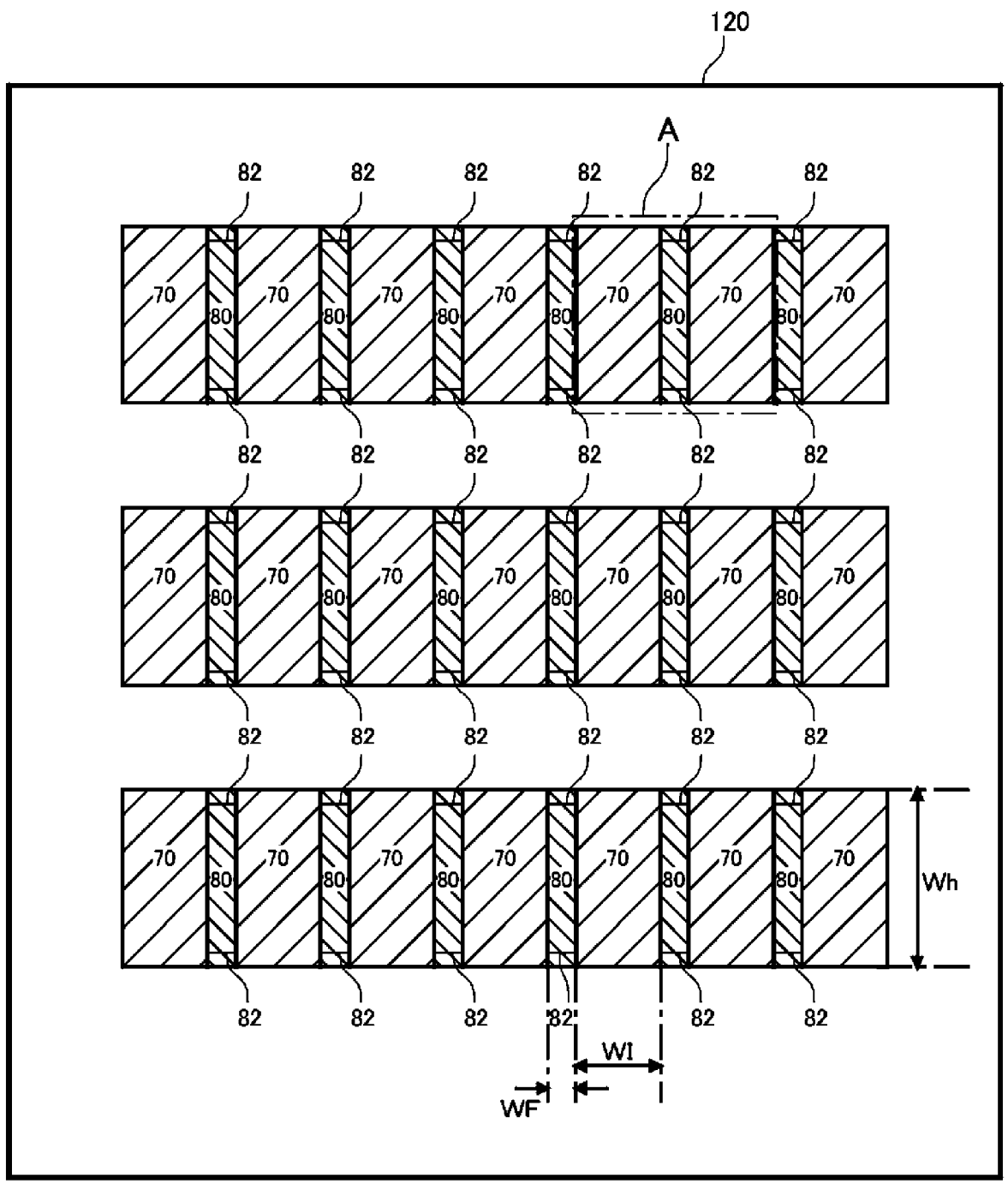
FIG. 26 is a figure showing one example of a semiconductor chip 120 according to an embodiment of the present invention.

FIG. 26 is a figure showing one example of a semiconductor chip 120 according to an embodiment of the present invention. As shown in FIG. 26, in the semiconductor chip 120 in the present example, transistor portions 70 and diode portions 80 are arrayed alternately and periodically in the XY plane. FIG. 26 shows one example in which three transistor portions 70 are provided in the X-axis direction and seven transistor portions 70 are provided in the Y-axis direction, and three diode portions 80 are provided in the X-axis direction and six diode portions 80 are provided in the Y-axis direction.

A width WI is a width of a transistor portion 70 in the Y-axis direction. A width WF is a width of a diode portion 80 in the Y-axis direction. As mentioned below with reference to FIG. 27a, a width Wh is a width of a portion that ranges from an end portion of a well region 11 on the positive side in the X-axis direction to an end portion of a well region 11 on the negative side in the X-axis direction, and where a base region 14 is formed on the upper surface 21 side of the semiconductor substrate 10 and a well region 11 is not formed.

The width Wh is, in the transistor portion 70, a width: from an end portion, in contact with a well region 11 on the negative side in the X-axis direction, of a base region 14 formed being in contact with an end portion of the well region 11 and exposed to the upper surface 21 of the semiconductor substrate 10; through contact regions 15 and emitter regions 12 formed being exposed to the upper surface 21 of the semiconductor substrate 10; and to an end portion, in contact with a well region 11 on the positive side in the X-axis direction, of a base region 14 formed being in contact with an end portion of the well region 11 and exposed to the upper surface 21 of the semiconductor substrate 10. The width Wh is, in the diode portion 80, a width: from an end portion, in contact with a well region 11 on the negative side in the X-axis direction, of a base region 14 formed being in contact with an end portion of the well region 11 and exposed to the upper surface 21 of the semiconductor substrate 10; through contact regions 15 and base regions 14 formed being exposed to the upper surface 21 of the semiconductor substrate 10; and to an end portion, in contact with a well region 11 on the positive side in the X-axis direction, of a base region 14 formed being in contact with an end portion of the well region 11 and exposed to the upper surface 21 of the semiconductor substrate 10.

There may be an edge termination portion between the outer circumferential edge of the semiconductor chip 120, and the transistor portions 70 and the diode portions 80. Also, between the edge termination portion, and the transistor portions 70 and the diode portions 80, there may be gate metal layers 50 and a gate pad portion (not illustrated in figures) where the gate metal layers 50 are put together, or another predetermined pad portion. In the array direction of the transistor portions 70 and the diode portions 80 (Y-axis direction), the transistor portions 70 may be arranged at an end on the outer circumference side, and face the edge termination portion.

Figure 27A:
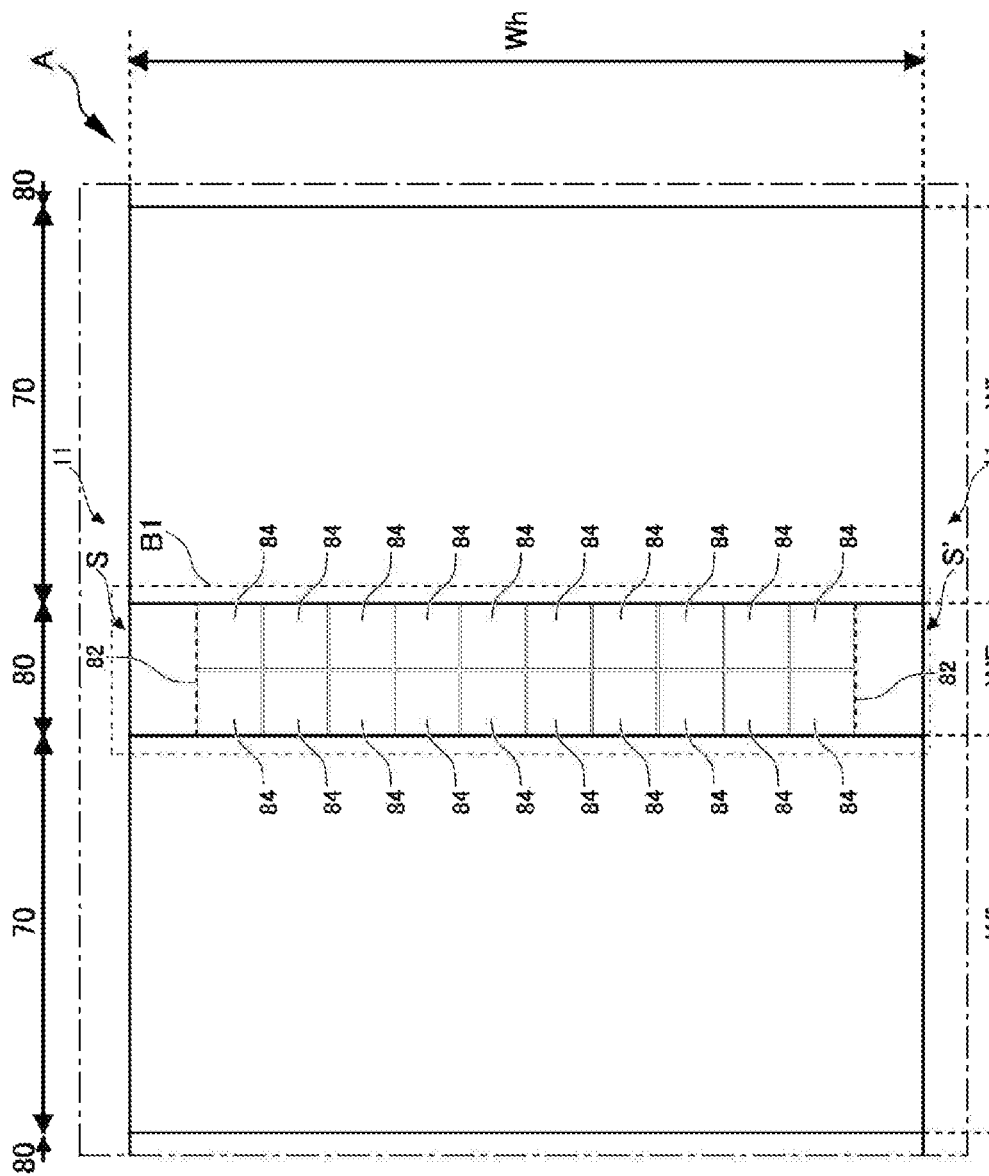
FIG. 27a is an enlarged view of a region A in FIG. 26.

FIG. 27a is an enlarged view of a region A in FIG. 26. FIG. 27a is a figure showing the configurations of a cathode region 82 and floating regions 84 in a diode portion 80. In FIG. 27a, configurations of, other than the cathode region 82 and the floating regions 84, gate trench portions 40 and dummy trench portions 30 provided to the diode portion 80 and transistor portions 70, and the like are omitted.

In the semiconductor device 300 in the present example, as shown in FIG. 27a, in the diode portion 80, ten and two floating regions 84 are provided in the X-axis direction and in the Y-axis direction, respectively, on the inner side relative to the cathode region 82 in the XY plane, as one example. Also, an end portion S of a $P^+$-type well region 11 is provided on the positive side in the X-axis direction relative to the diode portion 80 and the transistor portions 70. Also, an end portion S' of a $P^+$-type well region 11 is provided on the negative side in the X-axis direction relative to the diode portion 80 and the transistor portion 70. The well regions 11 are formed outside regions where the transistor portions 70 and the diode portion 80 are arranged alternately. In other words, well regions 11 are not formed beyond the end portion S and in the transistor portions 70 and the diode portion 80.

The positional relationship between the cathode region 82 and configurations of, other than the cathode region 82, contact holes 54, dummy trench portions 30, and contact region 15 and high concentration regions 17 formed at end portions of the contact holes 54 in the X-axis direction, and the like may be the same as the positional relationships shown in the plan views in FIG. 1, FIG. 19, FIG. 21a, FIG. 23a, FIG. 24 and FIG. 25.

In the semiconductor device 300 in the present example, as shown in FIG. 27a, transistor portions 70 are provided adjoining the diode portion 80, in both the positive side in the Y-axis direction which is one side of the array directions of the diode portion 80 and the transistor portions 70 and the negative side in the Y-axis direction which is the other side of the array directions. The width WI of the transistor portions 70 in the Y-axis direction may be greater than the width WF of the diode portion 80 in the Y-axis direction. The width WI may be twice the width WF or greater and five times the width WF or smaller. The width WI may be, as one example, 1500 µm. The width WF may be, as one example, 500 µm. That is, the semiconductor device 300 in the present example is one example in which the width WF is small as compared with that in the semiconductor device 100 shown in FIG. 1 to FIG. 18 and the semiconductor device 200 shown in FIG. 19 to FIG. 20.

Also, the width Wh from the end portion S of a well region 11 on the positive side in the X-axis direction to the end portion S' of a well region 11 on the negative side in the X-axis direction may be greater than the width WI. The width Wh may be 1.5 times the width WI or greater and three times the width WI or smaller. The width Wh may be, as one example, 3100 µm.

The width Wh may be greater than the sum of the width WI and the width WF. Snap-backs can be suppressed, which are a phenomenon in which voltage between the collector electrode 24 and the emitter electrode 52 suddenly decreases in response to increase in current flowing between the collector electrode 24 and the emitter electrode 52 when a transistor portion 70 enters an on-state, or a diode portion 80 enters a conductive state.

Figure 27B:
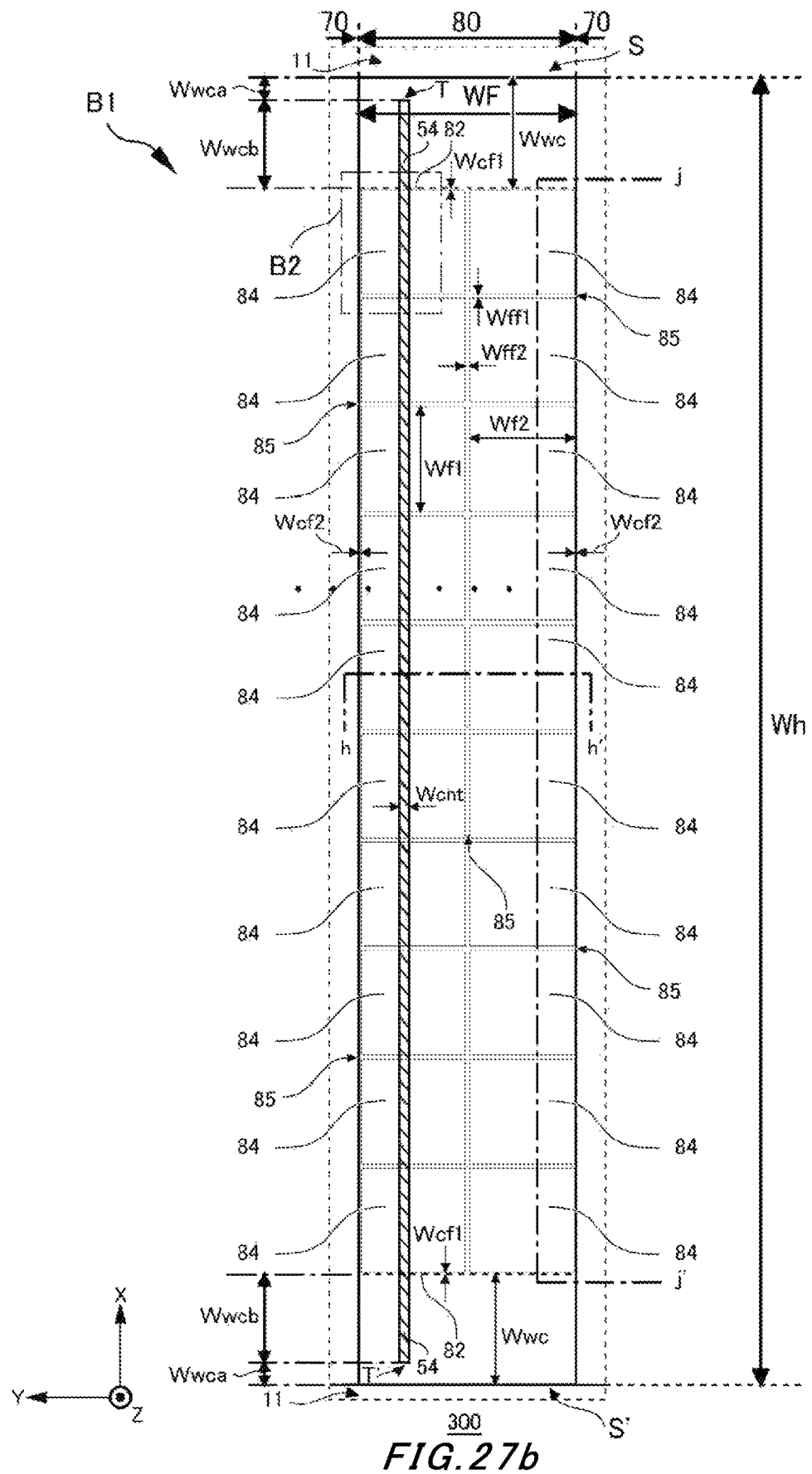

FIG. 27b is an enlarged view of a region B1 in FIG. 27a. FIG. 27b shows an enlarged view of a region, in FIG. 27a, from the end S of the well region 11 on the positive side of the diode portion 80 in the X-axis direction to the end S' of the well region 11 on the negative side in the X-axis direction. As shown in FIG. 27b, in the semiconductor device 300 in the present example, in the diode portion 80, ten and two floating regions 84 are provided in the X-axis direction and in the Y-axis direction, respectively, on the inner side relative to the cathode region 82 in the XY plane, as one example.

A width Wwc, in the X-axis direction as seen in a top view, from the end portion S of the well region 11 on the positive side in the X-axis direction to an end of the cathode region 82 on the positive side in the X-axis direction may be smaller than the width WF of the diode portion 80. The width Wwc may be ¼ of the width WF or greater and ¾ of the width WF or smaller. The width Wwc may be, as one example, 250 µm.

An end portion T of a contact hole 54 on the positive side in the X-axis direction is provided at an interval of a width Wwca from the end portion S of the well region 11 on the positive side in the X-axis direction toward the negative side in the X-axis direction, as shown in FIG. 27b. Also, an end portion T' of the contact hole 54 on the negative side in the X-axis direction is provided at an interval of a width Wwca from the end portion S' of the well region 11 on the negative side in the X-axis direction toward the positive side in the X-axis direction. The contact hole 54 is provided extending from the end portion T to the end portion T' in the X-axis direction.

Although a single contact hole 54 is illustrated in FIG. 27b, as is apparent from the plan views in FIG. 1, FIG. 19, FIG. 21a, FIG. 23a, FIG. 24 and FIG. 25, actually, a plurality of contact holes 54 that have end portions T and end portions T' located respectively at the same positions in the Y-axis direction are provided in the Y-axis direction.

The width Wwca from the end portions S of well regions 11 on the positive side in the X-axis direction to the end portions T of the plurality of contact holes 54 formed in the diode portions 80 on the positive side in the X-axis direction may be smaller than a width Wwcb, in the X-axis direction as seen in a top view, from the end portions T to ends of the cathode regions 82 on the positive side in the X-axis direction. The width Wwca may be 1/10 of the width Wwcb or greater and 9/10 of the width Wwcb or smaller. As one example, the width Wwca may be 100 µm, and the width Wwcb may be 150 µm. The sum of the width Wwca and the width Wwcb equals the width Wwc. Also, the width from the end portion S' of the well regions 11 on the negative side in the X-axis direction to the end portions T' of the plurality of contact holes 54 formed in the diode portions 80 on the negative side in the X-axis direction may be equal to the width Wwca. The width, in the X-axis direction and as seen in a top view, from the end portions T' to an end of the cathode region 82 on the negative side in the X-axis direction may also be equal to the width Wwcb.

The width, in the X-axis direction and as seen in a top view, from the end portions S' of the well regions 11 on the negative side in the X-axis direction to the end of the cathode region 82 on the negative side in the X-axis direction may also be equal to the width Wwc. The contact hole 54 illustrated in FIG. 27b is one of a plurality of contact holes. Also, the contact hole 54 may be any of the contact holes 54 shown in FIG. 21a to FIG. 25.

Floating regions 84 are provided on the inner side relative to the cathode region 82 in the XY plane, as shown in FIG. 27b. The floating regions 84 are second conductivity-type regions which are in an electrically floating state. In the present example, the floating regions 84 are of a P$^+$-type. An electrically floating state refers to a state where it is connected to none of the collector electrode 24 and the emitter electrode 52.

In the semiconductor device 300 in the present example, the floating regions 84 are provided in a lattice-like form in the XY plane. Here, a lattice-like form refers to a state where the floating regions 84 are arrayed periodically in both the X-axis direction and the Y-axis direction. FIG. 27b shows one example in which two floating regions 84 are provided in the Y-axis direction, and in the X-axis direction, ten floating regions 84 are provided in a range from the negative side of the cathode region 82 in the X-axis direction to the positive side of the cathode region 82 in the X-axis direction and sandwiching an opening region 85.

A width Wff1 is the width of an opening region 85 in the X-axis direction. The width Wff1 is smaller than a width Wf1 of a floating region 84 in the X-axis direction. The width Wff1 may be smaller than the width WF of the diode portion 80. The width Wff1 may be $\frac{1}{100}$ of the width WF or greater and $\frac{5}{100}$ of the width WF or smaller. The width Wff1 may be, as one example, 10 µm.

The width Wf1 of a floating region 84 in the X-axis direction may be smaller than the width WF of the diode portion 80. The width Wf1 may be $\frac{1}{4}$ of the width WF or greater and $\frac{3}{4}$ of the WF or smaller. The width Wf1 may be, as one example, 240 µm.

A width Wf2 of a floating region 84 in the Y-axis direction may be smaller than the width WF of the diode portion 80. The width Wf2 may be $\frac{1}{4}$ of the width WF or greater and $\frac{3}{4}$ of the WF or smaller. The width Wf2 may be equal to or may be different from the width Wf1. The width Wf2 may be, as one example, 240 µm.

A width Wcf1 from the end of the cathode region 82 on the positive side in the X-axis direction to an end, on the positive side in the X-axis direction, of a floating region 84 arranged at the positive-most position in the X-axis direction may be smaller than the width Wff1. The width Wcf1 may be $\frac{1}{10}$ of the width Wff1 or greater and $\frac{9}{10}$ of the width Wff1 or smaller. The width Wcf1 may be any value as long as it is not zero. The width Wcf1 may be, as one example, 5 µm. A width from the end of the cathode region 82 on the negative side in the X-axis direction to an end, on the negative side in the X-axis direction, of a floating region 84 arranged at the negative-most position in the X-axis direction may also be equal to the width Wcf1.

In the semiconductor device 300 in the present example, two floating regions 84 are provided, sandwiching an opening region 85 in the Y-axis direction. Here, a width Wff2 is the width of an opening region 85 in the Y-axis direction. The width Wff2 may be smaller than the width Wf2. The width Wff2 may be $\frac{1}{100}$ of the width WF of the diode portion 80 or greater and $\frac{5}{100}$ of the width WF or smaller. The width Wff2 may be equal to or may be different from the width Wff1. The width Wff2 may be, as one example, 10 µm.

The percentage of the area of the floating regions 84 in the XY plane to the area of the cathode region 82 in the XY plane may be 50% or higher and 99% or lower. That is, the area of the floating regions 84 in the XY plane may be smaller than the area of the cathode region 82 in the XY plane. As one example, if Wh is 3100 µm, Wwc is 250 µm, Wf1 and Wf2 are 240 µm, Wcf1 and Wcf2 are 5 µm, and Wff1 and Wff2 are 10 µm, the total of the areas of the floating regions 84 occupying the area of the cathode region 82 in the XY plane becomes 88.6%.

A width Wcf2 from an end of the cathode region 82 on the positive side in the Y-axis direction to an end, on the positive side in the Y-axis direction, of a floating region 84 on the positive side in the Y-axis direction may be smaller than the width WF of the diode portion 80. The width Wcf2 may be $\frac{1}{100}$ of the width WF or greater and $\frac{5}{100}$ of the width WF or smaller. The width Wcf2 may be any value as long as it is not zero. Also, the width Wcf2 may be equal to or may be different from the width Wcf1. A width from an end of the cathode region 82 on the negative side in the Y-axis direction to an end, on the negative side in the Y-axis direction, of a floating region 84 on the negative side in the Y-axis direction is equal to the width Wcf2.

A width Wcnt of the contact hole 54 in the array direction (Y-axis direction) in the present example may be smaller than Wff1. The width Wcnt in the present example may be smaller than Wff2. The width Wcnt in the present example may be smaller than Wcf1. The width Wcnt in the present example may be smaller than Wcf2. As one example, the width Wcnt is 0.5 µm.

Figure 27C:
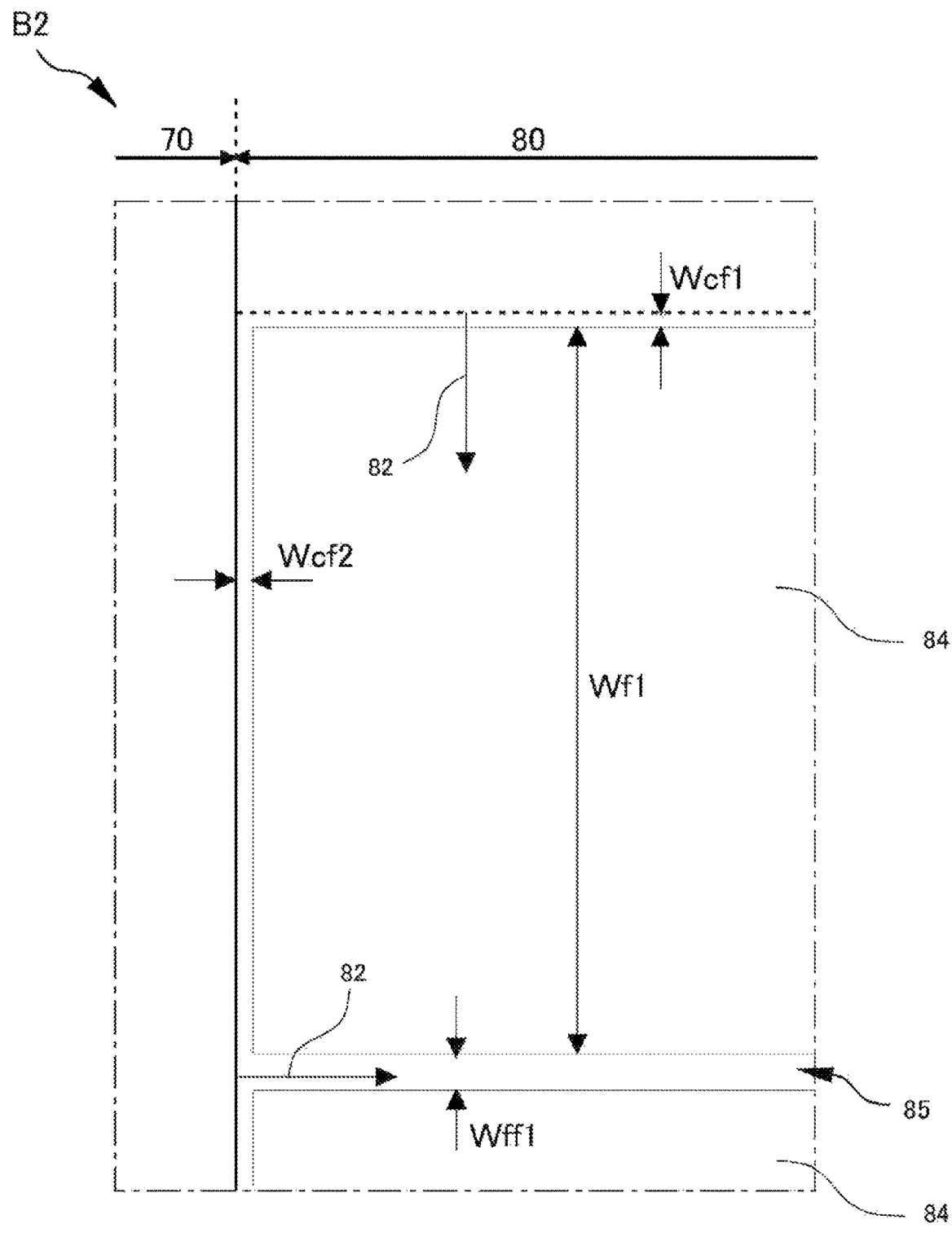
FIG. 27c is an enlarged view of a region B2 in FIG. 27b.

FIG. 27c is an enlarged view of a region B2 in FIG. 27b. As shown in FIG. 27c, in the semiconductor device 300 in the present example, the width Wcf1 is a width from the end of the cathode region 82 on the positive side in the X-axis direction to an end, on the positive side in the X-axis direction, of a floating region 84 arranged at the positive-most position in the X-axis direction. Also, the width Wcf2 is a width from the end of the cathode region 82 on the positive side in the Y-axis direction to an end, on the positive side in the Y-axis direction, of a floating region 84 on the positive side in the Y-axis direction. The width Wcf2 may be, as one example, 5 µm. The width Wff1 is the width of an opening region 85 in the X-axis direction. The width Wf1 is the width of a floating region 84 in the X-axis direction.

Figure 27D:
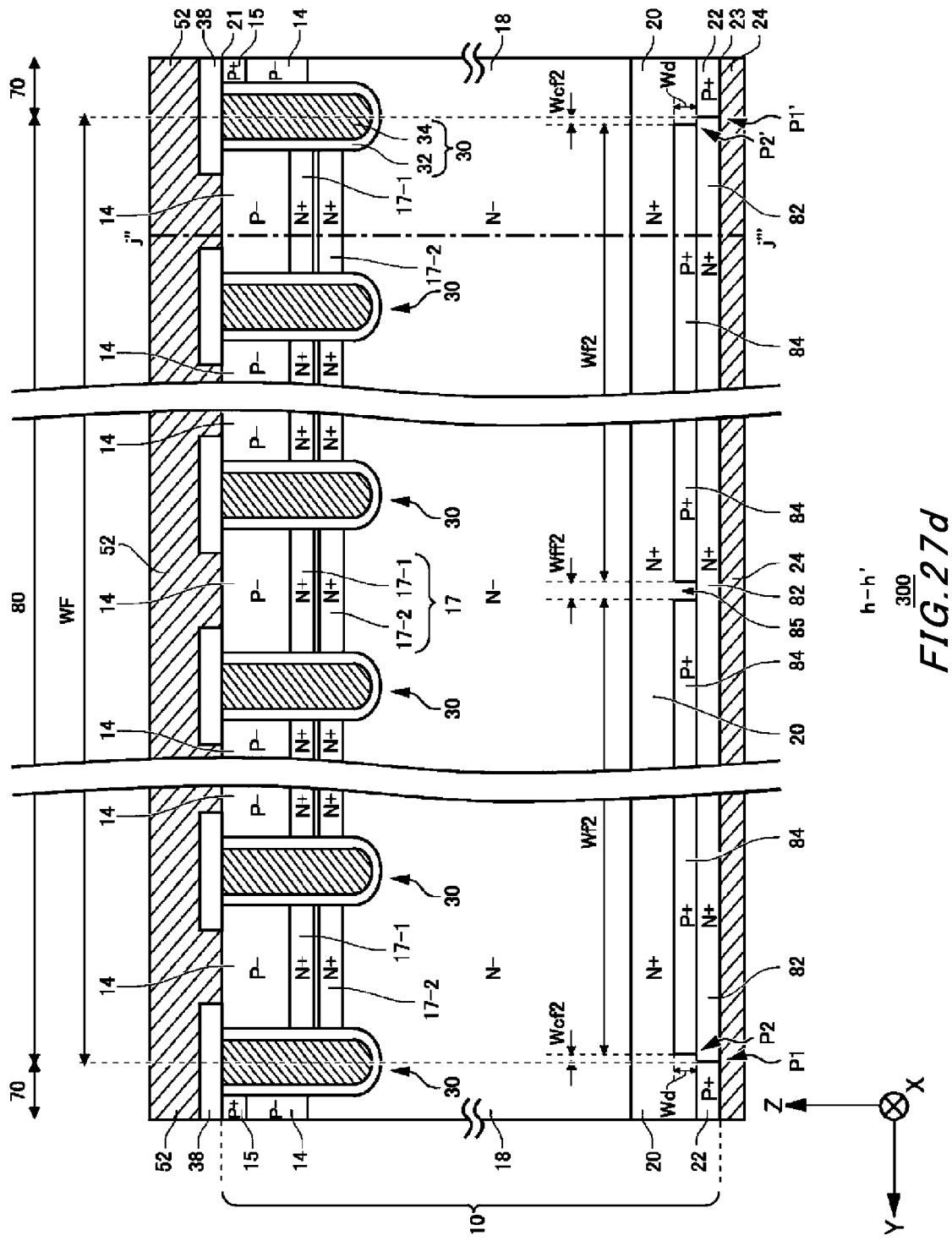
FIG. 27d is a figure showing one example of a cross-section taken along h-h' in FIG. 27b.

FIG. 27d is a figure showing one example of a cross-section taken along h-h' in FIG. 27b. In the semiconductor device 300 in the present example, floating regions 84 are provided in the buffer region 20 provided above the cathode region 82 in the diode portion 80. Two floating regions 84 are provided in the Y-axis direction in the cross-section taken along h-h'.

In the present example, as shown in FIG. 27d, there are two boundary positions present between collector regions 22 and cathode regions 82 in a plane parallel with the lower surface 23 of the semiconductor substrate 10. A boundary position P1 is a boundary position on the positive side in the Y-axis direction among the two boundary positions. Also, a boundary position P1' is a boundary position on the negative side in the Y-axis direction among the two boundary positions. The boundary positions P1 and P1' are boundary positions in a cross-section parallel with the cross-section taken along h-h'. As one example, the cross-section taken along h-h' is a plane perpendicular to the lower surface 23 and parallel with the array direction of dummy trench portions 30.

In the present example, as shown in FIG. 27d, there are two end portion positions of a floating region 84 present in a plane parallel with the lower surface 23. On a plane parallel with the lower surface 23, a boundary position P2 is an end part position, closest to the boundary position P1, of a floating region 84 arranged on the positive side in the Y-axis direction among the two floating regions 84 arrayed in the Y-axis direction. Also, in a plane parallel with the lower surface 23, a boundary position P2' is an end part position, closest to the boundary position P1', of a floating region 84 arranged on the negative side in the Y-axis direction among the two floating regions 84 arrayed in the Y-axis direction.

Also, in the present example, in the Z-axis direction, an opening region 85 not provided with a floating region 84 is present at approximately the same depth position as the floating regions 84. The opening region 85 may refer to a region sandwiched by floating regions 84. As one example, the opening region 85 is an $N^+$-type region. The doping concentration of the opening region 85 may be approximately the same as the doping concentration of the drift region 18 or buffer region 20. The opening region 85 may be part the drift region 18 or buffer region 20 that is left free of floating regions 84 being formed therein.

The width Wcf2 is a distance from the end portion position P1 to the end portion position P2. Also, the width Wcf2 is a distance from the end portion position P1' to the end portion position P2'. The width Wcf2 may be the same as the distance L1 in the example in FIG. 9.

The width Wff2 is an interval in the Y-axis direction between adjoining floating regions 84 sandwiching the opening region 85 therebetween. The width Wff2 may be the same as the distance L3 in the example in FIG. 9.

A width Wd is the width of a floating region 84 in the Z-axis direction. The width Wd may be the same the distance L4 in the example in FIG. 9. The width Wd of a floating region 84 in the Z-axis direction may be smaller than the width Wcf2. The width Wd may be 5/100 of the width Wcf2 or greater and ½ of the width Wcf2 or smaller. As one example, the width Wd may be 0.5 µm.

Figure 27E:
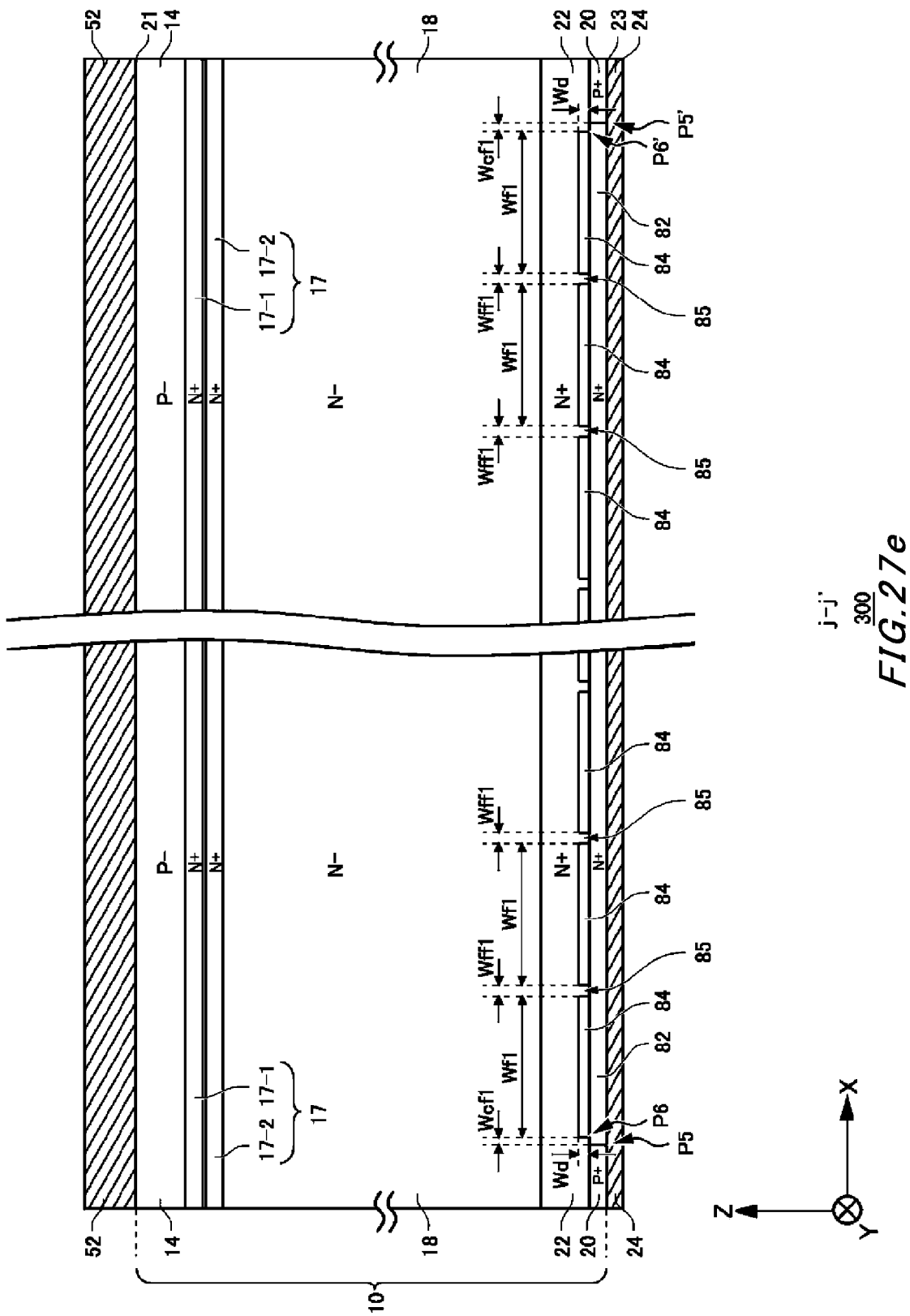
FIG. 27e is a figure showing one example of a cross-section taken along j-j' in FIG. 27b.

FIG. 27e is a figure showing one example of a cross-section taken along j-j' in FIG. 27b. The cross-section taken along j-j' is the XZ plane through a line J'''-J''' in FIG. 27d. In the semiconductor device 300 in the present example, floating regions 84 are provided in the buffer region 20 provided above the cathode region 82 in the diode portion 80.

In the present example, as shown in FIG. 27e, there are two boundary positions present between collector regions 22 and cathode regions 82 in a plane parallel with the lower surface 23 of the semiconductor substrate 10. A boundary position P5 is a boundary position on the negative side in the X-axis direction among the two boundary positions. Also, a boundary position P5' is a boundary position on the positive side in the X-axis direction among the two boundary positions. The boundary positions P5 and P5' are boundary positions in a cross-section parallel with the cross-section taken along j-j'. As one example, the cross-section taken along j-j' is a plane perpendicular to the lower surface 23 and parallel with the extending direction of dummy trench portions 30.

In the present example, as shown in FIG. 27e, there are two end portion positions of a floating region 84 present in a plane parallel with the lower surface 23. On a plane parallel with the lower surface 23, a boundary position P6 is an end part position, closest to the boundary position P5, of a floating region 84 arranged at the negative-most position in the X-axis direction among a plurality of floating regions 84 arrayed in the X-axis direction. Also, in a plane parallel with the lower surface 23, a boundary position P6' is an end part position, closest to the boundary position P5', of a floating region 84 arranged at the positive-most position in the X-axis direction among the plurality of floating regions 84 arrayed in the Y-axis direction.

Also, in the present example, in the Z-axis direction, an opening region 85 not provided with a floating region 84 is present at approximately the same depth position as the floating regions 84. The opening region 85 may refer to a region sandwiched by floating regions 84. As one example, the opening region 85 is an $N^+$-type region. The doping concentration of the opening region 85 may be approximately the same as the doping concentration of the drift region 18 or buffer region 20. The opening region 85 may be part of the drift region 18 or buffer region 20 that is left free of floating regions 84 being formed therein.

The width Wf1 is the width of a floating region 84 in the X-axis direction. The width Wcf1 is a distance in the X-axis direction from the end portion position P5 to the end portion position P6. Also, the width Wcf1 is a distance in the X-axis direction from the end portion position P5' to the end portion position P6'. Also, the width Wff1 is an interval in the X-axis direction between adjoining floating regions 84 sandwiching an opening region 85 therebetween. The width Wcf1 may be smaller than the width Wff1. The semiconductor device 300 in the present example can suppress voltage overshoot (over-shoot voltage) of the diode portion 80 at the time of reverse recovery because the floating regions 84 are provided in a lattice-like form in the XY plane in the diode portion 80.

Figure 28A:
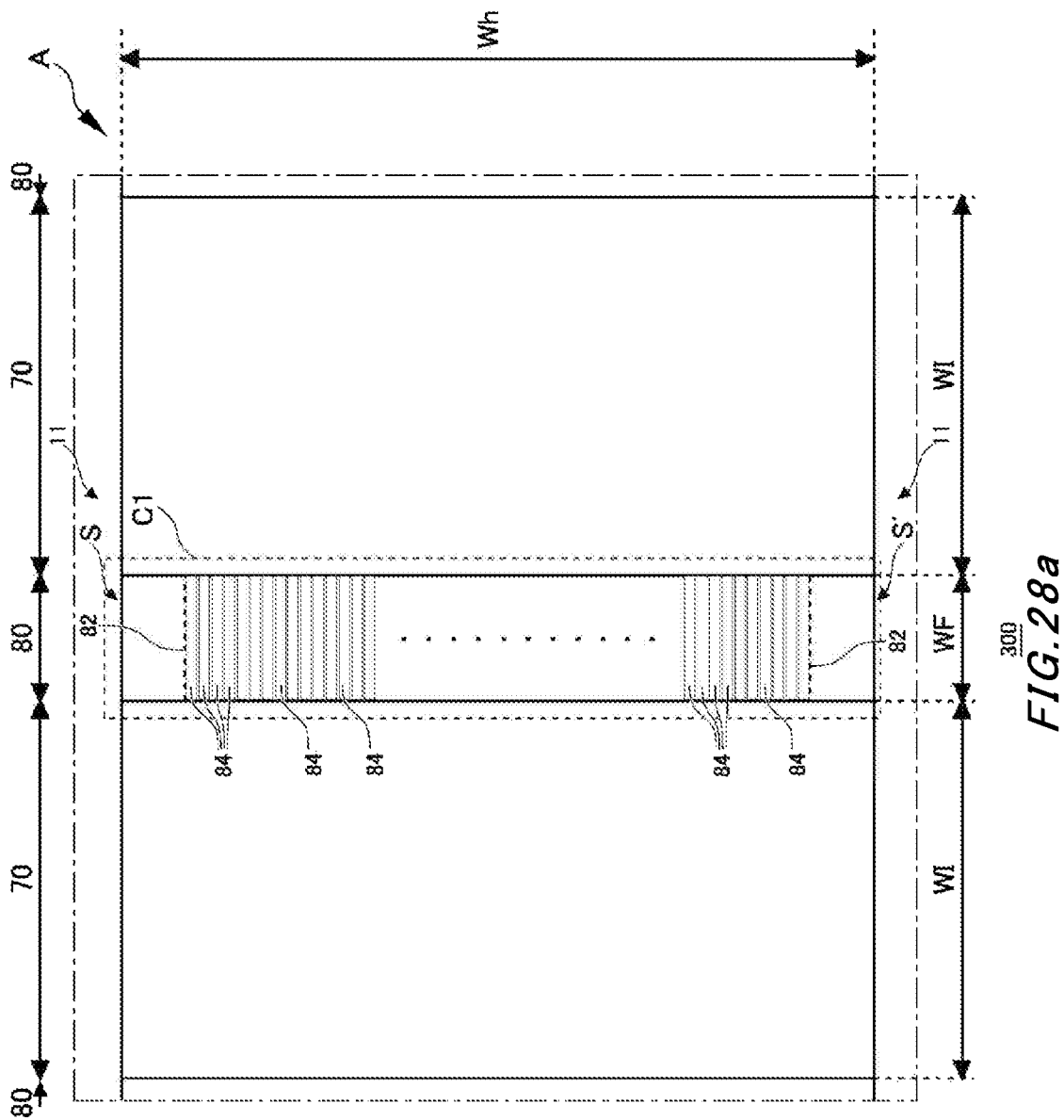
FIG. 28a is another enlarged view of the region A in FIG. 26.
Figure 28A:
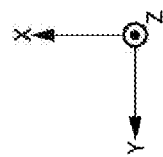

FIG. 28a is another enlarged view of the region A in FIG. 26. The semiconductor device 300 in the present example is provided with transistor portions 70 adjoining a diode portion 80 on the positive side and negative side of the diode portion 80 in the Y-axis direction, similar to the semiconductor device 300 shown in FIG. 27a.

The semiconductor device 300 in the present example is different from the semiconductor device 300 shown in FIG. 27a in terms of the arrangement of floating regions 84 in the diode portion 80. As shown in FIG. 28a, in the semiconductor device 300 in the present example, the diode portion 80 is provided with floating regions 84 on the inner side relative to the cathode region 82 in the XY plane, such that they become consecutive from the boundary side of the cathode region 82 on the positive side in the Y-axis direction indicated with a dashed line portion to the boundary side of the cathode region 82 on the negative side in the Y-axis direction indicated with a dashed line portion. Here, that the floating regions 84 are consecutively provided in the Y-axis direction means that there are no regions where a floating region 84 is not provided in the X-axis direction in any location in the Y-axis direction from the boundary side of the cathode region 82 on the positive side in the Y-axis direction to the boundary side of the cathode region 82 on the negative side in the Y-axis direction.

Figure 28B:
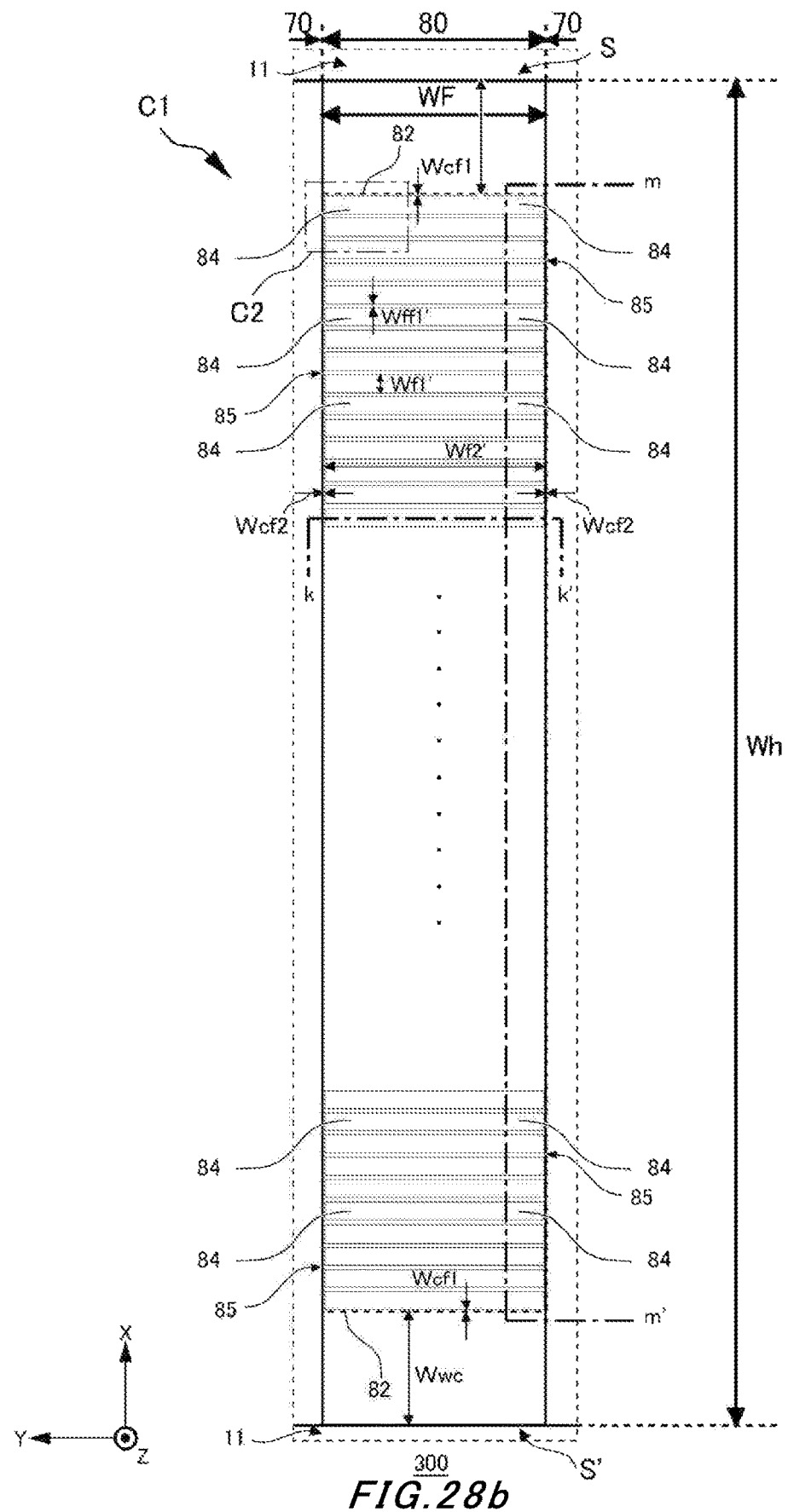

FIG. 28b is an enlarged view of a region C1 in FIG. 28a. FIG. 28b shows an enlarged view of a region, in FIG. 28a, from the end S of the well region 11 on the positive side of the diode portion 80 in the X-axis direction to the end S' of the well region 11 on the negative side in the X-axis direction.

In the present example, the floating regions 84 are provided in a stripe-like form in the XY plane. Here, a stripe-like form means that a plurality of rectangular floating regions 84 are provided at predetermined intervals in the direction of the shorter sides of the rectangles. FIG. 28b shows one example in which a plurality of rectangular floating regions 84 whose long sides lie in the Y-axis direction and shorter sides lie in the X-axis direction are provided at the intervals of the width Wff1' in the X-axis direction and in a range from the negative-most position to the positive-most position of the cathode region 82 in the X-axis direction in the XY plane. The width Wff1' may be smaller than the width WF of the diode portion 80. The width Wff1' may be $1/100$ of the width WF or greater and $5/100$ of the width WF or smaller. The width Wff1' may be, as one example, 10 μm.

The width Wf1' of a floating region 84 in the X-axis direction may be smaller than the width WF of the diode portion 80. The width Wf1' may be $4/100$ of the width WF or greater and $13/100$ of the WF or smaller. The width Wf1' may be, as one example, 40 μm.

A width Wf2' of the floating regions 84 in the Y-axis direction may be smaller than the width WF of the diode portion 80. The width Wf2' may be ½ of the width WF or greater and $99/100$ of the WF or smaller. The width Wf2' may be, as one example, 490 μm.

The width Wcf1 is a width from the end of the cathode region 82 on the positive side in the X-axis direction to the end, on the positive side in the X-axis direction, of the floating region 84 arranged at the positive-most position in the X-axis direction. The width Wcf1 may be smaller than the width Wff1'. The width Wcf1 may be $1/10$ of the width Wff1' or greater and $9/10$ of the width Wff1' or smaller. The width Wcf1' may be any value as long as it is not zero. The width Wcf1 may be, as one example, 5 μm similar to the example in FIG. 27b. A width from an end of the cathode region 82 on the negative side in the X-axis direction to an end, on the negative side in the X-axis direction, of a floating region 84 arranged at the negative-most position in the X-axis direction is also equal to the width Wcf1.

The percentage of the area of the floating regions 84 in the XY plane to the area of the cathode region 82 in the XY plane may be 50% or higher and 99% or lower, similar to the example in FIG. 27b. That is, the area of the floating regions 84 in the XY plane may be smaller than the area of the cathode region 82 in the XY plane. As one example, if Wh is 3100 μm, Wwc is 250 μm, Wf1' is 40 μm, Wf2' is 490 μm, Wcf1 and Wcf2 are 5 μm, and Wff1' is 10 μm, 51 and one floating regions 84 are provided in the X-axis direction and the Y-axis direction, respectively, on the inner side relative to the cathode region 82 as seen in a top view. In this case, the total of the areas of the floating regions 84 in the XY plane to the area of the cathode region 82 in the XY plane is 76.8%.

A width Wcf2 from an end of the cathode region 82 on the positive side in the Y-axis direction to an end of the floating region 84 on the positive side in the Y-axis direction may be smaller than the width WF of the diode portion 80, similar to the example in FIG. 27b. The width Wcf2 may be $1/100$ of the width WF or greater and $5/100$ of the width WF or smaller. Also, the width Wcf2 may be equal to or may be different from the width Wcf1. The width Wcf2 may be any value as long as it is not zero. A width from an end of the cathode region 82 on the negative side in the Y-axis direction to an end of the floating region 84 on the negative side in the Y-axis direction is equal to the width Wcf2.

Figure 28C:
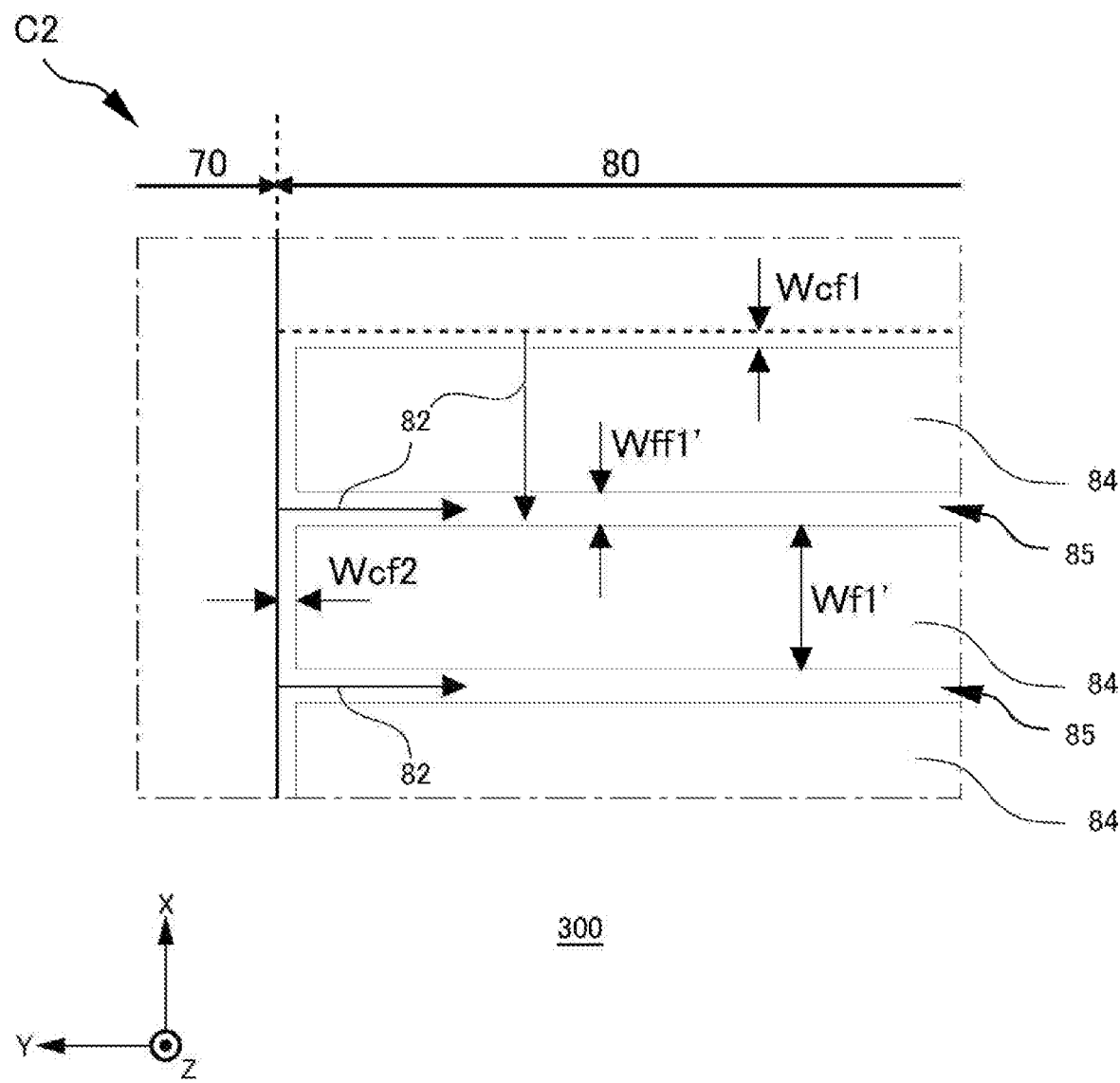
FIG. 28c is an enlarged view of a region C2 in FIG. 28b.

FIG. 28c is an enlarged view of a region C2 in FIG. 28b. As shown in FIG. 28c, in the semiconductor device 300 in the present example, the width Wcf1 is a width from the end of the cathode region 82 on the positive side in the X-axis direction to the end, on the positive side in the X-axis direction, of the floating region 84 arranged at the positive-most position in the X-axis direction. Also, in the semiconductor device 300 in the present example, the width Wcf2 is a width from the end of the cathode region 82 on the positive side in the Y-axis direction to the end, on the positive side in the Y-axis direction, of a floating region 84. The width Wcf2 may be, as one example, 5 μm. A width Wff1' is the width of an opening region 85 in the X-axis direction. The width Wf1' is the width of a floating region 84 in the X-axis direction.

Figure 28D:
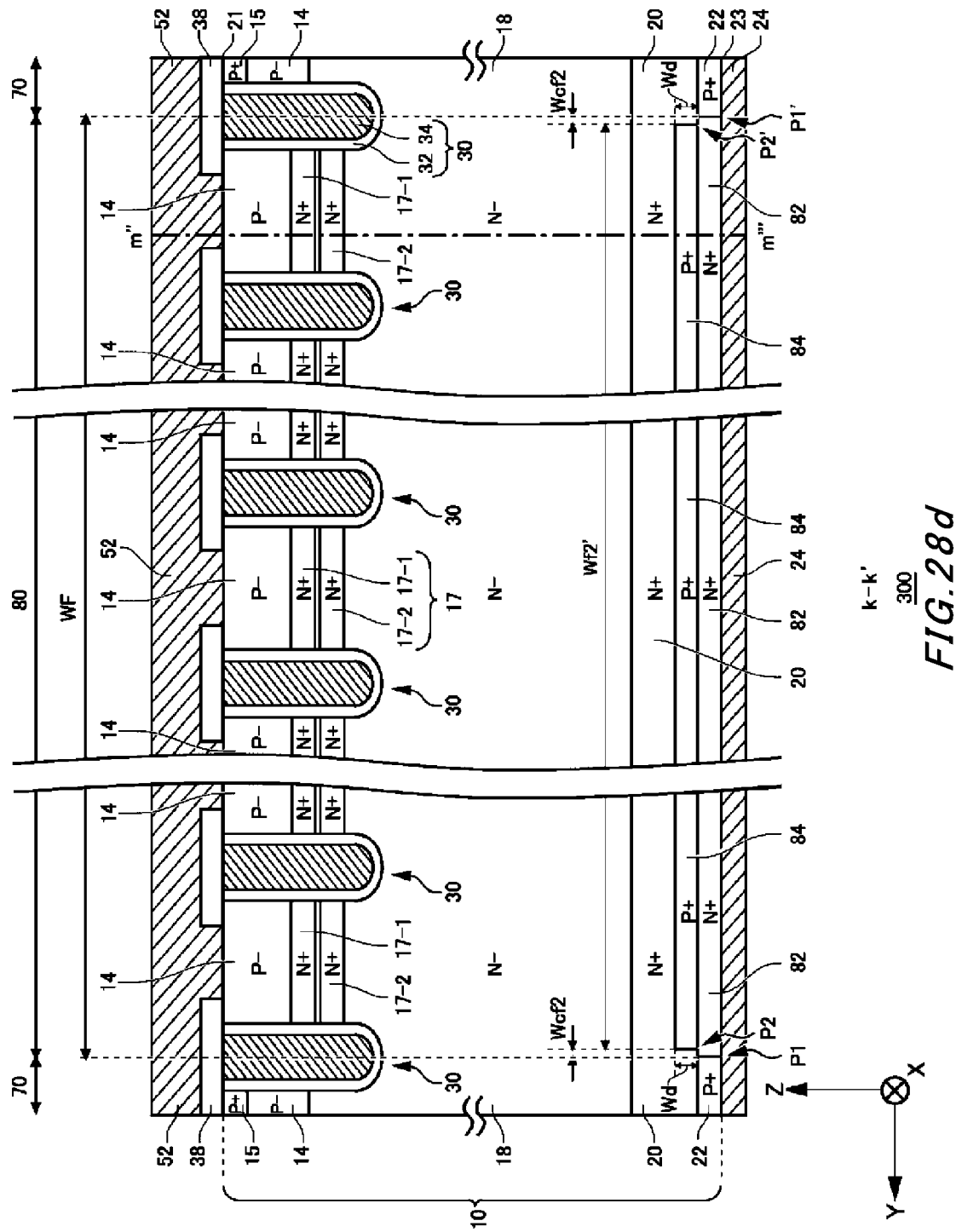
FIG. 28d is a figure showing one example of a cross-section taken along k-k' in FIG. 28b.

FIG. 28d is a figure showing one example of a cross-section taken along k-k' in FIG. 28b. In the semiconductor device 300 in the present example, floating regions 84 are provided in the buffer region 20 provided above the cathode region 82 in the diode portion 80. In the cross-section taken along k-k', the floating regions 84 are consecutively provided in a range from the positive side to the negative side in the Y-axis direction.

In the present example, as shown in FIG. 28d, similar to the example in FIG. 27d, the boundary position P1 and the boundary position P2, and the boundary position P1' and the boundary position P2' are present. Because in the present example, the floating regions 84 are consecutively provided in a range from the end portion position P2 to the end portion position P2', no opening regions 85 are present. Also, the width Wcf2 is a distance from the end portion position P1' to the end portion position P2', similar to the example in FIG. 27d. Also, the width Wcf2 is a distance from the end portion position P1' to the end portion position P2'. The width Wd of the floating region 84 in the Z-axis direction may be smaller than the width Wcf2, similar to the example in FIG. 27c. The width Wd may be $5/100$ of the width Wcf2 or greater and ½ of the width Wcf2 or smaller. As one example, the width Wd may be 0.5 μm.

FIG. 28e is a figure showing one example of a cross-section taken along m-m' in FIG. 28b. The cross-section taken along m-m' is the XZ plane through a line m''-m''' in FIG. 28d. In the semiconductor device 300 in the present example, floating regions 84 are provided in the buffer region 20 provided above the cathode region 82 in the diode portion 80.

In the present example, similar to the example in FIG. 27e, as shown in FIG. 28e, the boundary position P5 and the boundary position P6, and the boundary position P5' and the boundary position P6' are present. As one example, the cross-section taken along m-m' is a plane perpendicular to the lower surface 23 of the semiconductor substrate 10 and parallel with the extending direction of dummy trench portions 30. In the present example also, in the Z-axis direction, similar to the example in FIG. 27e, an opening region 85 not provided with a floating region 84 is present at approximately the same depth position as the floating regions 84.

The width Wf1' is the width of a floating region 84 in the X-axis direction. The width Wcf1 is a distance from the end portion position P5 to the end portion position P6, similar to the example in FIG. 27e. Also, the width Wcf1 is a distance from the end portion position P5' to the end portion position P6'. Also, the width Wff1' is an interval in the X-axis direction between adjoining floating regions 84 sandwiching an opening region 85 therebetween. The width Wcf1 may be smaller than the width Wff1'.

In the semiconductor device 300 in the present example, the diode portion 80 is provided with a plurality of floating regions 84 in a range from the end portion position P6 to the end portion position P6', and sandwiching the opening region 85 therebetween. Because in the semiconductor device 300 in the present example, the floating regions 84 are provided in a stripe-like form in the XY plane, surge at the time of reverse recovery of the diode portion 80 can be suppressed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention. As one example, in the boundary portion 90, first conductivity-type high concentration regions may be formed. In this case, the integrated concentration of high concentration regions in the boundary portion 90 may be lower than the integrated concentration of accumulation regions 16 in the transistor portion 70, and may be lower than the integrated concentration of high concentration regions 17 in the diode portion 80.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
    a semiconductor substrate having a first conductivity-type drift region;
    a transistor portion provided in the semiconductor substrate; and
    a diode portion provided in the semiconductor substrate, wherein
    the transistor portion and the diode portion each have:
    a second conductivity-type base region provided in the semiconductor substrate and above the drift region;
    a plurality of trench portions that are provided penetrating the base region from an upper surface of the semiconductor substrate and have conductive portions provided therein; and
    a mesa portion sandwiched by trench portions,
    the transistor portion has one or more first conductivity-type accumulation regions that are provided in each of the mesa portions and between the base region and the drift region and have doping concentrations higher than that of the drift region,
    the diode portion has one or more first conductivity-type high concentration regions that are provided in each of the mesa portions and between the base region and the drift region and have doping concentrations higher than that of the drift region,
    a deepest portion of the one or more accumulation regions is provided at a deeper position than a deepest portion of the one or more high concentration regions, and
    an integrated concentration obtained by integrating the doping concentrations of the one or more accumulation regions in at least some of the mesa portions of the transistor portion in a depth direction of the semiconductor substrate is higher than an integrated concentration obtained by integrating the doping concentrations of the one or more high concentration regions of the mesa portion of the diode portion in the depth direction of the semiconductor substrate.

2. The semiconductor device according to claim 1, wherein in at least one of the mesa portions of the transistor portion, the number of the accumulation regions formed in a depth direction is greater than the number of the high concentration regions formed in a depth direction in the mesa portion of the diode portion.

3. The semiconductor device according to claim 2, wherein the high concentration regions of the diode portion is provided at the same depth as any of the accumulation regions of the transistor portion.

4. The semiconductor device according to claim 3, wherein the doping concentrations of the high concentration regions of the diode portion are equal to the doping concentrations of the accumulation regions provided at the same depths in the transistor portion.

5. The semiconductor device according to claim 4, wherein the doping concentration of the accumulation region provided at the deepest position in the transistor portion is higher than the doping concentrations of all other accumulation regions of the transistor portion.

6. The semiconductor device according to claim 5, wherein the diode portion does not have the high concentration region at the same depth as the accumulation region provided at the deepest position in the transistor portion.

7. The semiconductor device according to claim 1, further comprising a boundary portion provided in the semiconductor substrate and arranged between the transistor portion and the diode portion, wherein
    in the mesa portion of the boundary portion, a first conductivity-type region having a concentration higher than that of the drift region is not provided between the base region and the drift region.

8. The semiconductor device according to claim 1, wherein among the mesa portions of the transistor portion, an integrated concentration of the one or more accumulation regions in the mesa portion provided closest to the diode portion is lower than an integrated concentration of the one or more accumulation regions in other mesa portions among the mesa portions in the transistor portion.

9. The semiconductor device according to claim 8, wherein among the mesa portions of the transistor portion, the integrated concentration of the one or more accumulation regions in the mesa portion provided closest to the diode portion is higher than the integrated concentration of the one or more high concentration regions in the mesa portion in the diode portion.

10. The semiconductor device according to claim 1, wherein the diode portion has one or more electrically floating second conductivity-type floating regions on a lower surface side of the semiconductor substrate.

11. The semiconductor device according to claim 10, wherein
    the diode portion has a first conductivity-type cathode region provided exposed to a lower surface of the semiconductor substrate, and
    the floating region covers part of the cathode region above the cathode region.

12. The semiconductor device according to claim 10, wherein the diode portion is provided with two or more high concentration regions.

13. The semiconductor device according to claim 10, wherein
the transistor portion and the diode portion are arrayed along a predetermined array direction,
the trench portion is provided extending in an extending direction orthogonal to the array direction on an upper surface of the semiconductor substrate,
the transistor portion has a second conductivity-type collector region provided between a lower surface of the semiconductor substrate and the drift region,
the diode portion has a cathode region that is provided between the lower surface of the semiconductor substrate and the drift region and has a doping concentration higher than that of the drift region, and
in a plane parallel with the lower surface of the semiconductor substrate, a distance from a boundary position between the collector region and the cathode region in the array direction to an end portion position, in the array direction, of the floating region that is closest to the boundary position in the array direction is shorter than a width, in the array direction, of the floating region in a straight line direction linking the boundary position in the array direction and the end portion position in the array direction.

14. The semiconductor device according to claim 13, wherein
the diode portion has an opening region not provided with the floating region at the same depth position as the floating region, and
a distance from the boundary position between the collector region and the cathode region in the array direction to the end portion position, in the array direction, of the floating region that is closest to the boundary position is shorter than at least one of a width of the opening region in the array direction and a width of the opening region in the extending direction.

15. The semiconductor device according to claim 14, wherein an integrated concentration of the high concentration regions in at least one mesa portion among the mesa portions arranged above the floating region is lower than an integrated concentration of the high concentration regions in at least one mesa portion among the mesa portions arranged above the opening region.

16. The semiconductor device according to claim 13, wherein in a plane parallel with a lower surface of the semiconductor substrate, a distance from the boundary position between the collector region and the cathode region in the extending direction to the end portion position, in the extending direction, of the floating region that is closest to the boundary position in the extending direction is shorter than a width of the floating region in the extending direction.

17. The semiconductor device according to claim 13, wherein a plurality of the floating regions are provided in the extending direction from an end portion position on one side in the extending direction to an end portion position on another side in the extending direction.

18. The semiconductor device according to claim 1, wherein the diode portion has a first conductivity-type cathode region and a second conductivity-type dummy region that are provided exposed alternately to a lower surface of the semiconductor substrate.

19. The semiconductor device according to claim 1, wherein the semiconductor substrate further has a contact region in the mesa portion of the diode portion, wherein
in the mesa portion of the diode portion, the base region and the contact region are provided adjoining alternately in an extending direction on the upper surface of the trench portion.

20. A semiconductor device comprising:
a semiconductor substrate having a first conductivity-type drift region;
a transistor portion provided in the semiconductor substrate; and
a diode portion provided in the semiconductor substrate, wherein
the transistor portion has a second conductivity-type collector region provided between a lower surface of the semiconductor substrate and the drift region,
the diode portion has:
a cathode region that is provided between the lower surface of the semiconductor substrate and the drift region and has a doping concentration higher than that of the drift region; and
a second conductivity-type floating region provided between the drift region and the cathode region,
in a plane parallel with the lower surface of the semiconductor substrate, a distance from a boundary position between the collector region and the cathode region to an end portion position of the floating region that is closest to the boundary position is shorter than a width of the floating region in a straight line direction linking the boundary position and the end portion position,
the diode portion has an opening region not provided with the floating region at the same depth position as the floating region, and
a distance from the boundary position between the collector region and the cathode region to the end portion position of the floating region that is closest to the boundary position is shorter than at least one of a width of the opening region in the straight line direction linking the boundary position and the end portion position and a width of the opening region in a direction perpendicular to the straight line direction in the plane parallel with the lower surface of the semiconductor.

21. A semiconductor device comprising:
a semiconductor substrate having a first conductivity-type drift region;
a transistor portion provided in the semiconductor substrate; and
a diode portion provided in the semiconductor substrate, wherein
the transistor portion and the diode portion each have:
a second conductivity-type base region provided in the semiconductor substrate and above the drift region;
a plurality of trench portions that are provided penetrating the base region from an upper surface of the semiconductor substrate and have conductive portions provided therein; and
a mesa portion sandwiched by trench portions,
the transistor portion has one or more first conductivity-type accumulation regions that are provided in each of the mesa portions and between the base region and the drift region and have doping concentrations higher than that of the drift region,
the diode portion has one or more first conductivity-type high concentration regions that are provided in each of the mesa portions and between the base region and the drift region and have doping concentrations higher than that of the drift region, and in at least one of the mesa portions of the transistor portion, the number of the accumulation regions formed in a depth direction is greater than the number of the high concentration regions formed in a depth direction in the mesa portion of the diode portion.

* * * * *